US006552930B2

(12) United States Patent
Shibata et al.

(10) Patent No.: US 6,552,930 B2
(45) Date of Patent: Apr. 22, 2003

(54) SEMICONDUCTOR MEMORY DEVICE AND STORAGE METHOD THEREOF

(75) Inventors: Noboru Shibata, Yokohama (JP); Tomoharu Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/253,455

(22) Filed: Sep. 24, 2002

(65) Prior Publication Data

US 2003/0021156 A1 Jan. 30, 2003

Related U.S. Application Data

(63) Continuation of application No. 10/034,515, filed on Dec. 27, 2001, now Pat. No. 6,487,122, which is a division of application No. 09/721,385, filed on Nov. 22, 2000, now Pat. No. 6,377,485, which is a continuation of application No. 09/470,652, filed on Dec. 22, 1999, now Pat. No. 6,178,115.

(30) Foreign Application Priority Data

Dec. 25, 1998 (JP) .......................................... 10-369467

(51) Int. Cl.[7] ................................................ G11C 16/34
(52) U.S. Cl. .............................. 365/185.03; 365/185.17
(58) Field of Search ....................... 365/185.03, 185.22, 365/185.17

(56) References Cited

U.S. PATENT DOCUMENTS 5,892,710 A 4/1999 Fazio et al. ............ 365/185.03
5,949,708 A * 9/1999 Chevallier .................. 365/183
6,034,892 A * 3/2000 Choi ..................... 365/185.14
6,040,992 A * 3/2000 Chevallier .................. 365/183
6,055,188 A 4/2000 Takeuchi et al. ....... 365/185.22
6,058,042 A 5/2000 Nobukata .............. 365/185.03
6,122,193 A 9/2000 Shibata et al. ......... 365/185.03
6,141,243 A * 10/2000 Aslam et al. .......... 365/185.01
6,178,115 B1 1/2001 Shibata et al. ......... 365/185.03

FOREIGN PATENT DOCUMENTS

| | | |
|---|---|---|
| EP | 0-797212 | 9/1997 |
| EP | 0-908894 | 4/1999 |
| WO | 97-48098 | 12/1997 |

* cited by examiner

Primary Examiner—Andrew Q. Tran
(74) Attorney, Agent, or Firm—Hogan & Hartson, LLP

(57) ABSTRACT

A method of storing data to a memory cell having n states (n being a natural number), the method including storing externally input data in a data storage circuit, executing one of shifting and holding a logic level of data which is stored in the data storage circuit in accordance with data read from the memory cell more than one time by varying a voltage supply to a gate electrode of the memory cell, and executing one of shifting and holding the states of the memory cell in accordance with the data which is stored in the data storage circuit.

4 Claims, 35 Drawing Sheets

| MEMORY CELL DATA | MEMORY CELL THRESHOLD VALUE | DATA TO BE WRITTEN AND READ | | |
|---|---|---|---|---|
| | | 1st PAGE | 2nd PAGE | 3rd PAGE |
| 0 | NOT HIGHER THAN 0V | 1 | 1 | 1 |
| 1 | 0.3V~0.5V | 1 | 1 | 0 |
| 2 | 0.8V~1.0V | 1 | 0 | 1 |
| 3 | 1.3V~1.5V | 1 | 0 | 0 |
| 4 | 1.8V~2.0V | 0 | 1 | 1 |
| 5 | 2.3V~2.5V | 0 | 1 | 0 |
| 6 | 2.8V~3.0V | 0 | 0 | 1 |
| 7 | 3.3V~3.5V | 0 | 0 | 0 |

PROG. VERIFY (1st PAGE)

| 0 | 0→4 | | MEMORY CELL DATA | |
|---|---|---|---|---|
| INHIBIT<br>A B BIT | WRITE(OK)<br>A B BIT | WRITE(NG)<br>A B BIT | A=LAT(A), B=LAT(B), BIT=BL | |
| H | L | L | DATA LOADING (WRITE→L, INHIBIT→H FOR A) | |
| H L | L H | L L | READ AT d' | 0→4 VERIFY |
| H H | L H | L L | BIT LINE IS AT H WHEN A IS H (VRFY1) | |
| H H | H H | L L | POTENTIAL OF BIT LINE IS APPLIED TO A | |

FIG. 13A

PROG. VERIFY (2nd PAGE)

| 0 | 0→2 | | 4 | 4→6 | | MEMORY CELL DATA | |
|---|---|---|---|---|---|---|---|
| INHIBIT<br>A B BIT | WRITE(OK)<br>A B BIT | WRITE(NG)<br>A B BIT | INHIBIT<br>A B BIT | WRITE(OK)<br>A B BIT | WRITE(NG)<br>A B BIT | A=LAT(A), B=LAT(B), BIT=BL | |
| H | L | | H | L | L | DATA LOADING (WRITE→L, INHIBIT→H FOR A) | |
| H L | L L | | H L | L H | L L | READ AT f' | 4→6 VERIFY |
| H H | L L | | H H | L H | L L | BIT LINE IS AT H WHEN A IS H (VRFY1) | |
| H H | L L | | H H | H H | L L | POTENTIAL OF BIT LINE IS APPLIED TO A | |

FIG. 13B

PROG. VERIFY (2nd PAGE)

| H | L | L | H | L | | DATA LOADING | |
|---|---|---|---|---|---|---|---|
| H L | L L | L L | H H | L H | | READ AT d' | 0→2 VERIFY |
| H L L | L L L | L L L | H H H | L H H | | POTENTIAL OF BIT LINE IS APPLIED TO B | |
| | | | | | | (FIRST TIME OF LOOP) | |
| H L L | L L H | L L L | H H H | L H H | | READ AT b' | |
| H L L | L L H | L L L | H H L | L H L | | BIT LINE IS AT L WHEN B IS H (VRFY2) | |
| H L H | L L H | L L L | H H H | L H L | | BIT LINE IS AT H WHEN A IS H (VRFY1) | |
| H L H | H L H | L L L | H H H | L H L | | POTENTIAL OF BIT LINE IS APPLIED TO A | |

FIG. 13C

PROG. VERIFY (3rd PAGE)

| 0 | 0→1 | | 2 | 2→3 | | 4 | 4→5 | |
|---|---|---|---|---|---|---|---|---|
| INHIBIT<br>A B BIT | WRITE(OK)<br>A B BIT | WRITE(NG)<br>A B BIT | INHIBIT<br>A B BIT | WRITE(OK)<br>A B BIT | WRITE(NG)<br>A B BIT | INHIBIT<br>A B BIT | WRITE(OK)<br>A B BIT | WRITE(NG)<br>A B BIT |
| H | L | | H | L | | H | L | |
| H L<br>H H<br>H H | L L<br>L L<br>L L | | H L<br>H H<br>H H | L L<br>L L<br>L L | | H L<br>H H<br>H H | L L<br>L L<br>L L | |

FIG. 14A

| 6 | 6→7 | | MEMORY CELL DATA | |
|---|---|---|---|---|
| INHIBIT<br>A B BIT | WRITE(OK)<br>A B BIT | WRITE(NG)<br>A B BIT | A=LAT(A), B=LAT(B), BIT=BL | |
| H | L | L | DATA LOADING (WRITE→L, INHIBIT→H FOR A) | |
| H L<br>H H<br>H H | L H<br>L H<br>H H | L L<br>L L<br>L L | READ AT g'<br>BIT LINE IS AT H WHEN A IS H (VRFY1)<br>POTENTIAL OF BIT LINE IS APPLIED TO A | 6→7<br>VERIFY |

FIG. 14B

PROG. VERIFY (3rd PAGE)

| 0 | 0→1 | | 2 | 2→3 | | 4 | 4→5 | |
|---|---|---|---|---|---|---|---|---|
| H | L | | H | L | | H | L | L |
| H L | L L | | H L | L L | | H L | L L | L L |
| H L L | L L L | | H L L | L L L | | H L L | L L L | L L L |
| H L L | L L L | | H L L | L L L | | H L L | L L H | L L L |
| H L L | L L L | | H L L | L L L | | H L L | L L H | L L L |
| H L H | L L L | | H L H | L L L | | H L H | L L H | L L L |
| H L H | L L L | | H L H | L L L | | H L H | H L H | L L L |

FIG. 15A

PROG. VERIFY (3rd PAGE)

| 6 | 6→7 | | MEMORY CELL DATA | |
|---|---|---|---|---|
| H | L | | DATA LOADING (WRITE→L, INHIBIT→H FOR A) | |
| H H | L H | | READ AT f | 4→5 |
| H H H | L H H | | POTENTIAL OF BIT LINE IS APPLIED TO B | VERIFY |
| H H H | L H H | | READ AT e' | |
| H H L | L H L | | BIT LINE IS AT L WHEN B IS H (VRFY2) | |
| H H H | L H L | | BIT LINE IS AT H WHEN A IS H (VRFY1) | |
| H H H | L H L | | POTENTIAL OF BIT LINE IS APPLIED TO A | |

FIG. 15B

A=LAT(A), B=LAT(B)

PROG. VERIFY (3rd PAGE)

| 0 | 0→1 | | 2 | 2→3 | | 4 | 4→5 | |
|---|---|---|---|---|---|---|---|---|
| H | L | | H | L | L | H | L | |
| H L | L L | | H L | L L | L L | H H | L H | |
| H L L | L L L | | H L L | L L L | L L L | H H H | L H H | |
| H L L | L L L | | H L L | L L H | L L L | H H H | L H H | |
| H L L | L L L | | H L L | L L H | L L L | H H L | L H L | |
| H L H | L L L | | H L H | L L H | L L L | H H H | L H L | |
| H L H | L L L | | H L H | H L H | L L L | H H H | L H L | |

FIG. 16A

PROG. VERIFY (3rd PAGE)

| 6 | 6→7 | | MEMORY CELL DATA | |
|---|---|---|---|---|
| H | L | | DATA LOADING | |
| H H | L H | | READ AT d | 2→3 VERIFY |
| H H H | L H H | | POTENTIAL OF BIT LINE IS APPLIED TO B | |
| H H H | L H H | | READ AT c' | |
| H H L | L H L | | BIT LINE IS AT L WHEN B IS H (VRFY2) | |
| H H H | L H L | | BIT LINE IS AT H WHEN A IS H (VRFY1) | |
| H H H | L H L | | POTENTIAL OF BIT LINE IS APPLIED TO A | |

FIG. 16B

A=LAT(A), B=LAT(B)

PROG. VERIFY (3rd PAGE)

| 0 | 0→1 | | 2 | 2→3 | | 4 | 4→5 | |
|---|---|---|---|---|---|---|---|---|
| H | L | L | H | L | | H | L | |
| H  L<br>H L L<br>H L L<br>H L L<br>H L H<br>H L H | L  L<br>L L L<br>L L H<br>L L H<br>L L H<br>H L H | L  L<br>L L L<br>L L L<br>L L L<br>L L L<br>L L L | H  H<br>H H H<br>H H H<br>H H L<br>H H H<br>H H H | L  H<br>L H H<br>L H H<br>L H L<br>L H L<br>L H L | | H  H<br>H H H<br>H H H<br>H H L<br>H H H<br>H H H | L  H<br>L H H<br>L H H<br>L H L<br>L H L<br>L H L | |

FIG. 17A

PROG. VERIFY (3rd PAGE)

| 6 | 6→7 | | MEMORY CELL DATA | |
|---|---|---|---|---|
| H | L | | DATA LOADING | |
| H  H<br>H H H<br>H H H<br>H H L<br>H H H<br>H H H | L  H<br>L H H<br>L H H<br>L H L<br>L H L<br>L H L | | READ AT b<br>POTENTIAL OF BIT LINE IS APPLIED TO B<br>READ AT a'<br>BIT LINE IS AT L WHEN B IS H (VRFY2)<br>BIT LINE IS AT H WHEN A IS H (VRFY1)<br>POTENTIAL OF BIT LINE IS APPLIED TO A | 0→1<br>VERIFY |

FIG. 17B

A=LAT(A), B=LAT(B)

READ (1st PAGE)

| 0,1,2,3 | | | 4,5,6,7 | | | | |
|---|---|---|---|---|---|---|---|
| A | B | BIT | A | B | BIT | A=LAT(A), B=LAT(B), BIT=BL | |
| | | L | | | H | READ AT d | 01234567 |
| L | | L | H | | H | POTENTIAL OF BITI LINE IS APPLIED TO A | READ |

FIG.18A

READ (2nd PAGE)

| 0,1 | | | 2,3 | | | 4,5 | | | 6,7 | | | | |
|---|---|---|---|---|---|---|---|---|---|---|---|---|---|
| A | B | BIT | A | B | BIT | A | B | BIT | A | B | BIT | A=LAT(A), B=LAT(B), BIT=BL | |
| | | L | | | L | | | L | | | H | READ AT f | 45,67 READ |
| L | | L | L | | L | L | | L | H | | H | POTENTIAL OF BITI LINE IS APPLIED TO A | |

FIG.18B

READ (2nd PAGE)

| | | | | | | | | | | | | | |
|---|---|---|---|---|---|---|---|---|---|---|---|---|---|
| L | | L | L | | L | L | | H | H | | H | READ AT d | 01,23 READ |
| L | L | L | L | L | L | L | H | H | H | H | H | POTENTIAL OF BIT LINE IS APPLIED TO B | |
| L | L | L | L | L | H | L | H | H | H | H | H | READ AT b | |
| L | L | L | L | L | H | L | H | L | H | H | L | BIT LINE IS AT L WHEN B IS H (VRFY2) | |
| L | L | L | L | L | H | L | H | L | H | H | H | BIT LINE IS AT H WHEN A IS H (VRFY1) | |
| L | L | L | H | L | H | L | H | L | H | H | H | POTENTIAL OF BIT LINE IS APPLIED TO A | |

FIG.18C

READ (3rd PAGE)

| 0 | | | 1 | | | 2 | | | 3 | | | 4 | | | 5 | | | 6 | | | 7 | | | | |
|---|---|---|---|---|---|---|---|---|---|---|---|---|---|---|---|---|---|---|---|---|---|---|---|---|---|
| A | B | BIT | A | B | BIT | A | B | BIT | A | B | BIT | A | B | BIT | A | B | BIT | A | B | BIT | A | B | BIT | A=LAT(A), B=LAT(B), BIT=BL | |
| | | L | | | L | | | L | | | L | | | L | | | L | | | L | | | H | READ AT g | 67 READ |
| L | | L | L | | L | L | | L | L | | L | L | | L | L | | L | L | | L | H | | H | POTENTIAL OF BITI LINE IS APPLIED TO A | |

FIG. 19A

READ (3rd PAGE)

| | | | | | | | | | | | | | | | | | | | | | | | | | |
|---|---|---|---|---|---|---|---|---|---|---|---|---|---|---|---|---|---|---|---|---|---|---|---|---|---|
| L | | L | L | | L | L | | L | L | | L | L | | L | L | | L | L | | H | H | | H | READ AT f | 4,5 READ |
| L | L | L | L | L | L | L | L | L | L | L | L | L | L | L | L | L | L | L | H | H | H | H | H | POTENTIAL OF BIT LINE IS APPLIED TO B | |
| L | L | L | L | L | L | L | L | L | L | L | L | L | L | L | L | L | H | L | H | H | H | H | H | READ AT e | |
| L | L | L | L | L | L | L | L | L | L | L | L | L | L | L | L | L | H | L | H | L | H | H | L | BIT LINE IS AT L WHEN B IS H (VRFY2) | |
| L | L | L | L | L | L | L | L | L | L | L | L | L | L | L | L | L | H | L | H | L | H | H | H | BIT LINE IS AT H WHEN A IS H (VRFY1) | |
| L | L | L | L | L | L | L | L | L | L | L | L | L | L | L | H | L | H | L | H | L | H | H | H | POTENTIAL OF BIT LINE IS APPLIED TO A. | |

FIG. 19B

READ (3rd PAGE)

| | | | | | | | | | | | | | | | | | | | | | | | | | |
|---|---|---|---|---|---|---|---|---|---|---|---|---|---|---|---|---|---|---|---|---|---|---|---|---|---|
| L | | L | L | | L | L | | L | L | | L | L | | H | H | | H | L | | H | H | | H | READ AT d | 2,3 READ |
| L | L | L | L | L | L | L | L | L | L | L | L | L | H | H | H | H | H | L | H | H | H | H | H | POTENTIAL OF BIT LINE IS APPLIED TO B | |
| L | L | L | L | L | L | L | L | L | L | L | H | L | H | H | H | H | H | L | H | H | H | H | H | READ AT c | |
| L | L | L | L | L | L | L | L | L | L | L | H | L | H | L | H | H | L | L | H | L | H | H | L | BIT LINE IS AT L WHEN B IS H (VRFY2) | |
| L | L | L | L | L | L | L | L | L | L | L | H | L | H | L | H | H | H | L | H | L | H | H | H | BIT LINE IS AT H WHEN A IS H (VRFY1) | |
| L | L | L | L | L | L | L | L | L | H | L | H | L | H | L | H | H | H | L | H | L | H | H | H | POTENTIAL OF BIT LINE IS APPLIED TO A | |

FIG. 19C

READ (3rd PAGE)

| | | | | | | | | | | | | | | | | | | | | | | | | | |
|---|---|---|---|---|---|---|---|---|---|---|---|---|---|---|---|---|---|---|---|---|---|---|---|---|---|
| L | | L | L | | L | L | | H | H | | H | L | | H | H | | H | L | | H | H | | H | READ AT b | 0,1 READ |
| L | L | L | L | L | L | L | H | H | H | H | H | L | H | H | H | H | H | L | H | H | H | H | H | POTENTIAL OF BIT LINE IS APPLIED TO B | |
| L | L | L | L | L | H | L | H | H | H | H | H | L | H | H | H | H | H | L | H | H | H | H | H | READ AT a | |
| L | L | L | L | L | H | L | H | L | H | H | L | L | H | L | H | H | L | L | H | L | H | H | L | BIT LINE IS AT L WHEN B IS H (VRFY2) | |
| L | L | L | L | L | H | L | H | L | H | H | H | L | H | L | H | H | H | L | H | L | H | H | H | BIT LINE IS AT H WHEN A IS H (VRFY1) | |
| L | L | L | H | L | H | L | H | L | H | H | H | L | H | L | H | H | H | L | H | L | H | H | H | POTENTIAL OF BIT LINE IS APPLIED TO A | |

FIG. 19D

| MEMORY CELL DATA | MEMORY CELL THRESHOLD VALUE | VOLTAGE READ OUT TO BIT LINE | DATA TO BE WRITTEN AND READ | | |
|---|---|---|---|---|---|
| | | | 1st PAGE | 2nd PAGE | 3rd PAGE |
| 0 | NOT HIGHER THAN -3.8V | 3.8V~4.0V | 1 | 1 | 1 |
| 1 | -3.5V~-3.3V | 3.3V~3.5V | 1 | 1 | 0 |
| 2 | -3.0V~-2.8V | 2.8V~3.0V | 1 | 0 | 1 |
| 3 | -2.5V~-2.3V | 2.3V~2.5V | 1 | 0 | 0 |
| 4 | -2.0V~-1.8V | 1.8V~2.0V | 0 | 1 | 1 |
| 5 | -1.5V~-1.3V | 1.3V~1.5V | 0 | 1 | 0 |
| 6 | -1.0V~-0.8V | 0.8V~1.0V | 0 | 0 | 1 |
| 7 | -0.5V~-0.3V | 0.3V~0.5V | 0 | 0 | 0 |

| REFERENCE POTENTIAL | | | | | |
|---|---|---|---|---|---|
| READ TIME | | PROGRAM-VERIFY TIME | | ERASE-VERIFY TIME | |
| a | 3.6V | a' | 3.5V | ○ | 4.0V |
| b | 3.1V | b' | 3.0V | | |
| c | 2.6V | c' | 2.5V | | |
| d | 2.1V | d' | 2.0V | | |
| e | 1.6V | e' | 1.5V | | |
| f | 1.1V | f' | 1.0V | | |
| g | 0.6V | g' | 0.5V | | |

| VERIFY-1st PAGE | | |
|---|---|---|
| POTENTIAL READ OUT TO BIT LINE | DFA1 | LATCHED DATA |
| NOT HIGHER THAN d' | H | H |
| NOT LOWER THAN d' | L | L |

FIG. 33A

| VERIFY-2nd PAGE | | | | |
|---|---|---|---|---|
| POTENTIAL READ OUT TO BIT LINE | DFA1 | DFA2 | DFA3 | LATCHED DATA |
| NOT HIGHER THAN f' | H | H | H | H |
| NOT HIGHER THAN d AND NOT LOWER THAN f' | L | H | H | L |
| NOT HIGHER THAN b' AND NOT LOWER THAN d | L | L | H | H |
| NOT LOWER THAN b' | L | L | L | L |

FIG. 33B

| VERIFY-3rd PAGE | | | | | | | | |
|---|---|---|---|---|---|---|---|---|
| POTENTIAL READ OUT TO BIT LINE | DFA1 | DFA2 | DFA3 | DFA4 | DFA5 | DFA6 | DFA7 | LATCHED DATA |
| NOT HIGHER THAN g' | H | H | H | H | H | H | H | H |
| NOT HIGHER THAN f AND NOT LOWER THAN g' | L | H | H | H | H | H | H | L |
| NOT HIGHER THAN e' AND NOT LOWER THAN f | L | L | H | H | H | H | H | H |
| NOT HIGHER THAN d AND NOT LOWER THAN e' | L | L | L | H | H | H | H | L |
| NOT HIGHER THAN c' AND NOT LOWER THAN d | L | L | L | L | H | H | H | H |
| NOT HIGHER THAN b AND NOT LOWER THAN c' | L | L | L | L | L | H | H | L |
| NOT HIGHER THAN a' AND NOT LOWER THAN b | L | L | L | L | L | L | H | H |
| NOT LOWER THAN a' | L | L | L | L | L | L | L | L |

FIG. 33C

| READ-1st PAGE | | |
|---|---|---|
| POTENTIAL READ OUT TO BIT LINE | DFA1 | LATCHED DATA |
| NOT HIGHER THAN d | H | H |
| NOT LOWER THAN d | L | L |

FIG. 34A

| READ-2nd PAGE | | | | |
|---|---|---|---|---|
| POTENTIAL READ OUT TO BIT LINE | DFA1 | DFA2 | DFA3 | LATCHED DATA |
| NOT HIGHER THAN f' | H | H | H | H |
| NOT HIGHER THAN d AND NOT LOWER THAN f | L | H | H | L |
| NOT HIGHER THAN b AND NOT LOWER THAN d | L | L | H | H |
| NOT LOWER THAN b | L | L | L | L |

FIG. 34B

| READ-3rd PAGE | | | | | | | | |
|---|---|---|---|---|---|---|---|---|
| POTENTIAL READ OUT TO BIT LINE | DFA1 | DFA2 | DFA3 | DFA4 | DFA5 | DFA6 | DFA7 | LATCHED DATA |
| NOT HIGHER THAN g | H | H | H | H | H | H | H | H |
| NOT HIGHER THAN f AND NOT LOWER THAN g | L | H | H | H | H | H | H | L |
| NOT HIGHER THAN e AND NOT LOWER THAN f | L | L | H | H | H | H | H | H |
| NOT HIGHER THAN d AND NOT LOWER THAN e | L | L | L | H | H | H | H | L |
| NOT HIGHER THAN c AND NOT LOWER THAN d | L | L | L | L | H | H | H | H |
| NOT HIGHER THAN b AND NOT LOWER THAN c | L | L | L | L | L | H | H | L |
| NOT HIGHER THAN a AND NOT LOWER THAN b | L | L | L | L | L | L | H | H |
| NOT LOWER THAN a | L | L | L | L | L | L | L | L |

FIG. 34C

| MEMORY CELL DATA | MEMORY CELL THRESHOLD VALUE | EXTERNALLY INPUT DATA TO BE WRITTEN AND DATA TO BE READ | | | DATA OF LAT (A) BEING WRITTEN 0→A WRITE OPERATION OCCURS 1→NO WRITE OPERATION OCCURS | | |
|---|---|---|---|---|---|---|---|
| | | 1st PAGE | 2nd PAGE | 3rd PAGE | 1st PAGE | 2nd PAGE | 3rd PAGE |
| 0 | NOT HIGHER THAN 0V | 1 | 1 | 1 | 1 | 1 | 1 |
| 1 | 0.3V~0.5V | 1 | 1 | 0 | 1 | 1 | 0 |
| 2 | 0.8V~1.0V | 1 | 0 | 0 | 1 | 0 | 1 |
| 3 | 1.3V~1.5V | 1 | 0 | 1 | 1 | 0 | 0 |
| 4 | 1.8V~2.0V | 0 | 0 | 1 | 0 | 1 | 1 |
| 5 | 2.3V~2.5V | 0 | 0 | 0 | 0 | 1 | 0 |
| 6 | 2.8V~3.0V | 0 | 1 | 0 | 0 | 0 | 1 |
| 7 | 3.3V~3.5V | 0 | 1 | 1 | 0 | 0 | 0 |

FIG. 36

(2nd PAGE)

| 0 | | | 0→2 | | | 4 | | | 4→6 | | | MEMORY CELL DATA |
|---|---|---|---|---|---|---|---|---|---|---|---|---|
| A | B | BIT | A | B | BIT | A | B | BIT | A | B | BIT | A=LAT(A), B=LAT(B), BIT=BL |
| H | | | L | | | L | | | H | | | EXTERNAL DATA LOADING |
| H | | L | L | | L | L | | H | H | | H | READ AT d |
| H | L | L | L | L | L | L | H | H | H | H | H | POTENTIAL OF BIT LINE IS APPLIED TO B |
| H | L | L | L | L | L | L | H | H | H | H | L | BIT LINE IS AT L WHEN A IS H |
| H | L | L | L | L | L | L | H | H | L | H | L | A IS AT L WHEN B IS AT H |
| H | L | H | L | L | L | L | H | H | L | H | L | BIT LINE IS AT H WHEN A IS H |
| H | L | H | L | L | L | H | H | H | L | H | L | POTENTIAL OF BIT LINE IS APPLIED TO A |
| | | | | | | | | | | | | USE SUBSEQUENT VALUE OF A AS DATA TO BE WRITTEN |

FIG. 37

(3rd PAGE) (INTERNAL DATA CONVERSION)

| 0 | | | 0→1 | | | 2 | | | 2→3 | | | 4 | | | 4→5 | | | 6 | | | 6→7 | | | MEMORY CELL DATA |
|---|---|---|---|---|---|---|---|---|---|---|---|---|---|---|---|---|---|---|---|---|---|---|---|---|
| A | B | BIT | A | B | BIT | A | B | BIT | A | B | BIT | A | B | BIT | A | B | BIT | A | B | BIT | A | B | BIT | A=LAT(A), B=LAT(B), BIT=BL |
| H | | | L | | | L | | | H | | | H | | | L | | | L | | | H | | | EXTERNAL DATA LOADING |
| H | | L | L | | L | L | | L | H | | L | H | | L | L | | L | L | | H | H | | H | READ AT f |
| H | L | L | L | L | L | L | L | L | H | L | L | H | L | L | L | L | L | L | H | H | H | H | H | POTENTIAL OF BIT LINE IS APPLIED TO B |
| H | L | L | L | L | L | L | L | L | H | L | L | H | L | H | L | L | H | L | H | H | H | H | L | READ AT d |
| H | L | L | L | L | L | L | L | L | H | L | L | H | L | H | L | L | H | L | H | L | H | H | L | BIT LINE IS AT L WHEN B IS AT H |
| H | L | L | L | L | L | L | L | L | H | L | L | H | H | H | L | H | H | L | L | L | H | L | L | POTENTIAL OF BIT LINE IS APPLIED TO B |
| H | L | L | L | L | L | L | L | H | H | L | H | H | H | H | L | H | H | L | L | H | H | L | H | READ AT b |
| H | L | L | L | L | L | L | L | H | H | L | H | H | H | L | L | H | L | L | L | H | H | L | H | BIT LINE IS AT H WHEN B IS AT H |
| H | L | L | L | L | L | L | H | H | H | H | H | H | L | L | L | L | L | L | H | H | H | H | H | POTENTIAL OF BIT LINE IS APPLIED TO B |
| H | L | L | L | L | L | L | H | H | H | H | L | H | L | L | L | L | L | L | H | H | H | H | L | BIT LINE IS AT L WHEN A IS AT H |
| H | L | L | L | L | L | L | H | H | L | H | L | H | L | L | L | L | L | L | H | H | L | H | L | A IS AT L WHEN B IS AT H |
| H | L | H | L | L | L | L | H | H | L | H | L | H | L | H | L | L | L | L | H | H | L | H | L | BIT LINE IS AT H WHEN A IS AT H |
| H | L | H | L | L | L | H | H | H | L | H | L | H | L | H | L | L | L | H | H | H | L | H | L | POTENTIAL OF BIT LINE IS APPLIED TO A |
| | | | | | | | | | | | | | | | | | | | | | | | | USE SUBSEQUENT VALUE OF A AS DATA TO BE WRITTEN |

FIG. 38

READ (1st PAGE)

| 0,1,2,3 | | | 4,5,6,7 | | | MEMORY CELL DATA |
|---|---|---|---|---|---|---|
| A | B | BIT | A | B | BIT | A=LAT(A), B=LAT(B), BIT=BL |
| | | L | | | H | 01234557 AT d |
| L | | L | H | | H | BIT READ |

FIG. 39A

READ (2nd PAGE)

| 0,1 | | | 2,3 | | | 4,5 | | | 6,7 | | | MEMORY CELL DATA |
|---|---|---|---|---|---|---|---|---|---|---|---|---|
| A | B | BIT | A | B | BIT | A | B | BIT | A | B | BIT | A=LAT(A), B=LAT(B), BIT=BL |
| | | L | | | L | | | L | | | H | READ AT f |
| L | | L | L | | L | L | | L | H | | H | POTENTIAL OF BITI LINE IS APPLIED TO A |
| L | | L | L | | H | L | | H | H | | H | READ AT b |
| L | | L | L | | H | L | | H | H | | L | BIT LINE IS AT L WHEN A IS AT H (VRFY1) |
| L | | L | H | | H | H | | H | L | | L | POTENTIAL OF BIT LINE IS APPLIED TO A |

FIG. 39B

READ (3rd PAGE)

| 0 | | | 1 | | | 2 | | | 3 | | | 4 | | | 5 | | | 6 | | | 7 | | | MEMORY CELL DATA |
|---|---|---|---|---|---|---|---|---|---|---|---|---|---|---|---|---|---|---|---|---|---|---|---|---|
| A | B | BIT | A | B | BIT | A | B | BIT | A | B | BIT | A | B | BIT | A | B | BIT | A | B | BIT | A | B | BIT | A=LAT(A), B=LAT(B), BIT=BL |
| | | L | | | L | | | L | | | L | | | L | | | L | | | L | | | H | READ AT g |
| L | | L | L | | L | L | | L | L | | L | L | | L | L | | L | L | | L | H | | H | POTENTIAL OF BIT LINE IS APPLIED TO A |
| L | | L | L | | L | L | | L | L | | L | L | | L | L | | H | L | | H | H | | H | READ AT e |
| L | | L | L | | L | L | | L | L | | L | L | | L | L | | H | L | | H | H | | L | BIT LINE IS AT L WHEN A IS AT H (VRFY1) |
| L | | L | L | | L | L | | L | L | | L | L | | L | H | | H | H | | H | L | | L | POTENTIAL OF BIT LINE IS APPLIED TO A |
| L | | L | L | | L | L | | L | L | | H | L | | H | H | | H | H | | H | L | | H | READ AT c |
| L | | L | L | | L | L | | L | L | | H | L | | H | H | | L | H | | L | L | | H | BIT LINE IS AT L WHEN A IS AT H |
| L | | L | L | | L | L | | L | H | | H | H | | H | L | | L | L | | L | H | | H | POTENTIAL OF BITI LINE IS APPLIED TO A |
| L | | L | L | | H | L | | H | H | | H | H | | H | L | | H | L | | H | H | | H | READ AT a |
| L | | L | L | | H | L | | H | H | | L | H | | L | L | | H | L | | H | H | | L | BIT LINE IS AT L WHEN A IS AT H (VRFY1) |
| L | | L | H | | H | H | | H | L | | L | L | | L | H | | H | H | | H | L | | L | POTENTIAL OF BIT LINE IS APPLIED TO A |

FIG. 40

| MEMORY CELL DATA | MEMORY CELL THRESHOLD VALUE | DATA TO BE WRITTEN AND READ | | |
|---|---|---|---|---|
| | | 1st PAGE | 2nd PAGE | 3rd PAGE |
| 0 | NOT HIGHER THAN 0V | 1 | 1 | 1 |
| 1 | 0.3V~0.5V | 0 | 1 | 1 |
| 2 | 0.8V~1.0V | 0 | 0 | 1 |
| 3 | 1.3V~1.5V | 0 | 0 | 0 |
| 4 | 1.8V~2.0V | 1 | 0 | 0 |
| 5 | 2.3V~2.5V | 1 | 0 | 1 |
| 6 | 2.8V~3.0V | 1 | 1 | 0 |
| 7 | 3.3V~3.5V | 0 | 1 | 0 |

FIG. 41

SEMICONDUCTOR MEMORY DEVICE AND STORAGE METHOD THEREOF

This is a continuation of application Ser. No. 10/034,515 filed Dec. 27, 2001, now U.S. Pat. No. 6,487,122, which is a divisional of Ser. No. 09/721,385 filed Nov. 22, 2000 now U.S. Pat. No. 6,377,485, which is a continuation of Ser. No. 09/470,652 filed Dec. 22, 1999 now U.S. Pat. No. 6,178,115, which applications are hereby incorporated by reference in their entirety.

BACKGROUND OF THE INVENTION

This invention relates to a non-volatile semiconductor memory device and, more particularly, it relates to a memory device adapted to store multi-valued data and also to a method of storing such data of the device.

NAND type flush memory devices comprising an EEPROM that is an electrically writable non-volatile semiconductor memory have been proposed. In such a NAND type flush memory, the sources and the drains of a plurality of adjacently arranged memory cells are connected in series and the plurality of memory cells that are connected in series are connected to a bit line as a unit. Then, a set of data are collectively written in or read from all or half of the plurality of cells arranged in a row.

In recent years, multi-valued memories that can store a plurality of data (n-bit data) written into a single cell have been developed as NAND type flush memories. Such a multi-valued memory requires the use of n latch circuits for writing data to or reading data from a single cell in order to write a plurality of data to or reading a plurality of data from the single cell because the threshold value of the cell is determined by the contents of the data latched by the latch circuits.

However, as the number of data n that can be stored in a single cell increases, the number of latch circuits that is equal to n also increases to make them occupy the chip that contains them to a large extent.

Meanwhile, when storing data in a cell, an operation is conducted to verify that the threshold value of the cell properly corresponds to the written data. The number of verifying operations increases as the number of data to be written to a cell. Then, the time required for data writing and write-verifying operations increases for each cell.

BRIEF SUMMARY OF THE INVENTION

According to the invention, there is provided a method of storing data to a memory cell having n states (n being a natural number), the method including storing externally input data in a data storage circuit, executing one of shifting and holding a logic level of data which is stored in the data storage circuit in accordance with data read from the memory cell more than one time by varying a voltage supply to a gate electrode of the memory cell, and executing one of shifting and holding the states of the memory cell in accordance with the data which is stored in the data storage circuit.

According to the invention, there is also provided a method of storing data to a memory cell having n states (n being a natural number), the method including storing externally input data having one of a first logic level and second logic level in a data storage circuit, shifting a logic level of the data stored in the data storage circuit to the second logic level when data read from the memory cell is at the first logic level and the data stored in the data storage circuit is at the first logic level, shifting the logic level of the data stored in the data storage circuit to the first logic level when the data read from the memory cell is at the first logic level and the data stored in the data storage circuit is at the second logic level, holding the logic level of the data stored in the data storage circuit when the data read from the memory cell is at the second logic level, shifting a state of the memory cell when the logic level of the data stored in the data storage circuit is at the first logic level, and holding the state of the memory cell when the logic level of the data stored in the data storage circuit is at the second logic level.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 13A is a chart illustrating a program verify operation for the first page. FIGS. 13B and 13C are charts illustrating a program verify operation for the second page.

FIGS. 14A and 14B are charts illustrating a program verify operation of the cell having the highest threshold value of the third page.

FIGS. 15A and 15B are charts illustrating a program verify operation of a cell having a medium threshold value of the third page.

FIGS. 16A and 16B are charts also illustrating a program verify operation of a cell having a medium threshold value of the third page.

FIGS. 17A and 17B are charts also illustrating a program verify operation of a cell having a medium threshold value of the third page.

FIG. 18A is a chart illustrating a read operation of the first page and FIGS. 18B and 18C are charts illustrating a read operation of the second page.

FIGS. 19A through 19D are charts illustrating a read operation of the third page.

FIGS. 33A, 33B and 33C are charts illustrating a verify operation.

FIGS. 34A, 34B and 34C are charts illustrating a read operation.

FIG. 36 is a chart showing the relationship between the data of memory cells and the threshold voltages of memory cells that can be used for the third embodiment.

FIG. 37 is a chart illustrating a program operation of the second page of the third embodiment.

FIG. 38 is a chart illustrating an operation of an internal data conversion of the third embodiment.

FIGS. 39A and 39B are charts respectively illustrating a read operation of the first page and that of the second page.

FIG. 40 is a chart illustrating a read operation of the third page.

FIG. 41 is a chart showing another possible relationship between the data of memory cells and the threshold voltages of memory cells that can be used for the third embodiment.

DETAILED DESCRIPTION OF THE INVENTION

Now, the present invention will be described by referring to the accompanying drawings that illustrate preferred embodiments of the invention.

1st Embodiment

To begin with, the first embodiment of the invention will be summarily described below.

According to the invention, a 1-bit data will be written into a single cell in a write operation. When writing the next 1-bit data into the cell, a new data will be taken in from the outside and a write operation will be carried out. In this way, a 1-bit data will be written in a single write operation and write operations will be carried out sequentially.

Conventionally, when the first 1-bit data is written into a cell, two states of threshold value appear depending on "1" or "0" of the data of the cell. As the next 1-bit data is written into the cell, a new state of threshold value is required for each of the two states of threshold value. Thus, at least two latch circuits are required to store the three states including the first two states of threshold value and the write non-select state that is not selected for the data writing operation. When the next 1-bit data is written, a new state is required for each of the preceding four states of threshold value and hence a total of five states have to be stored including the preceding four states of threshold value and the write non-select state. Thus, at least three latch circuits are required to store the five states of threshold value. In this way, a total of n latch circuits are required for writing n bits into a single cell.

Figure 1:
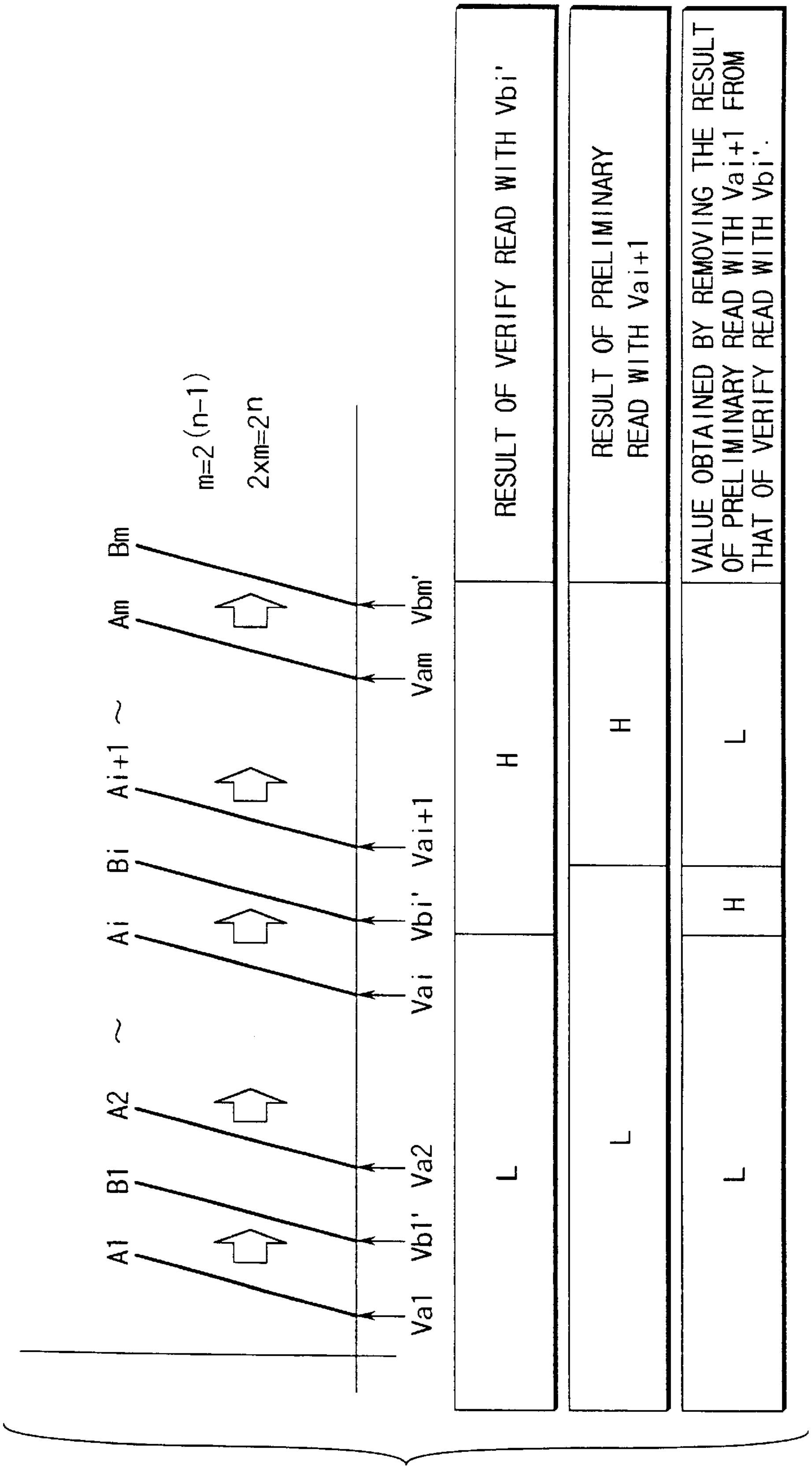
FIG. 1 is a schematic illustration of the operation of a memory device according to the invention.

According to the invention, when a single cell stores data of n−1 bits written into it, there exist $M=_2(n-1)$ threshold values for the cell. Assuming that there are m different threshold values of A1 through Am as shown in FIG. 1, each of the threshold values of the cell is equal to one of the m different values. Assume also that Bi is between Ai and Ai+1 as shown in FIG. 1 and the threshold value of the cell remains to be equal to Ai when the next 1-bit data to be written is data "1" (and hence no data is written) but the threshold value of the cell shifts to Bi when the next 1-bit data to be written is data "0" (and hence a data is written). Then, no data will be written if the data to be written is data "1" regardless of the state of the immediately preceding write operation but a 1-bit data will be written if the data to be written is data "0". In other words, a write operation can be started regardless of the data already stored in the cell.

Then, the threshold value of the cell written there this time includes the level of Bi or not has to be verified. To do this, the gate potential of the cell is made equal to vbi' to see if the cell is turned on or off. If the cell is turned off, the threshold value of the cell is higher than the potential Vbi' and hence the write optical will be terminated.

However, since there is no knowing about the initial state of the cell, although it is equal to one of A1 through Am, a verify operation has to be carried out for each of the potentials vbi' through Vbm' to determine if the data is written only into the cell whose threshold value has been shifted from Ai to Bi or not.

When carrying out a verify operation with potential Vbi', the cell will be turned off to indicate that the verify operation is OK and terminated successfully if the threshold value of the cell is higher than Ai+1. Therefore, this state is stored in the latch circuit by preliminarily reading the data of the cell with potential Vai+1. Then, a verify read operation is carried out with potential Vbi'. If the state of the cell is higher than Ai+1, the outcome of the verify read operation is forcibly brought down to a low level (to indicate that the verify operation is NG). If, on the other hand, the state of the cell is lower than Ai, the cell is turned on without exception to indicate that the verify operation is NG. Thus, the bit line is brought up to a high level only when the verify operation is OK with Bi.

If the latch circuit storing the written data is at the high level (and hence no data is written), the bit line is forcibly brought up to a high level. Thus, the bit line is brought up to a high level only when the verify operation is OK or the high level is latched from the beginning (and hence no data is written). The outcome of this operation is latched by the latch circuit where the data to be written is latched. On the other hand, the latch circuit is brought down to level LOW only when the write operation is NG.

In this way, a verify operation is carried out for each and every one of the potentials Vb1' through Vbm'. However, the data latch circuit comes into the write non-select state (data "1") only when the verify operation is OK with potential Vbi' for the cell where Ai written there is shifted to Bi. Therefore, the data stored in the data latch circuit remains unchanged with any other verify potential.

As a result of using the above process according to the invention, only two latch circuits are required, one for storing the written data always when storing data of n bits and one for carrying out a preliminary reading operation of determining if the cell has a potential higher than Ai+1 (and hence disregards any verify operation) and storing the outcome of the determining operation.

Figure 2:
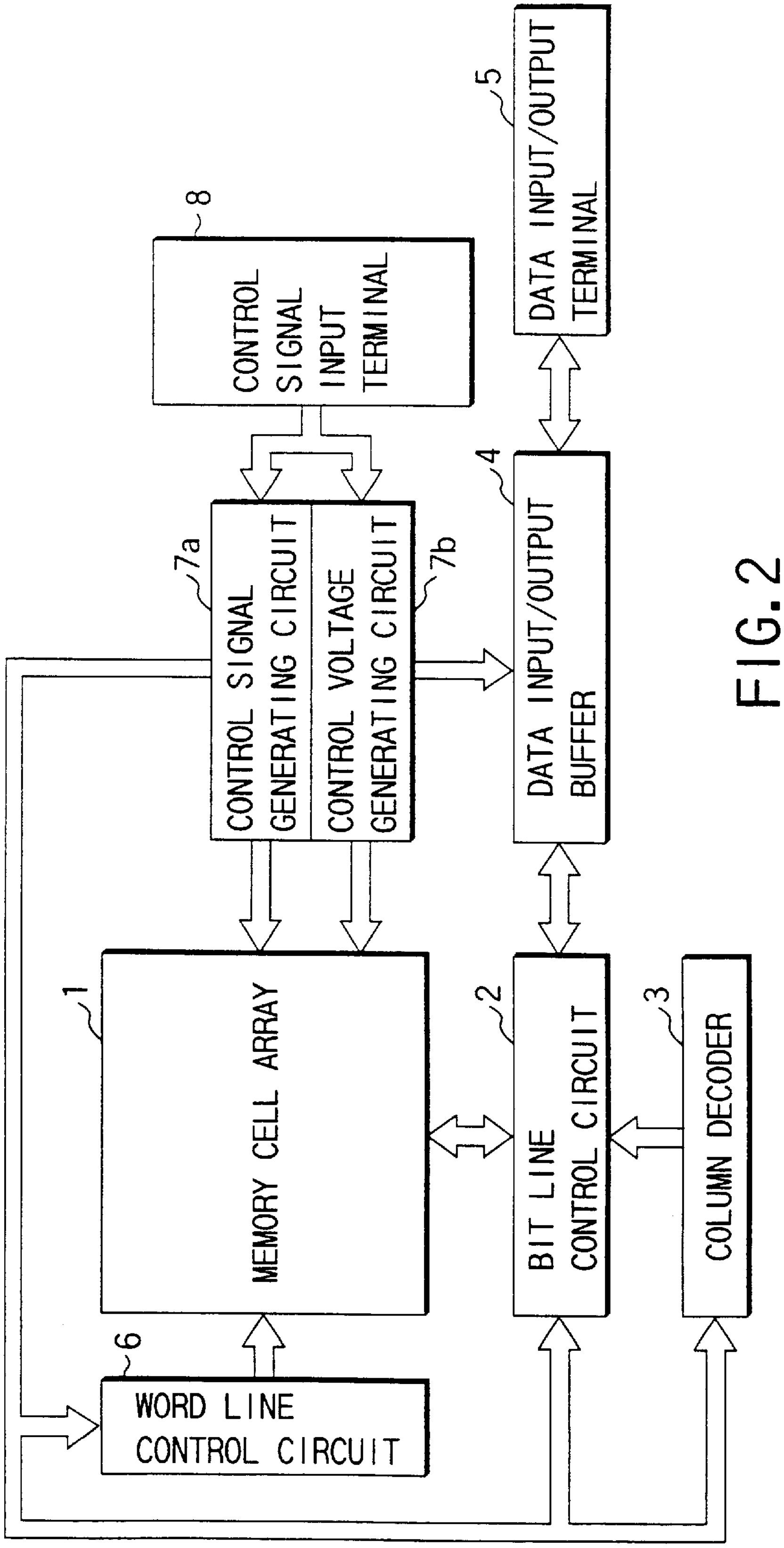
FIG. 2 is a schematic block diagram of the first embodiment of the invention, which is a non-volatile semiconductor memory device.

FIG. 2 is a schematic block diagram of the first embodiment of the invention, which is a non-volatile semiconductor memory device. More specifically, it may be a NAND type flush memory adapted to store 8 values (3 bits).

Referring to FIG. 2, memory cell array 1 includes a plurality of bit lines, a plurality of word lines and a common source line and is formed by a matrix of memory cells adapted to electrical data writing. The memory cells may be EEPROM cells. The memory cell array 1 is connected to a bit control circuit 2 for controlling the bit lines and a word line control circuit 6 for controlling the word lines.

The bit line control circuit 2 includes a plurality of data storage circuits, which will be described hereinafter, and is adapted to read a data from a selected one of the memory cells of the memory cell array 1 by way of a corresponding bit line, detect the state of a selected one of the memory cells of the memory cell array 1 also by way of a corresponding bit line or write a data into a selected one of the memory cells of the memory cell array 1 by applying a write control voltage thereto by way of a corresponding bit line. The bit line control circuit 2 is connected to a column decoder 3 and a data input/output buffer 4. The column decoder 3 selects one of the data storage circuits of the bit line control circuit 2 and the data read out from a memory cell to the selected data storage circuit is output to the outside way of the data input/output buffer 4 and data input/output terminal 5.

On the other hand, the data input to the data input/output terminal 5 from the outside is input to a data storage circuit selected by the column decoder 3 via the data input/output buffer 4.

The word line control circuit 6 is connected to the memory cell array 1. The word line control circuit 6 is adapted to select one of the word lines of the memory cell array 1 and apply a voltage thereto that is necessary for reading, writing or erasing a data.

The memory cell array 1, the bit line control circuit 2, the column decoder 3, the data input/output buffer 4 and the word line control circuit 6 are connected to a control signal generating circuit 7*a* and a control voltage generating circuit 7*b* and controlled by the latter circuits. The control signal generating circuit 7*a* and the control voltage generating circuit 7*b* are connected to a control signal input terminal 8 and controlled by a control signal input from the outside by way of a control signal input terminal 8. Thus, the control signal generating circuit 7*a* and the control voltage generating circuit 7*b* generate respectively a signal and a voltage necessary for a program operation, a program verify operation, a read operation, an erase operation, an erase verify operation or some other operation to be carried out in the memory device according to the control signal supplied from the outside.

Figure 3:
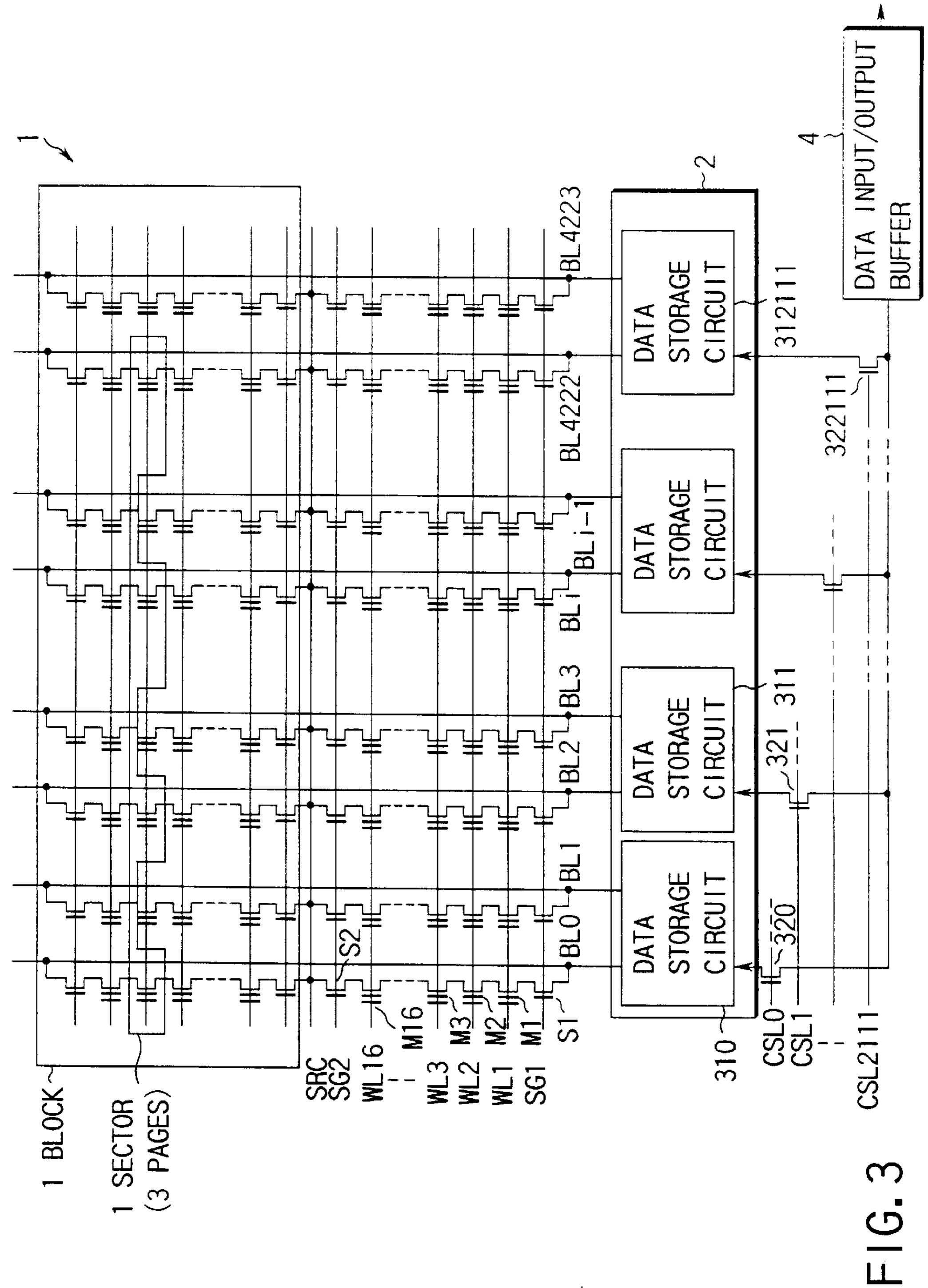
FIG. 3 is a schematic circuit diagram of the memory cell array and the bit line control circuit of the embodiment of FIG. 2.

FIG. 3 is a schematic circuit diagram of the memory cell array 1 and the bit line control circuit 2 of the embodiment of FIG. 2. For instance, the bit line control circuit 2 may comprise a total of 2,112 data storage circuits 310, 311, . . . , 312111. Each of the data storage circuits 310, 311, . . . , 312111 is connected to the above described data input/output buffer 4 by way of respective column select gates 320, 321, . . . , 322111. The column select gates 320, 321, . . . , 322111 are controlled by respective column selection signals CSL0, CSL1, . . . , CSL2111. Each of the data storage circuit 310, 311, . . . , 312111 is connected to a pair of bit lines. Thus, the data storage circuit 310 is connected to bit lines BL0, BL1 and the data storage circuit 311 is connected to bit lines BL2, BL3, whereas the data storage circuit 312111 is connected to bit lines BL4222, BL4223.

A plurality of NAND cells are arranged in the memory cell array 1. For example, each NAND cell may comprise sixteen memory cells M1, M2, M3, . . . , M16 connected in series, which are EEPROMs, a first selection gate S1 connected to the memory cell M1 and a second selection gate S2 connected to the memory cell M16. The first selection gate S1 is connected to the bit line BL0 and the second selection gate S2 is connected to the source line SRC. The control gates of the memory cells M1, M2, M3, . . . , M16 arranged in a row are commonly connected to word lines WL1, WL2, WL3, WL16. All the first selection gates S1 are commonly connected to select line SG1 and all the second selection gates S2 are commonly connected to select line SG2.

Each block comprises a total of 4,224 NAND cells and the data of each block are collectively erased. The memory cells connected to a word line form a sector and data are collectively written into and read from a sector. For example, a sector may store the data of three pages.

Figure 4A:
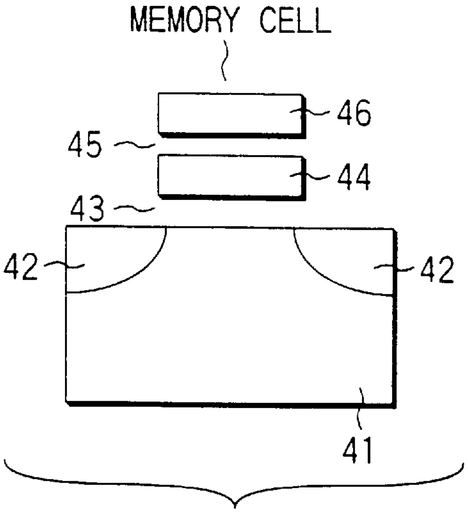
FIGS. 4A and 4B are a schematic cross sectional view of a memory cell and that of a selection transistor that can be used for the first embodiment.
Figure 4B:
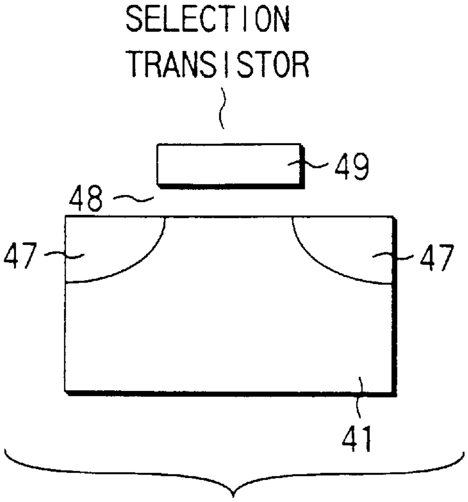

FIGS. 4A and 4B are a schematic cross sectional view of a memory cell and that of a selection transistor that can be used for the first embodiment. Referring to FIG. 4A showing a memory cell, an n-type diffusion layer 42 is formed on substrate 41 for the source and the drain of the memory cell. A floating gate is formed on the substrate 41 by way of a gate insulating film 43 and a control gate 46 is formed on the floating gate 44 by way of an insulating film 45. Now, referring to FIG. 4B showing a selection transistor, an n-type diffusion layer 47 is formed on substrate 41 for the source and the drain of the transistor. A control gate 49 is formed on the substrate 41 by way of a gate insulating film 4B.

Figure 5:
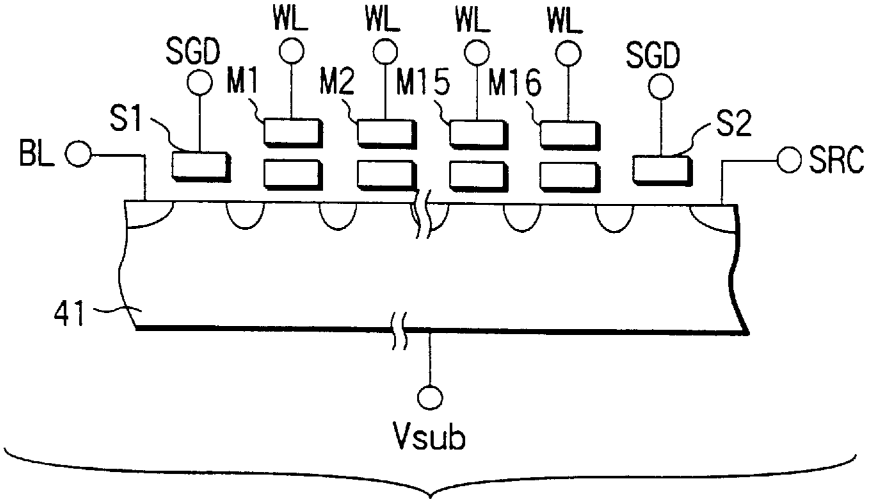
FIG. 5 is a schematic cross sectional view of a NAND cell that can be used for the first embodiment.

FIG. 5 is a schematic cross sectional view of a NAND cell of the memory cell array 1 of the first embodiment. In this instance, the NAND cell is formed by sixteen memory cells M1 through M16 that are connected in series, each having a configuration as shown in FIG. 4A. The first selection gate S1 and the second selection gate S2, each having a configuration as shown in FIG. 4B, are arranged respectively at the drain side and the source side of the NAND cell.

Figure 6:
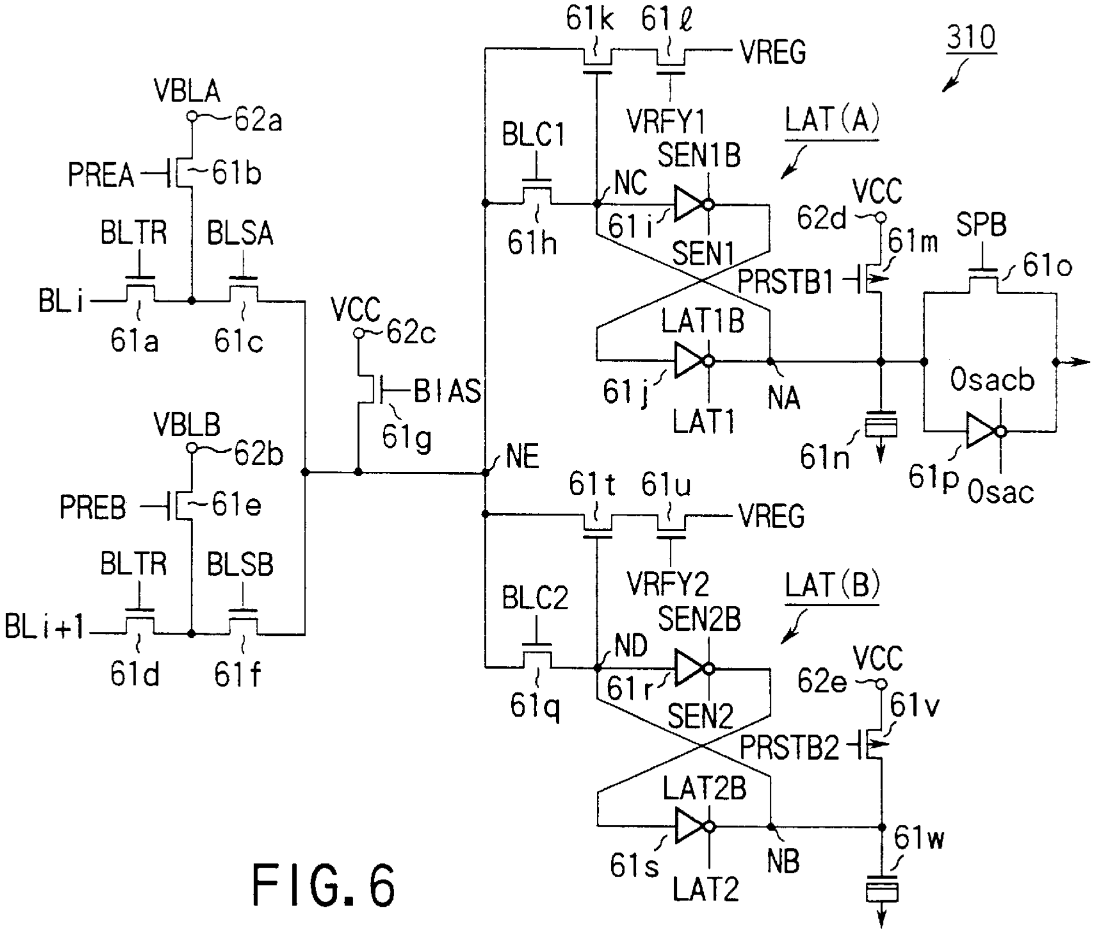
FIG. 6 is a schematic circuit diagram that can be used for the data storage circuits of FIG. 3.

FIG. 6 is a schematic circuit diagram of the data storage circuit 310 of FIG. 3. Since all the data storage circuits have a same configuration, only the data storage circuit 310 will be discussed here.

The current path of N-channel transistor 61*a* is connected at an end thereof to bit line BLi. The gate of the transistor 61*a* is supplied with signal BLTR. The other end of the current path of the transistor 61*a* is connected to an end of the current path of transistor 61*b* and also to an end of the current path of transistor 61*c*. The other end of the current path of the transistor 61*b* is connected to terminal 62*a*. The terminal 62*a* is supplied with voltage VBLA. The gate of the transistor 61*b* is supplied with signal PREA. The gate of the transistor 61*c* is supplied with signal BLSA.

Bit line BLi+1 is connected to an end of the current path of an N-channel transistor 61*d*. The gate of the transistor 61*d* is supplied with said signal BLTR. The other end of the current path of the transistor 61*d* is connected to an end of the current path of transistor 61*e* and also to an end of the current path of transistor 61*f*. The other end of the current path of the transistor 61*e* is connected to terminal 62*b*. The terminal 62*b* is supplied with voltage VBLB. The gate of the transistor 61*e* is supplied with signal PREB. The gate of the transistor 61*f* is supplied with signal BLSB. The transistors 61*b*, 61*e* respectively precharge the non-select bit lines to potentials VBLA, VBLB according to signals PREA, PREB. The transistors 61*c*, 61*f* respectively select bit lines according to signal BLSA, BLSB.

The other ends of the transistors 61*c*, 61*f* are connected to terminal 62*c* through transistor 61*g* and also to node NE. The gate of the transistor 61*g* is supplied with signal BIAS and the terminal 62*c* is supplied with voltage VCC. The transistor 61*g* precharges a bit line according to signal BIAS when reading data.

The node NE is connected to an end of the current path of transistor 61*h*. The gate of the transistor 61*h* is supplied with signal BLC1 and the other end of the current path of the transistor 61*h* is connected to a first latch circuit LAT (A). The first latch circuit LAT (A) is formed by a pair of clocked inverter circuits 61*i*, 61*j*. The clocked inverter circuit 61*i* is controlled by signals SEN1, SEN1B (B representing an inverse signal) while the clocked inverter circuit 61*j* is controlled by signals LAT1, LAT1B. The first latch circuit LAT (A) latches a data to be written.

Transistors 61*k*, 61*l* are connected in series to the node NE. The gate of the transistor 61*k* is connected to node NC of the first latch circuit LAT (A), while the gate of the transistor 61*l* is supplied with signal VRFY1. The current path of the transistor 61*l* is supplied with voltage VREG. The transistors 61*k*, 61*l* select potentials for bit lines according to the data latched by the latch circuit LAT (A).

The node NA of the first latch circuit LAT (A) is connected to terminal 62*d* through P-channel transistor 61*m*. The gate of the transistor 61*m* is supplied with signal PRSTB1, while the terminal 62*d* is supplied with voltage VCC. The transistor 61*m* sets the node NA of the first latch circuit LAT (A) to level HIGH when writing or reading a data. The node NA is grounded through capacitor 61*n*. The capacitor 61*n* holds the electric charge of the node NA when reading a data.

The node NA is also connected to said column select gate (not shown) through transistor 61*o* and clocked inverter circuit 61*p* that are connected in parallel. The gate of the transistor 61*o* is supplied with signal SPB and the clocked inverter 61*p* is controlled by signals Osac, Osacb. The transistor 61*o* transfers the data supplied to it by way of said column select gate to the first latch circuit LAT (A) when writing a data. The clocked inverter circuit 61*p* operates as buffer when reading a data.

Meanwhile, the node NE is connected to an end of the current path of transistor 61*q*. The gate of the transistor 61*q* is supplied with signal BLC2 and the other end of the current path of the transistor 61*q* is connected to the second latch circuit LAT (B). The second latch circuit LAT (B) is formed by a pair of clocked inverter circuits 61*r*, 61*s*. The clocked inverter circuit 61*r* is controlled by signals SEN2, SEN2B, whereas the clocked inverter circuit 61*s* is controlled by signals LAT2, LAT2B. The second latch circuit LAT (B) latches the dats read out from a memory cell.

A pair of transistors 61*t*, 61*u* that are connected in series are then connected to the node NE. The gate of the transistor 61*t* is connected to node ND of the second latch circuit LAT (B), whereas the gate of the transistor 61*u* is supplied with signal VRFY2. The current path of the transistor 61*u* is supplied with voltage VREG. The transistors 61*t*, 61*u* are used to select the potential of a bit line according to the latched data.

The node NB of the second latch circuit LAT (B) is connected to terminal 62*e* through P-channel transistor 61*v*. The gate of the transistor 61*v* is supplied with signal FRSTB2, whereas the terminal 62*e* is supplied with voltage VCC. The transistor 61*v* sets the node NB of the second latch circuit LAT (B) to a high level in a verify read operation. The node NB is grounded through capacitor 61*w*. The capacitor 61*w* holds the electric charge of the node NB in a verify read operation.

The first embodiment having the above described configuration operates in a manner as described below.

Figures 7, 8:
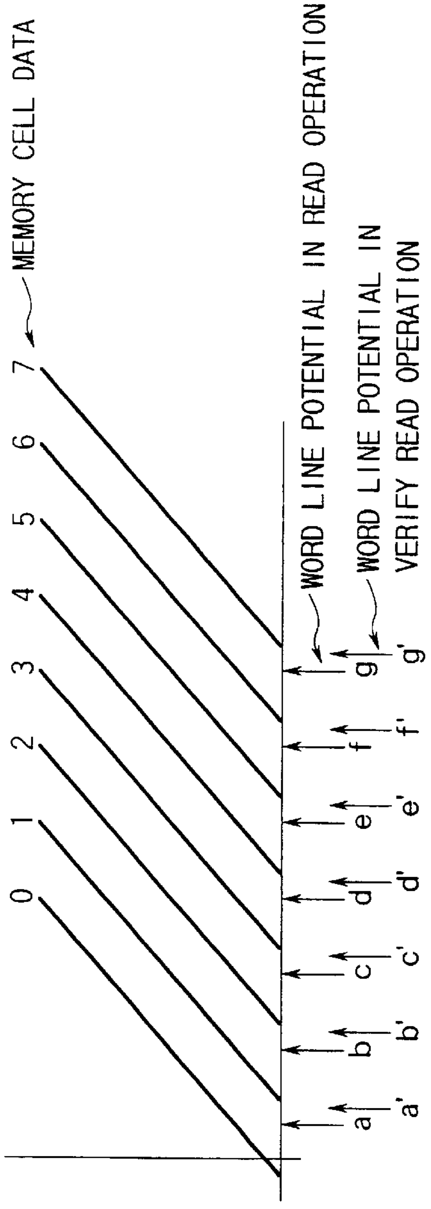
FIG. 7 is a graph showing the relationship between the data of memory cells and the threshold voltages of memory cells that can be used for the first embodiment.
FIG. 8 is a chart showing the relationship between the data of memory cells and the threshold voltages of memory cells that can be used for the first embodiment.

Referring to FIGS. 7 and 8, the relationship between data of memory cells and threshold voltages of the memory cells will be defined. More specifically, referring to FIG. 7, data "0" through "7" of memory cells will be defined in the ascending order of threshold voltages of memory cells. In FIG. 7, "a" through "g" denote potentials of word lines in a read operation, whereas "a'" through "g'" denote potentials of word lines in a verify read operation.

Since the memory cells of the embodiment are multi-valued cells, each cell can store a 3-bit data. The stored 3-bit data can be switched by means of an address (1st page, 2nd page, 3rd page). FIG. 8 shows the relationship between the data written in and read out from memory cells and the threshold voltages of memory cells that can be used for the first embodiment. Assume here a read operation, where the first page is addressed. Data "1" will be read out when the data of memory cells are "0" through "3", whereas data "0" will be read out when the data of memory cells are "4" through "7". Assume that the second page is addressed. Then, data "1" will be read out when the data of memory cells are "0", "1", "4" and "5", whereas data "0" will be read out when the data of memory cells are "2", "3", "6" and "7"1. Assume that the third page is addressed. Then, data "1" will be read out when the data of memory cells are "0"', "2", "4" and "6", whereas data "0" will be read out when the data of memory cells are "1", "3", "5" and "7". The opposite is true for a write operation.

The data of a memory cell is reduced to "0" as a result of an erase operation and data "1" will be read out by addressing any of the first through third pages.

(Method of Selecting a Cell)

In a read operation, a program verify operation or a program operation, one of the pair of bit lines (BLi, BLi+1) connected to a data storage circuit is selected by an externally specified address. Then, a word line is selected by an externally specified address to select a sector as shown in FIG. 3. The sector can be switched by means of an address.

An erase operation is conducted on a block by block basis as shown in FIG. 3 for a pair of bit lines (BLi, BLi+1) connected to a data storage circuit simultaneously.

In an erase verify operation, the bit line (BLi) of the pair of bit lines (BLi, BLi+1) connected to a data storage circuit is subjected to verify read in a single operation and the outcome of the operation is stored in the first latch circuit LAT (A) as shown in FIG. 6. Then, a verify operation is conducted for bit line (BLi+1) and the logical sum of the outcome of this optical and that of the previous verify read operation is stored in the first latch circuit LAT (A). The erase verify operation is repeated until the nodes NA of all the first latch circuits LAT (A) are brought down to a low level.

(Program and Program Verify)

(1st Page Program)

Figure 9:
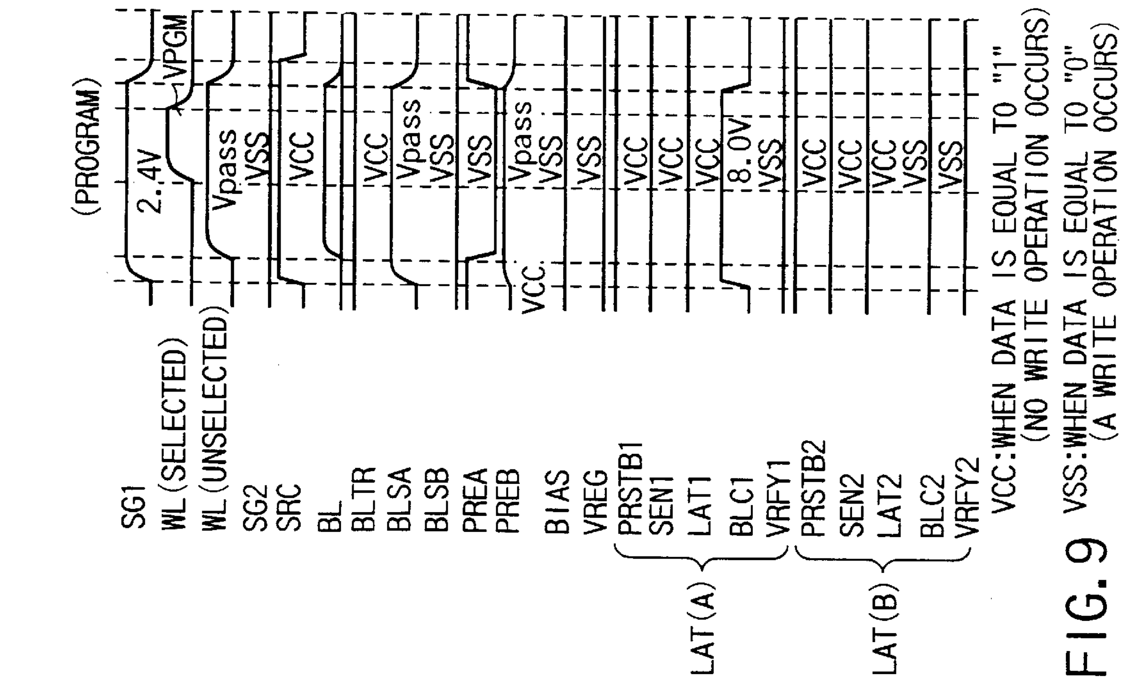
FIG. 9 is a timing chart that can be used for a program operation of the first embodiment.

FIG. 9 is a timing chart that can be used for a program operation of the first embodiment and shows the voltages of various sections thereof. Thus, these voltages are selected for the sections to carry out a program operation.

In a program operation, firstly an address is specified to select a sector as shown in FIG. 3. The memory can proceeds for a program operation only in the sequence of the first page, the second page and the third page. Thus, the first page is firstly addressed.

Then, the data to be written is stored in the first latch circuits LAT (A) in all the data storage circuits through the data input/output buffer 4, the column select gate and the transistor 61*o* shown in FIG. 6. If data “1” (no data is written) is externally input, the node NA of the first latch circuit LAT (A) is set to a high level. If, on the other hand, data “0” (a data is written) is externally input, the node NA is set to a low level. Thereafter, the data of the first latch circuit LAT (A) will be the potential of the node NA of the data storage circuit and the data of the second latch circuit LAT (B) will be the potential of the node NB of the data storage circuit.

The transistor 61*h* is turned on as voltage VCC+Vth is supplied to the gate of the transistor 61*h* as signal BLC1. Then, since the transistors 61*c*, 61*a* are on, the bit line will show the supply potential VCC when data “1” is stored in the first latch circuit LAT (A) and it will show the ground potential VSS when data “0” is stored in the first latch circuit LAT (A). No data should be written to any cells that are in an unselected page but connected to the selected word line because their bit lines are not selected. Therefore, the bit lines connected these cells are held to potential VCC as in the case where data “1” is stored.

Referring to FIG. 9, VCC is supplied to select line SG1 of the selected block and VPGM (20V) is supplied to the selected word line, whereas Vpass (10V) is supplied to the unselected word lines. Then, if the bit line is at VSS, electrons are implanted into the floating gate of the selected cell for write the data therein because the channel of the cell is at VSS and the word line is at VPGM. If, on the other hand, the bit line is at VCC, the first selection gate S1 is turned off. As a result, the channel of the cell is not at VSS but at Vpass to produce Vpass/2 by coupling so that no program operation will be conducted.

When writing data “0”, the data of the memory cell is made equal to “4”. When writing data “1”, on the other hand, the data of the memory cell remains equal to “0”.

(Verify 1st Page)

(Verify Operation of the Cell having the Highest Threshold Value)

Figure 10:
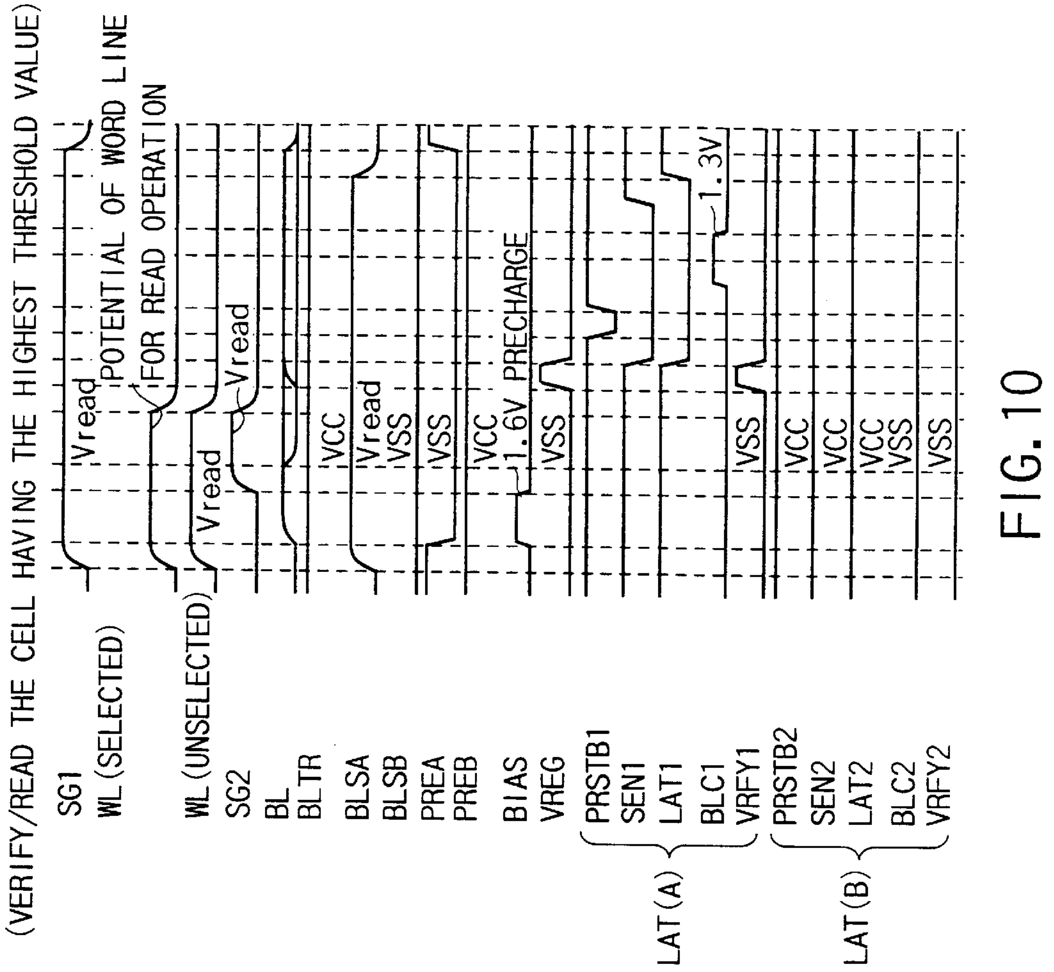
FIG. 10 is a timing chart for a verify operation of the cell having the highest value.

A verify operation on the cell having the highest threshold value will be described by referring to FIGS. 10 and 13A.

For verifying the first page, potential “d” that is slightly higher than potential “d” to be used for a corresponding read operation is applied to the selected word line. In the following description, the denomination of a potential accompanied by “'” refers to a potential to be used for a verify operation, which is slightly higher than the potential to be used for a corresponding read operation.

Then, potential Vread is supplied to the unselected word lines and select line SG1 of the selected block. At the same time, the signal BIAS supplied to the gate of the transistor 61*g* of FIG. 6 is brought up to a high level to precharge the bit line. Thereafter, select line SG2 of the source side of the cell is brought up to a high level. If the threshold voltage of the cell is higher than “d'”, the bit line remains at the high level because the cell is turned off. If the threshold voltage of the cell is lower than “d'”, voltage VSS is applied to the bit line because the cell is turned on.

As described earlier, the low level is stored in the first latch circuit LAT (A) as shown in FIG. 6 when no write operation is carried out, whereas the high level is stored in the first latch circuit LAT (A) when a write operation is carried out. Therefore, as VREG is switched to VCC and VRFY1 is brought up to a high level, the transistors 61*k*, 61*l* are turned on to bright up the bit line to a high level only when no write operation is carried out. After this operation, the potential of the bit line is read to the first latch circuit LAT (A). The high level is latched by the first latch circuit LAT (A) only when the cell gets to the threshold voltage or when no write operation is carried out. The low level is latched by the first latch circuit LAT (A) only when the cell does not get to the threshold voltage. Thus, a write operation is carried out again when the first latch circuit LAT (A) is at a low level and the program operation and the verify operation will be repeated until the data of all the data storage circuits get to a high level.

The above operations are same as those conducted for 2-valued data.

(2nd Page Program)

As in the case of the first page program, the data to be written is stored in the first latch circuits LAT (A) in all the data storage circuits for the second page program. Then, the data is written in all the cells of the page that are selected by supplying a predetermined voltage.

As shown in FIG. 8, if the data of the memory cells of the fist page is equal to “0” (and hence no write operation is carried out in the first page), the data of the memory cells becomes equal to “2”, when a write operation is carried out on the memory cells, whereas the data of the memory cells remains to be equal to “0” when no write operation is carried out. If, on the other hand, the data of the memory cells of the fist page is equal to “4” (and hence a write operation is carried out in the first page), the data of the memory cells becomes equal to “6” when a write operation is carried out on the memory cells, whereas the data of the memory cells remains to be equal to “4” when no write operation is carried out. Thus, either data “2” of data “6” is written into the memory cells for the second page program.

(Verify 2nd Page)

(Verify Operation of the Cell having the Highest Threshold Value)

A verify operation to be conducted when the data of a memory cell is quality to “6” will be described by referring to FIGS. 10 and 13B. FIG. 10 shows the voltages of different sections and FIG. 13B shows the sequence of the operation.

The verify operation is exactly same as the one described above for the first page because no cells other than those storing data “6” show a potential higher than potential “f”. In the verify operation for the first page, potential “d'” is applied to the word line to verify if the data of the memory cell becomes equal to “4” or not. Likewise, potential “f'” is applied to the word line to verify if the data of the memory cell becomes equal to “6” or not. As a result of a verify operation same as the one described for the first page, a high level is latched by the first latch circuit LAT (A) only when the cell gets to the threshold voltage or when no write operation is carried out (as level HIGH is latched to the first latch circuit LAT (A) from the beginning). A low level is latched by the first latch circuit LAT (A) only when the cell does not get to the threshold voltage and hence data “6” is not written into the memory cell or data “2” is written into the memory cell.

(Verify Operation of a Cell having a Medium Threshold Value)

Figure 11:
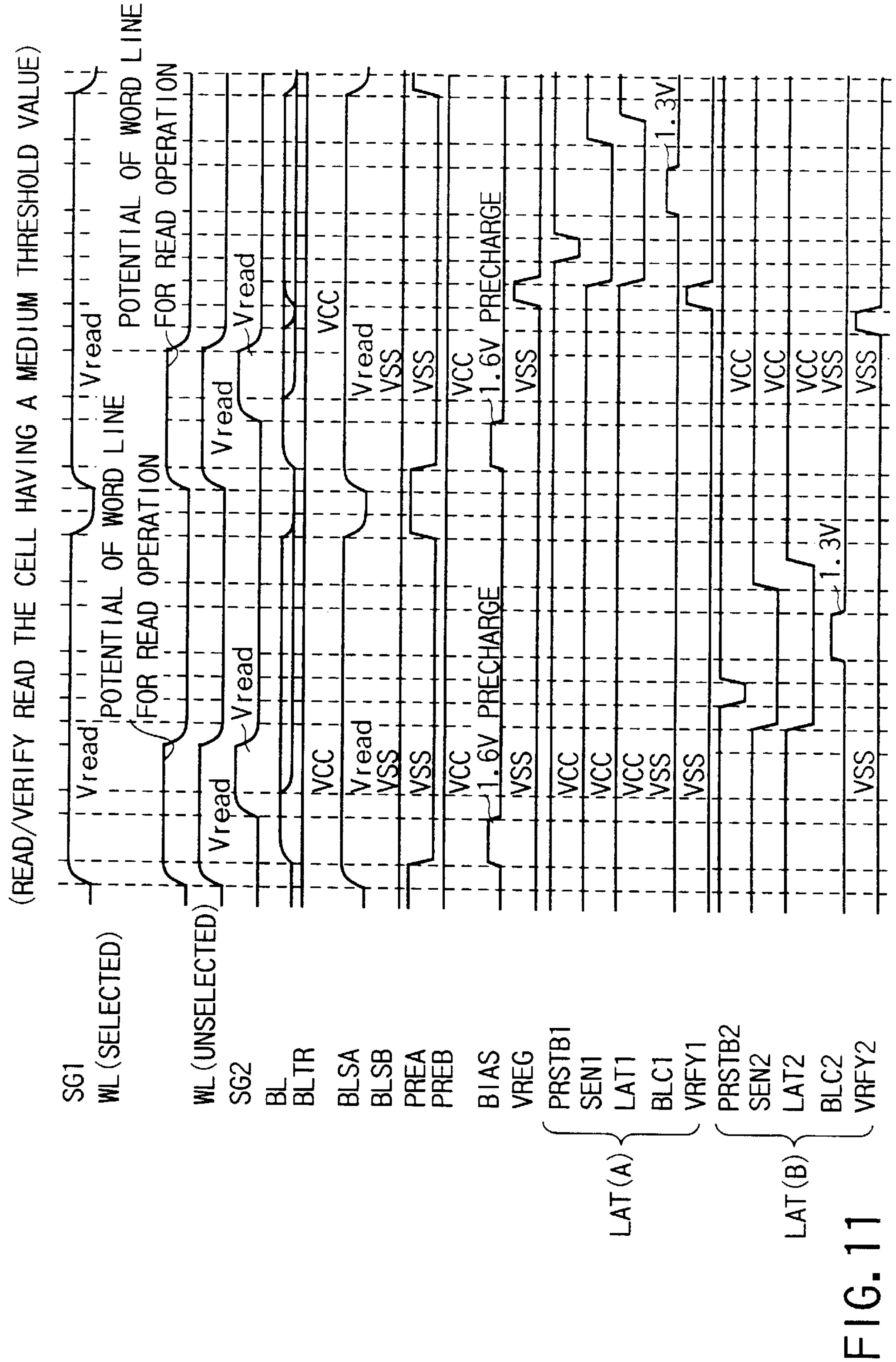
FIG. 11 is a timing chart for a verify operation of a cell having a medium threshold value.

Now, a verify operation of a cell having a medium threshold value will be described by referring to FIGS. 11 and 13C, showing an example where the data of the memory cell is equal to “2”. FIG. 11 shows the voltages of different sections and FIG. 13C shows the sequence of the operation. For the verify operation, potential “b'” is supplied to the word line. However, the threshold voltage of the memory cells storing a data equal to or greater than “4” is high. Then, such a memory cell will be turned off to make the verify operation OK. Therefore, it is necessary to check in advance if the data of the memory cell is equal to or greater than “4” or not. To do this, potential “d” is supplied to the word line to read the data of the memory cell, which is then stored in the second latch circuit LAT (B) of the data storage circuit as shown in FIG. 6. If the data of the memory cell is equal to or greater than “4”, a high level is stored in the second latch circuit LAT (B).

Then, potential “b'”, is supplied to the word line to read the data of the memory cell. As a result, a high level is produced when the bit line gets to threshold voltage “b'” or the data of the memory cell is equal to or greater than “4”. On the other hand, a low level is produced when the bit line does not get to threshold voltage “b'” or the data of the memory cell is equal to “0”. Then, as signal VREG shown in FIG. 6 is made equal to potential VSS and potential VRFY2 supplied to the gate of the transistor 61*u* is brought up to a high level, the transistor 61*t* is turned on if the second latch circuit LAT (B) stores the high level. Since the transistors 61*c*, 61*a*, 61*f* and 61*d* are on at this time, the bit line is brought down to a low level. Thus, if the data of the memory cell is equal to or greater than “4”, the bit line is brought down to a low level.

Then, as signal VREG at the side of the first latch circuit LAT (A) is made equal to potential VCC and potential VRFY1 is brought up to a high level, the bit line is brought up to a high level if the first latch circuit LAT (A) stores the high level (and hence no write operation is carried out). The potential of the bit line is read to the first latch circuit LAT (A) after the operation. The high level is latched by the first latch circuit LAT (A) when the memory cell storing data “2” gets to the threshold voltage or when no write operation is carried out. The low level is latched by the first latch circuit LAT (A) when the memory cell storing data “2” does not get to the threshold voltage or when the data of the memory cell where a write operation is carried out is equal to or greater than “4”.

Thus, the verify operation of the second page is carried out twice, once when data “2” is written into the memory cell and once when data “6” is written into the memory cell. As a result, a write operation is carried out again when the first latch circuit LAT (A) is at a low level and the program operation and the verify operation will be repeated until the data of all the data storage circuits get to a high level. However, the write operation will take time when the data of the memory cell is equal to “6” because the threshold voltage is high.

Figure 13D:
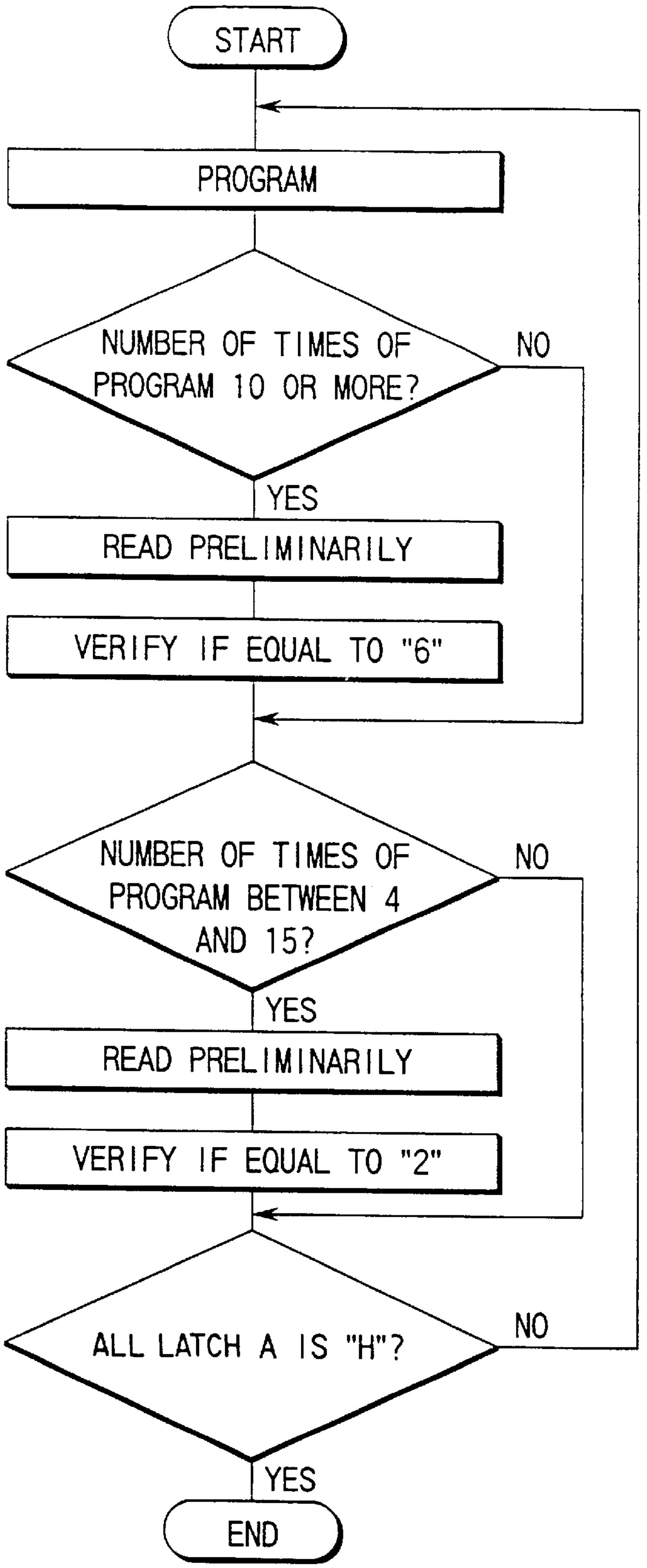
FIG. 13D is a flow chart of a program verify operation.

In view of this fact, of the program verify operations that are repeatedly carried out, the first several verify operations of seeing if the data of the memory cell is equal to “6” or not may be omitted as shown in FIG. 13D. Additionally, after several program verify operations, the operation of writing data “2” whose threshold voltage is low must have been finished. Then, the subsequent verify operations of seeing if the data of the memory cell is equal to “2” can be omitted. However, at and near the time when the operation of writing data “2” is finished, both a program verify operation of seeing if the data of the memory cell is equal to “2” and that of seeing if the data of the memory cell is equal to “6” will be carried out.

In the operation of verifying the second page, potential “d” as shown in FIG. 7 is supplied to the word line for a read operation in order to check if the data of the memory cell is equal to or greater than “4” during the operation of verifying the memory cell where data “2” is to be written and then the outcome is stored in the second latch circuit LAT (B) of the data storage circuit. However, the second latch circuit LAT (B) is not used for any operations other than this operation. Thus, the preliminary read operation using potential “d” has to be carried out only once for the first program operation and the first verify operation, although these operations are repeated thereafter.

(3rd Page Program)

As in the case of the first and second page programs, the data to be written is stored in the first latch circuits LAT (A) in all the data storage circuits for the third page program. Then, the data is written in all the cells of the page that are selected by supplying a predetermined voltage to the word lines.

As shown in FIGS. 8, 14A and 14B, if the data of the memory cells is equal to “0”, the data of the memory cells becomes equal to “1” when a write operation is carried out on the memory cells, whereas the data of the memory cells remains to be equal to “0” when no write operation is carried out. If, on the other hand, the data of the memory cells is equal to “2”, the data of the memory cells becomes equal to “3” when a write operation is carried out on the memory cells, whereas the data of the memory cells remains to be equal to “2” when no write operation is carried out. If the data of the memory cells is equal to “4”, the data of the memory cells becomes equal to “5” when a write operation is carried out on the memory cells, whereas the data of the memory cells remains to be quality to “4” when no write operation is carried out. If, finally, the data of the memory cells is quality to “6”, the data of the memory cells becomes equal to “7” when a write operation is carried out on the memory cells, whereas the data of the memory cells remains to be equal to “6” when no write operation is carried out.

(Verify 3rd Page) The data of the memory cells written by the third page program will be any of four data of “7”, “5”, “3” and “1”. Therefore, four verify operations will be carried out for the third page.

(Verify Operation of the Cell having the Highest Threshold Value)

A verify operation on the cell having the highest threshold value that is conducted when the data of the memory cells is equal to “7” will be described by referring to FIGS. 10 and 14B. FIG. 10 shows the voltages of different sections and FIG. 14B shows the sequence of the operation.

The verify operation is exactly same as the operation of the first page where the data of the memory cells are made equal to “4” by the verify operation and that of the second page where the data of the memory cells are made equal to "6" because no cells other than those storing data "7" show a potential higher than potential "g". In the case of the third page, potential "g'" is supplied to the word line to carry out a verify operation.

As a result of a verify operation same as the one described for the first page, a high level is latched by the first latch circuit LAT (A) only when the cell gets to the threshold voltage or when no write operation is carried out (as the high level is latched to the first latch circuit LAT (A) from the beginning). A low level is latched by the first latch circuit LAT (A) only when the cell does not get to the threshold voltage and hence data "7" is not written into the memory cell or data "1", "3" and "5" are written into the memory cell.

(Verify Operation of a Cell having a Medium Threshold Value)

Now, a verify operation of a memory cell for storing data "5" will be described. This verify operation is same as the one that is carried out when the data of the memory cell is equal to "2" in the second page.

However, since the operation is conducted to verify if the data of the memory cell is equal to "5" or not, the potential of the word line is made equal to "f" as shown in FIG. 7 if the data of the memory cell is read in advance. The potential of the word line is made equal to "e'" for the next verify operation. FIG. 11 shows the voltages of different sections for this verify operation and FIGS. 15A and 15B show the sequence of this operation.

(Verify Operation of a Cell having a Medium Threshold Value)

Now, a verify operation of a memory cell for storing data "3" will be described. FIG. 11 shows the voltages of different sections and FIGS. 16A and 16B show the sequence of the operation.

The verify operation is exactly same as the operation of the second page where the data of the memory cells are made equal to "2" by the verify operation and that of the third page where the data of the memory cells are made equal to "5".

However, since the operation is conducted to verify if the data of the memory cell is equal to "3" or not, the potential of the word line is made equal to "d" as shown in FIG. 7 if the data of the memory cell is read in advance. The potential of the word line is made equal to "c'" for the next verify operation.

(Verify Operation of a Cell having a Medium Threshold Value)

Now, a verify operation of a memory cell for storing data "1" will be described. FIG. 11 shows the voltages of different sections and FIGS. 17A and 17B show the sequence of the operation.

The verify operation is exactly same as the operation of the second page where the data of the memory cells are made equal to "2", by the verify operation and that of the third page where the data of the memory cells are made equal to "5" and "3".

However, since the operation is conducted to verify if the data of the memory cell is equal to "1" or not, the potential of the word line is made equal to "b" as shown in FIG. 7 if the data of the memory cell is read in advance. The potential of the word line is made equal to "a" for the next verify operation.

As described above, since data of the memory cells are made equal to "7", "5", "1" and "1", a total of four verify operations will be conducted for the third page. As a result, when the first latch circuit LAT (A) is at a low level, the program operation and the verify operation are repeated until all the data of all the storage circuits are found to be at a high level. However, as in the case of the verify operation of the second page, the time required for a write operation is long when the data of the memory cells shows a high threshold voltage as in the case of the program verify operation of the second page. In view of this fact, of the program verify operations that are repeatedly carried out, the first several verify operations of seeing if the data of the memory cell is equal to "7", "5" or "3" or not may be omitted and the operations are conducted only for data "1". Thereafter, the verify operation of seeing if the data of the memory cell is equal to "1", "3" is repeated for several times. Subsequently, the verify operation of seeing if the data of the memory cell is equal to "1", "3" or "5" is repeated for several times. Finally, the verify operation of seeing if the data of the memory cell is equal to "1", "3", "5" or "7" is repeated for several times. By this time, the entire write operation should have been finished on all the memory cells where data "1" is to be written with a low threshold voltage. In this way, by verifying firstly only data "3", "5" and "7", secondly data "5" and "7" and finally data "7", the time required for the entire verify operations can be significantly reduced.

Additionally, it is no longer necessary to carry out a preliminary read operation of reading the data of memory cells in advance for each verify operation and such a preliminary read operation can be omitted when any data remains in the second latch circuit LAT (B) of FIG. 6.

Read Operation (Read 1st Page)

(Read Operation of the Cell Having the Highest Threshold Value)

Figure 12:
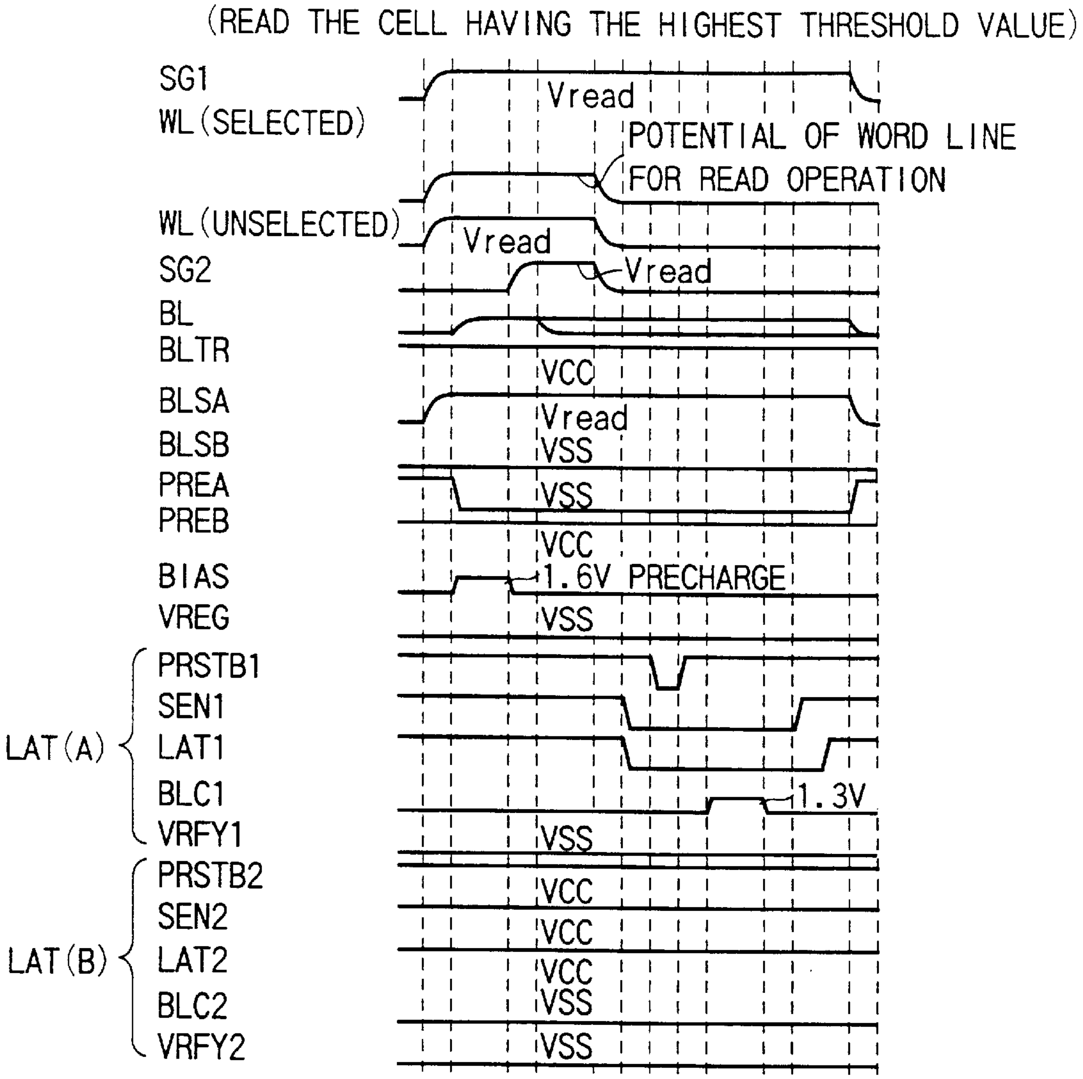
FIG. 12 is a timing chart for a read operation of the cell having the highest value.

FIG. 12 shows the voltages of different sections in this operation and FIG. 18A shows the sequence of the operation.

Potential "d" is supplied to the selected word line for reading the first page. Then, potential Vread (4.5V) is supplied to unselected word lines and select line SG1 in the selected block to bring up the potential BIAS supplied to the gate of the transistor 61*g* of FIG. 6 to a high level and precharge the bit line. Thereafter, select line SG2 at the source side is brought up to a high level. Since the cells showing a threshold voltage higher then potential "d" are turned off, the bit line remains at the high level. Additionally, since the cells showing a threshold voltage lower than potential "d" are turned on, the bit line is brought to the ground potential VSS. Since the data and the threshold voltages of the memory cells are defined as shown in FIG. 8, the potential of the bit line is at a low level when the data of the memory cells is "0", "1", "2" or "3", whereas the potential of the bit line is at a high level when the data of the memory cells is "4", "5", "6" or "7".

Then, as the potential of the bit line is read by the first latch circuit LAT (A), the first latch circuit LAT (A) is brought down to a low level if the data of the memory cells is "0", "1", "2" or "3". On the other hand, the first latch circuit LAT (A) is brought up to a high level if the data of the memory cells is "4", "5", "6" or "7". However, when outputting the data stored in the first latch circuit LAT (A), signal Osac of clocked inverter circuit 61*p* shown in FIG. 6 is enabled and therefore the data output from the data storage circuits is made equal to "1" if the data of the memory cells is "0", "1", "2" or "3" but made equal to "0" if the data of the memory cells is "4", "5", "6" or "7".

The above read operations are same as those conducted for 2-valued data.

(Read 2nd Page)

When the data obtained as a result of an operation of reading the second page is equal to "0", the data of the memory cells are separated into two regions of "2" and "3" and "6" and "7", as shown in FIG. 8.

Therefore, firstly it is determined if the data of the memory cells is equal to "6" or "7" and then it is determined if the data of the memory cell is equal to "2" or "3".

(Read Operation of the Cell Having the Highest Threshold Value)

FIG. 12 shows the voltages of different sections in this operation and FIG. 18B shows the sequence of the operation.

Firstly, it is determined if the data of the memory cells is equal to "6" or "7". This is same as described above for reading the first page because there are no cells showing a potential higher than "f" other than those whose data is equal to "6" or "7". When reading the first page, potential "d" is supplied to the word lines in order to check if the data of the memory cells is equal to "4", "5", "6" or "7". On the other hand, potential "f" is used for the read operation to check if the data of the memory cells is equal to "6" or "7".

As in the case of reading the first page, a high level is latched by the first latch circuit LAT (A) only when the data of the memory cells is equal to "6" or "7". On the other hand, a low level is latched by the first latch circuit LAT (A) when the data of the memory cells is equal to "0", "1", "2", "3", "4" or "5".

(Read Operation of a cell Having a Medium Threshold Value)

Now, a read operation of determining if the data of the memory cells is equal to "2" or "3" will be described below. FIG. 11 shows the voltages of different sections in this operation and FIGS. 18B and 18C show the sequence of the operation.

This read operation can be carried out simply by supplying potential "b" to the word lines. However, since the cells storing a data of "4" or a higher value also show a high threshold voltage, they will also be turned off. Therefore, it is necessary to check in advance if the data of the memory cells is equal to or greater than "4". Therefore, potential "d" is supplied to the word lines for a read operation and the outcome of the operation is stored in the second latch circuit LAT (B) shown in FIG. 6. Thereafter, as potential "b" is supplied to the word lines to carry out a read operation, the bit line will be brought up to a high level if the data of the memory cells is equal to or greater than "2", whereas it will be brought down to a low level if the data of the memory cells is equal to "0" or "1".

If, at this stage of operation, signal VREG is brought to ground potential VSS and signal VRFY2 is brought up to a high level to turn on transistor 61U, the bit line will be brought down to a low level when the second latch circuit LAT (B) is at the high level. In other words, the bit line will be brought down to a low level when the data of the memory cells is equal to or greater than "4". Therefore, at this time, it will be brought up to a high level only when the data of the memory cells is equal to "2" or "3". This level may be latched by the first latch circuit LAT (A). Then, however, the data stored in the first latch circuit LAT (A) is changed if the data of the memory cells is equal to "6" or "7". In view of this fact, signal VREG is brought to the level of supply voltage VCC and signal VRFY1 is brought up to a high level to turn on transistor 61*l*. If the high level is latched by the first latch circuit LAT (A) (and hence the data of the memory cells is equal to "6" or "7"), the bit line will be brought up to a high level.

After this operation, the potential of the bit line is latched by the first latch circuit LAT (A). Then, a high level is latched by the first latch circuit LAT (A) when the data of the memory cells is equal to "2", "3", "6" or "7", whereas a low level is latched by the first latch circuit LAT (A) when the data of the memory cells is equal to "0", "1", "4" or "5". As in the case of the operation of reading the first page, signal Osac of the clocked inverter circuit 61*p* of FIG. 6 is enabled when the data stored in the first latch circuit LAT (A) is output. Thus, data "1" will be output from the data storage circuits when the data of the memory cells is equal to "0", "1", "4" or "5", whereas data "0" will be output from the data storage circuits when the data of the memory cells is equal to "2'", "3", "6" or "7".

In the operation of reading the second page, potential "d" is applied to the word lines to check if the data of the memory cells is equal to or greater than "4" during the read operation provided that the data of the memory cells is equal to "2" or "3" and the result is stored in the second latch circuit LAT (B) shown in FIG. 6. However, if the second page is read after the operation of reading the first page and the data of the memory cells is equal to or greater than "4", a high level is latched by the first latch circuit LAT (A). Therefore, this operation can be omitted by transferring the data stored by the first latch circuit LAT (A) to the second latch circuit LAT (B).

(Read 3rd Page)

If data "0" is output as a result of the operation of reading the third page, the data of the memory cells is equal to "1", "3", "5" or "7" as shown in FIG. 8.

Therefore, firstly, it is determined if the data of the memory cells is equal to "7" or not and, thereafter, it is determined if the data of the memory cells is equal to "5" or not. Then, it is determined if the data of the memory cells is equal to "3" or not and, finally, it is determined if the data of the memory cells is equal to "1" or not. Thus, a total of four operations have to be carried out.

(Read Operation of the Cell Having the Highest Threshold Value)

FIG. 12 shows the voltages of different sections in this operation and FIG. 19A shows the sequence of the operation.

Firstly, it is determined if the data of the memory cells is equal to "7" or not. This is same as the above described operation of determining if the data of the memory cells is equal to "6" or "7" that is carried out when reading the first and second pages. This is because there are no cells showing a potential higher than "g" other than those whose data is equal to "7". Potential "d" is supplied to the word lines in order to check if the data of the memory cells is equal to "4", "5", "6" or "7" when reading the first page and potential "f" is supplied to the word lines in order to check if the data of the memory cells is equal to "6" or "7" when reading the second page. On the other hand, potential "g" is used for the read operation of this page to check if the data of the memory cells is equal to "7" or not.

As in the case of reading the first page where the data of the memory cells is equal to "14", "5", "6" or "7" and reading the second page where the data of the memory cells is equal to "6" or "7", a high level is latched by the first latch circuit LAT (A) only when the data of the memory cells is equal to "7". On the other hand, a low level is latched by the first latch circuit LAT (A) when the data of the memory cells is equal to "0 ", "1 ", "2 ", "3", "4", "5" or "6.

(Read Operation of a cell Having a Medium Threshold Value)

Now, a read operation of a memory cell storing data "5" will be described. The read operation is exactly same as the operation of the second page where the data of the memory cells is made equal to “2” or “3”.

However, potential “f” is supplied to the word lines when reading the data of the memory cell in advance it order to determine if the data of the memory cell is equal to “5” or not. Then, potential “e” is supplied to the word lines for the next read operation. FIG. 19B shows the sequence of operation.

(Read Operation of a cell Having a Medium Threshold Value)

Now, a read operation of a memory cell storing data “3” will be described. The read operation is exactly same as the operation of the second page where the data of the memory cells is made equal to “2” or “3” and that of the third page where the data of the memory cell is equal to “5”.

However, potential “d” is supplied to the word lines when reading the data of the memory cell in advance it order to determine if the data of the memory cell is equal to “3” or not. Then, potential “c” is supplied to the word lines for the next read operation. FIG. 19C shows the sequence of operation.

(Read Operation of a cell Having a Medium Threshold Value)

Now, a read operation of a memory cell storing data “1” will be described. The read operation is exactly same as the operation of the second page where the data of the memory cells is made equal to “2” or “3” and that of the third page where the data of the memory cells is made equal to “5” or “3”.

However, potential “b” supplied to the word lines when reading the data of the memory cell in advance it order to determine if the data of the memory cell is equal to “1” or no. Then, potential “a” is supplied to the word lines for the next read operation. FIG. 19D shows the sequence of operation.

The data of the memory cell is latched by the first latch circuit LAT (A) as a result of the above four operations.

Erase and Erase Verify Operation (Erase)

Figure 20:
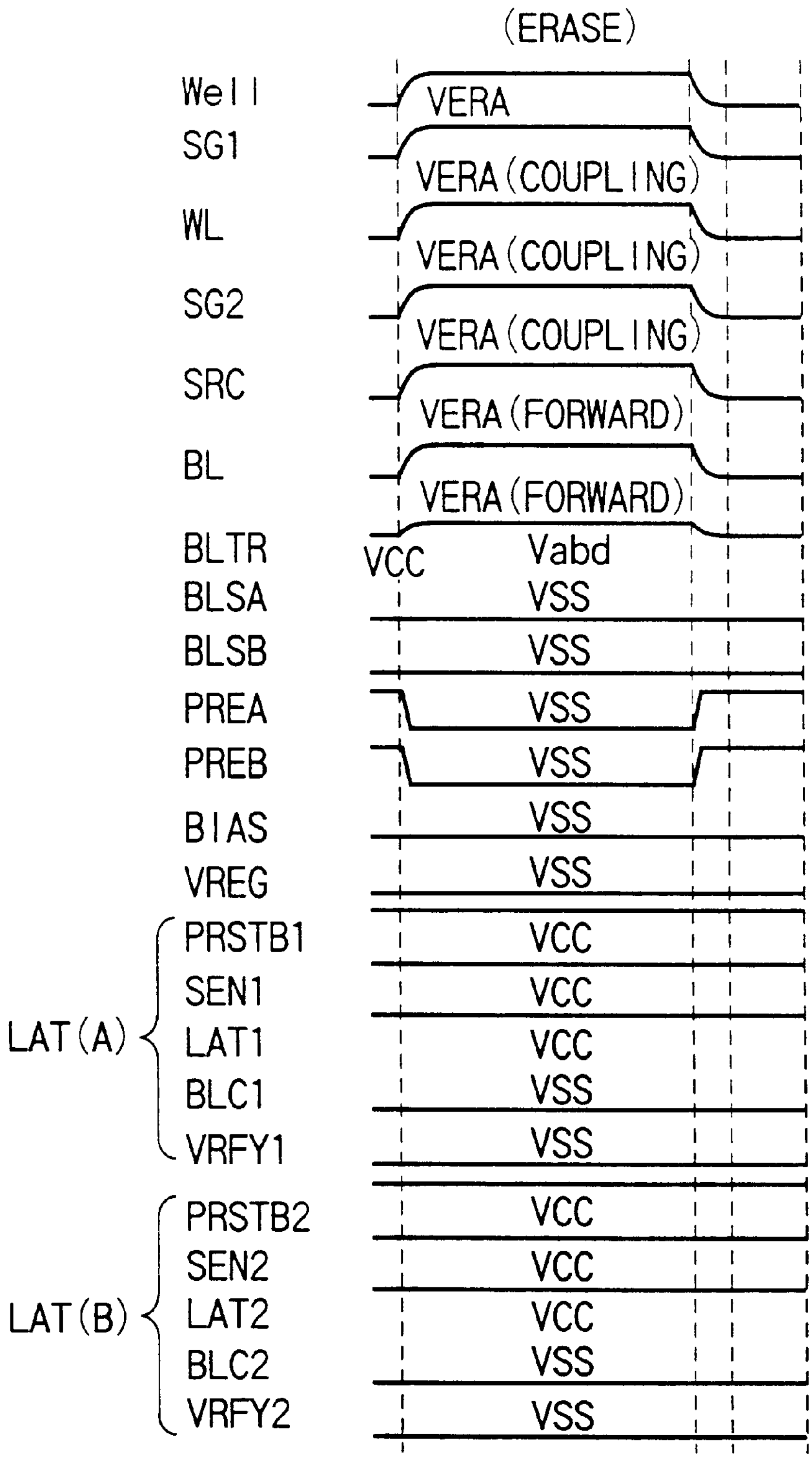
FIG. 20 is a timing chart of an erase operation.
Figure 21:
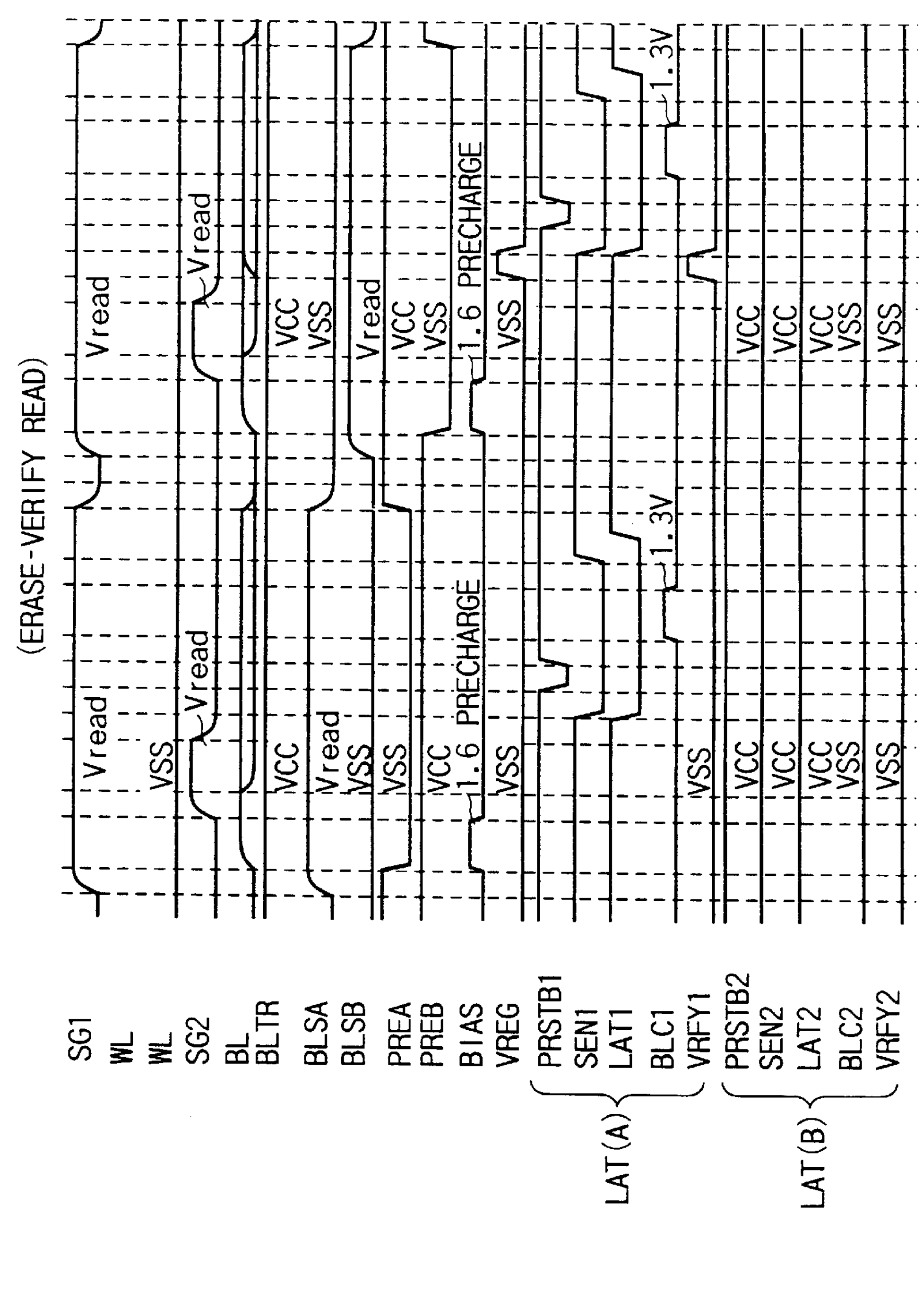
FIG. 21 is a timing chart of an erase very operation.

FIG. 20 illustrates an erase operation. In an erase operation, firstly a block as indicated by broken lines in FIG. 3 will be selected. As the erase operation is conducted, the data of the memory cells of the block is made equal to “0” and data “1” will be output regardless if the first, second or third page is read.

(Erase/verify)

FIG. 20 illustrates an erase-verify operation. An erase-verify operation is conducted on each of a pair of bit lines (BLi, BLi+1) connected to a data storage circuit. For instance, an erase-verify operation is conducted firstly on bit line (BLi). The outcome of the operation is then stored in the first latch circuit LAT (A). The erase-verify operation is almost same as a read operation. However, all the word lines of the selected block are brought to the level of the grounding potential VSS in order to verify all the cells of the block. Potential Vread is supplied to select line SG1 and signal BIAS supplied to transistor 61*g* shown in FIG. 6 is brought up to a high level. Then, the bit line is precharged. Thereafter, select line SG2 on the source side of the cells is brought up to a high level.

If the erase operation is carried out thoroughly and the hence threshold voltage of the cells is not higher than the reference value (0V), the potential of the bit line is found to be at a low level. If, on the other hand, the erase operation is carried out insufficiently and hence the threshold voltage of the cells is higher than the reference value (0V), the potential of the bit line is found to be at a high level and the data is latched by the first latch circuit LAT (A). Thus, the high level is latched by the first latch circuit LAT (A) when the erase operation is not carried out sufficiently, whereas a low level is latched by the first latch circuit LAT (A) when the erase operation is carried out sufficiently.

Then, a verify operation is conducted on the other bit line, or bit line (BLi+1). The outcome of the operation may be stored in the first latch circuit LAT (A). However, since the data stored in the first latch circuit LAT (A) is changed, signal VREG is brought to the level of source voltage VCC and signal VRFY1 is brought up to a high level to turn on transistor 61*l*. When the high level is latched by the first latch circuit LAT (A) (and hence the erase operation is insufficient), the bit line is brought up to a high level through transistors 61*k*, 61*l*. After this operation, the potential of the bit line is read by the first latch circuit LAT (A). The high level is latched by the first latch circuit LAT (A) when either of the two bit lines (BLi, BLi+1) is not erased sufficiently.

In this way, the erase operation and the erase/verify operation are repeated until the data of all the first latch circuits LAT (A) are brought down to a low level.

With the memory of this embodiment, eight values, or 3 bits, are stored in a cell. However, sixteen values, or 4 bits, can be stored in a cell by selecting a value for the eight values defined for the third page and carrying out the program operation and the program-verify operation as described above. Therefore, sixteen values or more than sixteen values may be stored in a cell without modifying the data storage circuits and the operation of controlling them according to the invention.

With the above first embodiment, a 1-bit data is written into a cell by a single write operation. Therefore, a total of $2^{(n-1)}$ threshold voltages exists for the cell when an n−1-bit data is written into the cell. When the next 1-bit data is written, the number of threshold voltages becomes equal to $2^n$. If the new threshold voltage is selected between two existing threshold voltages, a verify operation of seeing if the newly selected threshold voltage is reached or not can be carried out simply by firstly checking if there is a data is written to a threshold voltage higher than the selected threshold voltage and, if there is, by excluding the data. Then, it is no longer necessary to store all the data stored up to that time to the latch circuits. Therefore, the first embodiment is required to have only a single first latch circuit LAT (A) for storing the data to be written and a single second latch circuit LAT (B) for storing the outcome of the operation of checking if there is a data written to a threshold voltage higher than the predetermined threshold voltage used for the verify operation. Thus, regardless of the value of n, the embodiment is realized by using only two latch circuits to consequently reduce the space required for arranging latch circuits.

The basic operational sequence for driving the latch circuits, the potential of the word lines and the number of the program operations have to be modified. This provides an advantage of easy and simple control operations.

In the circuit diagram of a data storage circuit that can be used for the first embodiment, only the first latch circuit LAT (A) is connected to the transistor 61*o*, the clocked inverter circuit 61*p* and the data input/output buffer 4 through the column selected gate (not shown) and the second latch circuit LAT (B) is not connected to the data input/output buffer 4. Thus, the patterned area of the chip can be reduced.

2nd Embodiment

In the case of the above described first embodiment, a total of $2^n$ operations of bringing up the word lines to a high level, reading the data of the cells and latching the read out data have to be carried out for the program-verify operation and the read operation of the n-th page. This means that the time required for the program-verify operation and the read operation is increased enormously as the number of n rises.

An NAND type cell can output a voltage corresponding to the threshold voltage of the cell to the bit line if the threshold voltage is negative. Thus, negative values are selected for the threshold voltages corresponding to all the data of the memory cell and the potentials corresponding to the threshold voltages are output to the bit line by one read operation. Then, the potentials of the bit line are verified simultaneously by a plurality of differential amplifiers to check if they are OK or NG or see if the data is equal to "1" or "0". With this arrangement, the time required for a program-verify operation and a read operation can be significantly reduced. Then, however, a large pattern will be required for the plurality of differential amplifiers and the logic circuits connected to their outputs. Therefore, the second embodiment that will be described hereinafter is designed to make a plurality of sense amplifiers share a single differential amplifier and a single logic circuit on a time division basis.

The overall configuration of the second embodiment of non-volatile semiconductor memory device is same as the one illustrated in FIG. 2.

Figure 22:
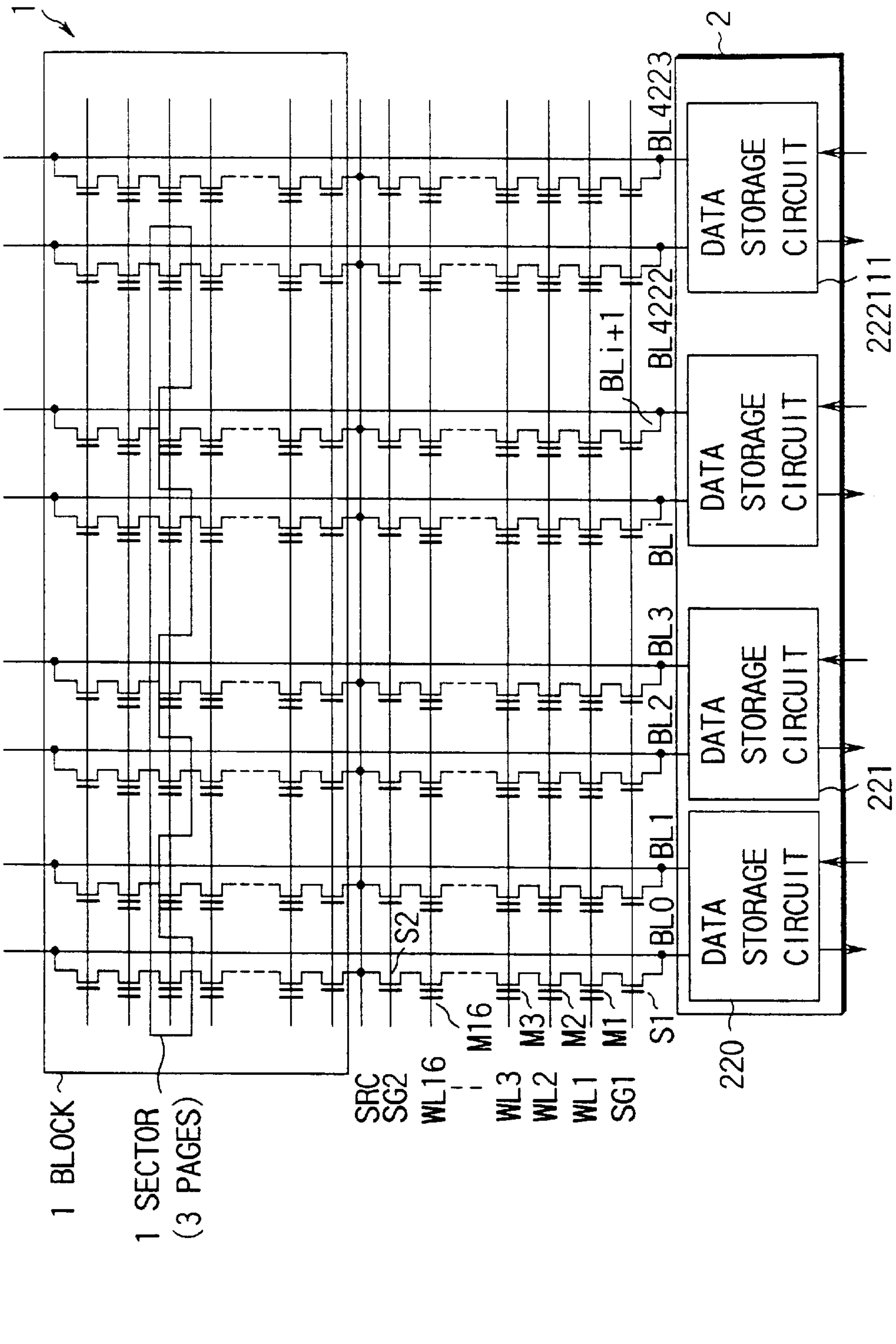
FIG. 22 is a schematic circuit diagram of the memory cell array and the bit line control circuit of the second embodiment.

FIG. 22 is a schematic circuit diagram of the memory cell array 1 and the bit line control circuit 2 of FIG. 2. In FIG. 22, the components same as those of FIG. 3 are denoted respectively by the same reference symbols and only the components different from those of FIG. 3 will be described. More specifically, the data storage circuits 220, 221, . . . , 222111 of the bit line control circuit 2 of FIG. 22 are different from those of FIG. 3. The data storage circuits 220, 221, . . . , 222111 are connected to differential amplifiers and logic circuits.

Figure 23:
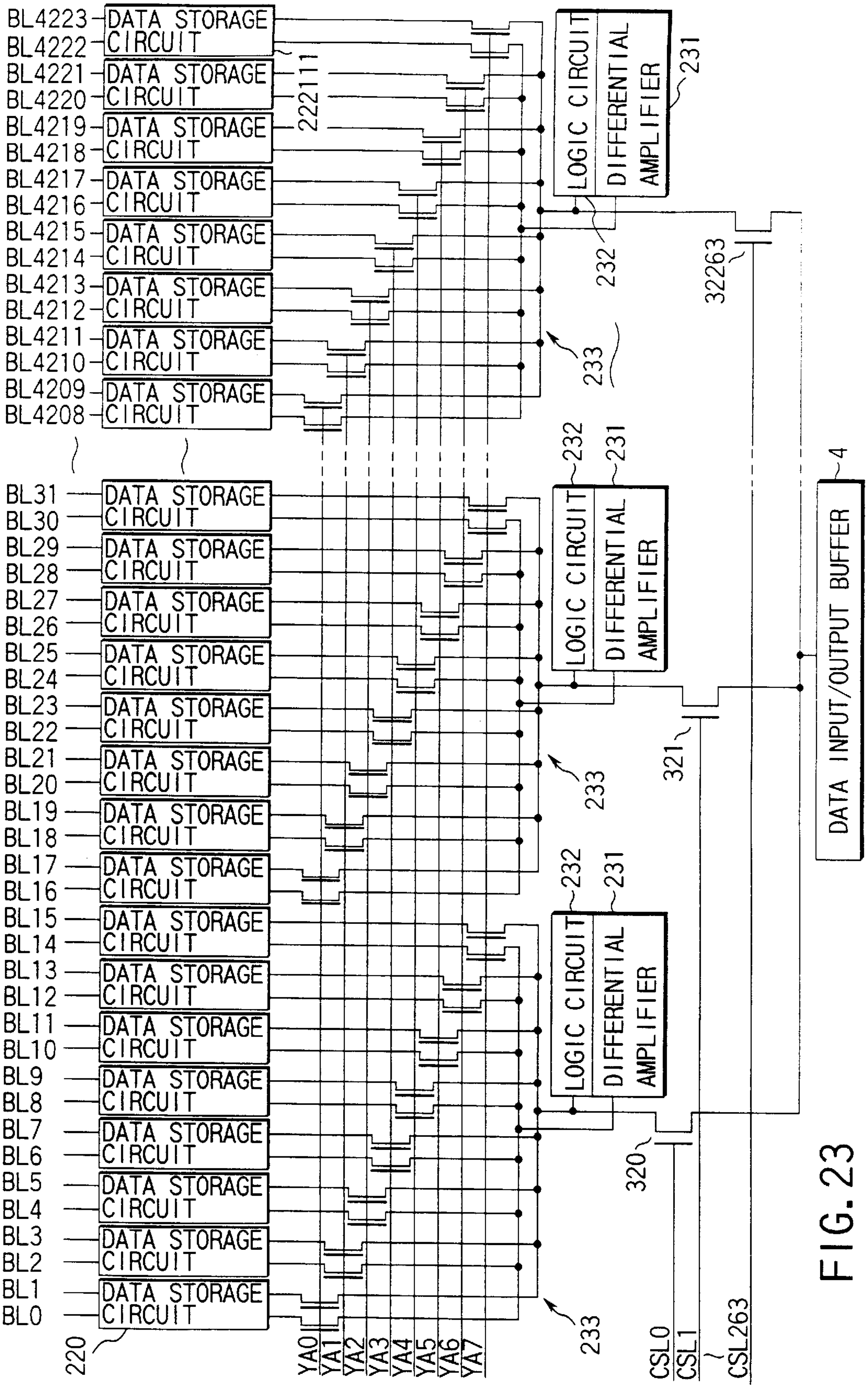
FIG. 23 is a schematic circuit diagram of the data storage circuit, the differential amplifier and the logic circuit of the second embodiment.

Referring to FIG. 23, a total of 264 differential amplifiers 231 and a same number of logic circuits are connected to 264 Y-selector groups 233. Each of the Y-selector groups 233 is connected to eight data storage circuits. In each of the Y-selector groups 233, a pair of transistors are connected between each of the data storage circuits and the differential amplifier section 231 and the logic circuit 232. The paired transistors are controlled by signal YA0 through YA7 and operate to connect the respective data storage circuits to the differential amplifier section 231 and the logic circuit 232.

Figure 24:
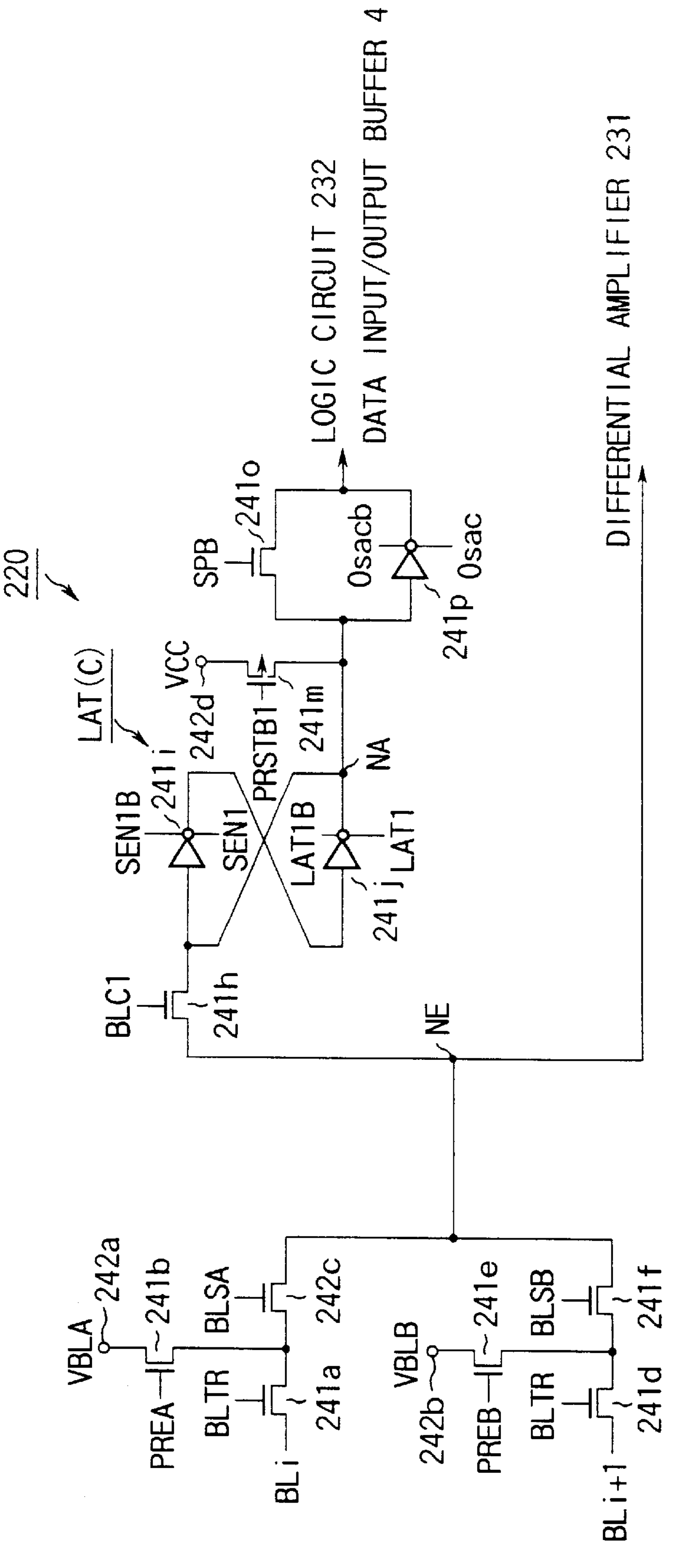
FIG. 24 is a schematic circuit diagram that can be used for the data storage circuits of FIG. 23.

FIG. 24 is a schematic circuit diagram of one of the data storage circuits 220 shown in FIG. 23. The data storage circuit 220 comprises a latch circuit. Bit line BLi is connected to an end of the current path of N-channel transistor 241*a*. The gate of the transistor 241*a* is supplied with signal BLTR. The other end of the current path of the transistor 241*a* is connected to an end of the current path of transistor 241*b* and an end of the current path of transistor 241*c*. The other end of the current path of said transistor 241*b* is connected to terminal 242*a*. The terminal 242*a* is supplied with voltage VBLA. The gate of said transistor 241*b* is supplied with signal PREA. The gate of said transistor 241*c* is supplied with signal BLSA.

Bit line BLi+1 is connected to an end of the current path of N-channel transistor 241*d*. The gate of the transistor 241*d* is supplied with signal BLTR. The other end of the current path of the transistor 241*d* is connected to an end of the current path of transistor 241*e* and an end of the current path of transistor 241*f*. The other end of the current path of said transistor 241*e* is connected to terminal 242*b*. The terminal 242*b* is supplied with voltage VBLB. The gate of said transistor 241*e* is supplied with signal PREB. The gate of said transistor 241*f* is supplied with signal BLSB. The transistors 241*b*, 241*e* precharge unselected bit lines to potentials VBLA, VBLB according to signals PREA, PREB. The transistors 241*c*, 241*f* respectively select bit lines according to signal BLSA, BLSB.

The other ends of the transistors 242*c*, 241*f* are connected to node NE. The node NE is connected to an end of the current path of transistor 241*h*. The gate of the transistor 241*h* is supplied with signal BLC1 and the other end of the current path of the transistor 241*h* is connected to latch circuit LAT (C). The latch circuit LAT (C) is formed by a pair of clocked inverter circuits 241*i*, 241*j*. The clocked inverter circuit 241*i* is controlled by signals SEN1, SENLB (B representing an inverse signal) while the clocked inverter circuit 241*j* is controlled by signals LAT1, LAT1B. The latch circuit LAT (C) latches a data to be written.

The node NA of the latch circuit LAT (C) is connected to terminal 242*d* through P-channel transistor 241*m*. The gate of the transistor 241*m* is supplied with signal PRSTB1, while the terminal 242*d* is supplied with voltage VCC. The transistor 241*m* sets the node NA of the latch circuit LAT (C) to a high level when writing or reading a data.

The node NA is also connected to said logic circuit 232 and said column select gate (not shown) through transistor 241*o* and clocked inverter circuit 241*p* that are connected in parallel. The gate of the transistor 241*o* is supplied with signal SPB and the clocked inverter 241*p* is controlled by signals Osac, Osacb. The transistor 241*o* transfers the data supplied to it through the column select gate to the latch circuit LAT (C) when writing a data. The clocked inverter circuit 241*p* operates as buffer when reading a data. Said node NE is connected to said differential amplifier section 231 (not shown) through the Y-selector.

Figure 25:
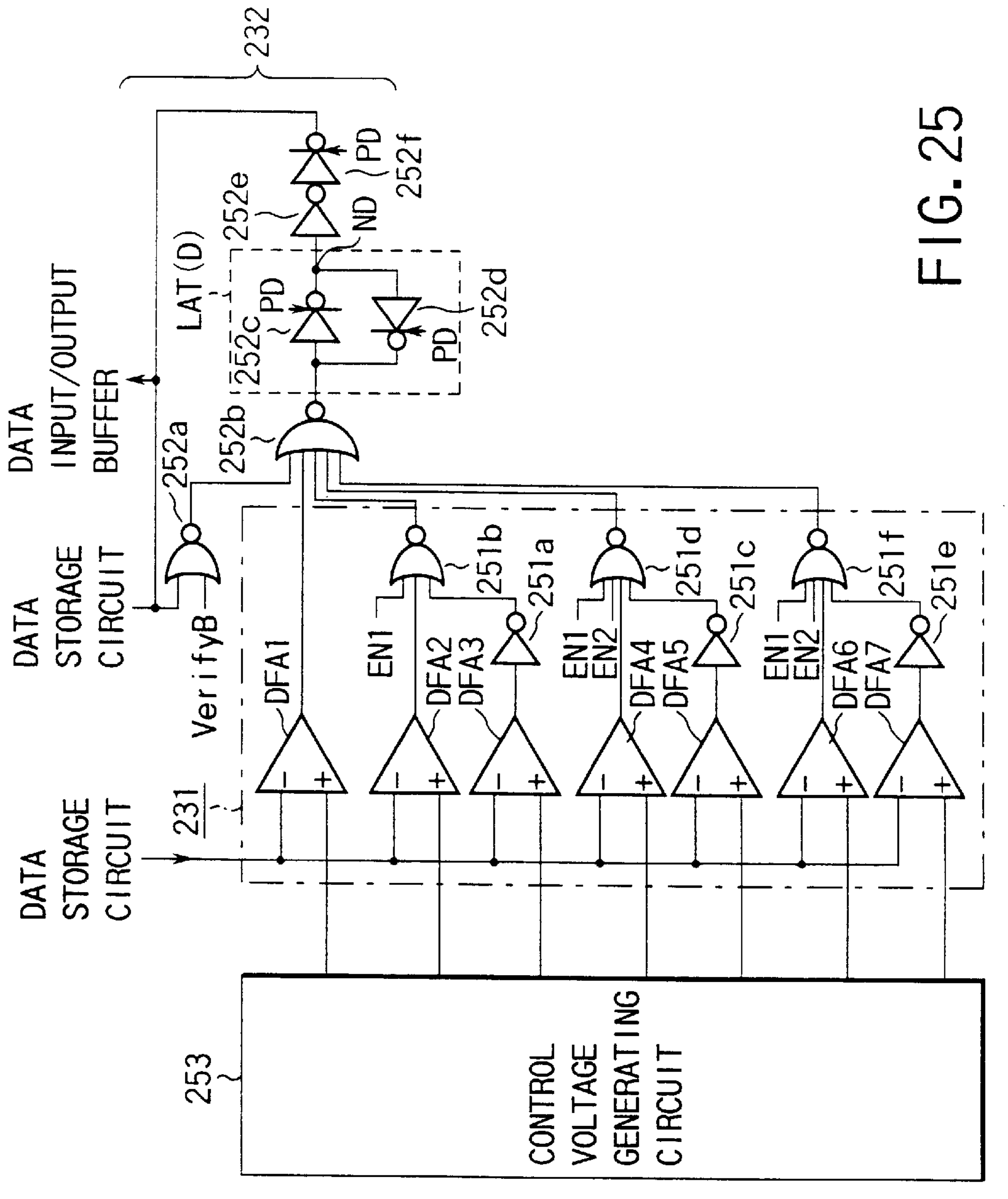
FIG. 25 is a schematic circuit diagram that can be used for the differential amplifier and the logic circuit of FIG. 23.

FIG. 25 is a schematic circuit diagram of the differential amplifier section 231 and the logic circuit 232. The differential amplifier section 231 comprises seven differential amplifiers DFA1 through DFA7. Seven differential amplifiers have to be used for this embodiment because eight values (3 bits) are stored in a cell. Thus, it will be appreciated that $(2^n)-1$ differential amplifiers have to be used when $2^n$ values (n bits) are stored in a cell. The inverse input terminals of the differential amplifiers DFA1 through DFA7 are supplied with respective signals out from the node NE of said data storage circuit and the non-inverse input terminals of the differential amplifiers are supplied respectively with predetermined voltages from said control voltage generating circuit 253.

The output terminal of the differential amplifier DFA3 is connected to the input terminal of the inverter circuit 251*a*. The output signal of the inverter circuit 251*a*, the output signal of the differential amplifier DFA2 and signal EN1 are supplied to NOR circuit 251*b*. The output terminal of the differential amplifier DFA5 is connected to the input terminal of inverter circuit 251*c*. The output signal of the inverter circuit 251*c*, the output signal of the differential amplifier DFA4 and signals EN1, EN2 are supplied to NOR circuit 251*d*. The output terminal of the differential amplifier DFA7 is connected to the input terminal of inverter circuit 251*e*. The output signal of the inverter circuit 251*e*, the output signal of the differential amplifier DFA6 and signals EN1, EN2 are supplied to NOR circuit 251*f*.

NOR circuit 251*a* of the above described logic circuit 232 is supplied with the output signal of the data storage circuit and signal Verify B. The output signal of the NOR circuit 252*a*, the output signal of the differential amplifier DFA1 and the output signals of the NOR circuits 251*b*, 251*d*, 251*f* are supplied to NOR circuit 252*b*. The output signal of the NOR circuit 252*b* is supplied to latch circuit LAT (D). The latch circuit LAT (D) is formed by clocked inverter circuits 252*c*, 252*d*. The clocked inverter circuits 252*c*, 252*d* are controlled by signal PD. The output signal of the latch circuit LAT (D) is supplied to the Y-selector and the data storage circuit through inverter circuit 252*e* and clocked inverter circuit 252*f*.

Figure 26:
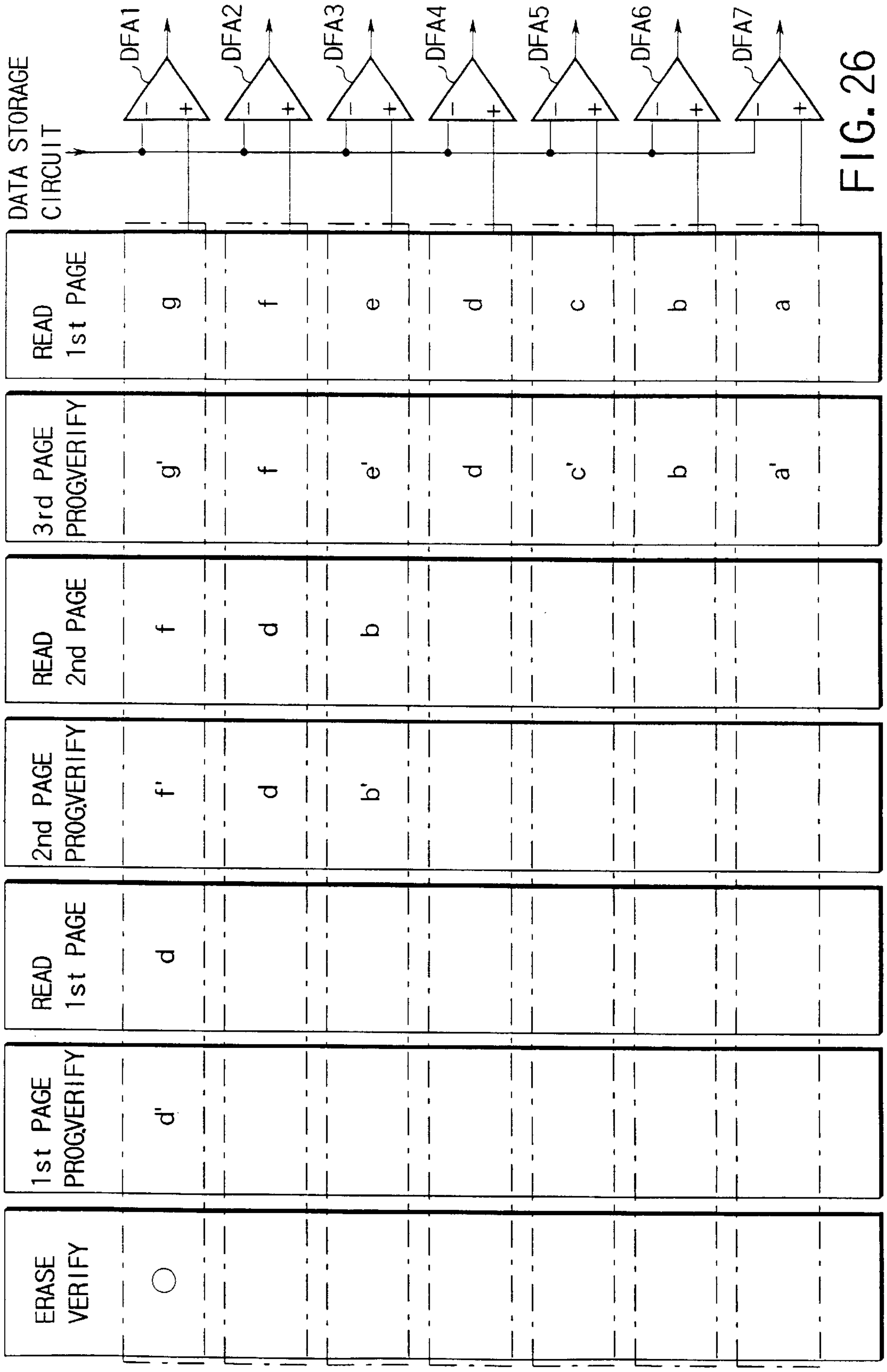
FIG. 26 is a chart showing the relationship between the differential amplifier and the reference potential.

FIG. 26 shows voltages generated by the control voltage generating circuit 7*b* and the positions of the differential amplifiers DAF1 through DAF7 to which the voltage is supplied.

Figures 27, 28:
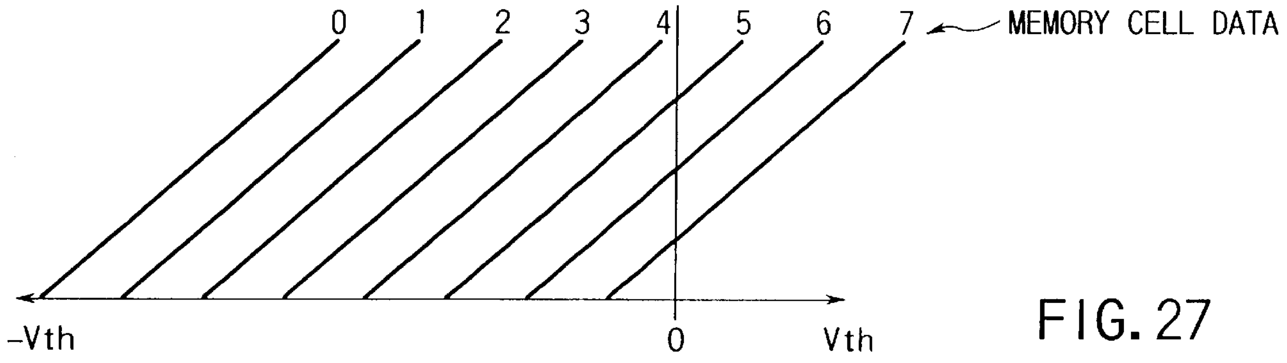
FIG. 27 is a graph showing the relationship between the data of memory cells and the threshold voltages of memory cells that can be used for the second embodiment.
FIG. 28 is a graph showing the relationship between the data of memory cells and the threshold voltages of memory cells that can also be used for the second embodiment.

The data of a memory cell and the threshold voltages thereof are defined in a manner as illustrated in FIGS. 27 and 28. It will be seen that all the threshold voltages are negative. Data "0" through "7" of the memory cell are defined in the ascending order output the threshold voltages of the memory cell. Since the memory cells of the embodiment are multi-valued cells, each cell can store a 3-bit data. The stored 3-bit data can be switched by means of an address (1st page, 2nd page, 3rd page). Assume here a read operation, where the first page is addressed. Data "1" will be read out when the data of memory cells are "0" through "3", whereas data "0" will be read out when the data of memory cells are "4" through "7". Assume that the second page is addressed. Then, data "1" will be read out when the data of memory cells is "0", "1", "4" or "5", whereas data "0" will be read out when the data of memory cells is "2", "3", "6" or "7". Assume that the third page is addressed. Then, data "1" will be read out when the data of memory cells is "0", "2", "4" or "6", whereas data "0" will be read out when the data of memory cells is "1", "3", "5" or "7".

The data of a memory cell is reduced to "0" as a result of an erase operation and data "1" will be read out by addressing any of the first through third pages.

Cell Selection Method

The cell selection method of this embodiment is similar to that of the first embodiment and 1 sector (3 pages) as shown in FIG. 22 is selected for a read operation, a program/verify operation or a program operation. The three pages are switched by means of an address. An erase operation is carried out on a block by block basis as shown in FIG. 22. In an erase-verify operation, firstly a verify-read operation is carried out on one of the bit lines (BLi) and the outcome of the operation is stored in the latch circuit LAT (C) shown in FIG. 24. Then, a verify operation is carried out on the other bit line (BLi+1) and the logical sum of the outcome of the operation and that of the verify-read operation is stored in the latch circuit LAT (C).

(Program and Program Verify)

(1st Page Program)

Figure 29:
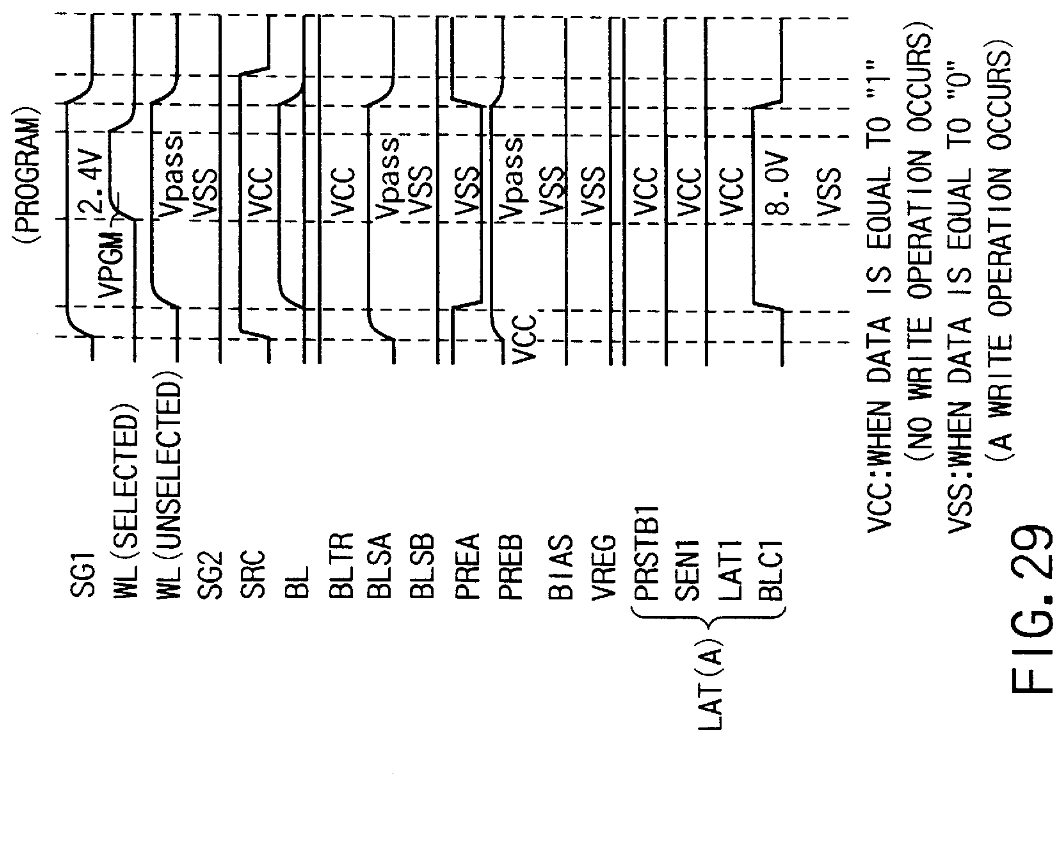
FIG. 29 is a timing chart that can be used for a program operation of the second embodiment.

FIG. 29 shows the sequence of a program operation. The illustrated voltages are specified respectively for the related component sections for the program operation. As in the case of the first embodiment, the data to be written is externally input and stored in the latch circuits LAT (C) of all the data storage circuits. If data "1" (no data is written) is externally input, the node NA of the latch circuit LAT (C) as shown in FIG. 24 is set to a high level. If, on the other hand, data "0" (a data is written) is externally input, the node NA of the latch circuit LAT (C) is set to a low level. Then, data are written into all the memory cells of the selected page according to the stored data.

When writing data "0", the data of the memory cell is made equal to "4" as shown in FIG. 28. When writing data "1", on the other hand, the data of the memory cell remains equal to "0".

(Verify 1st Page)

Figure 30:
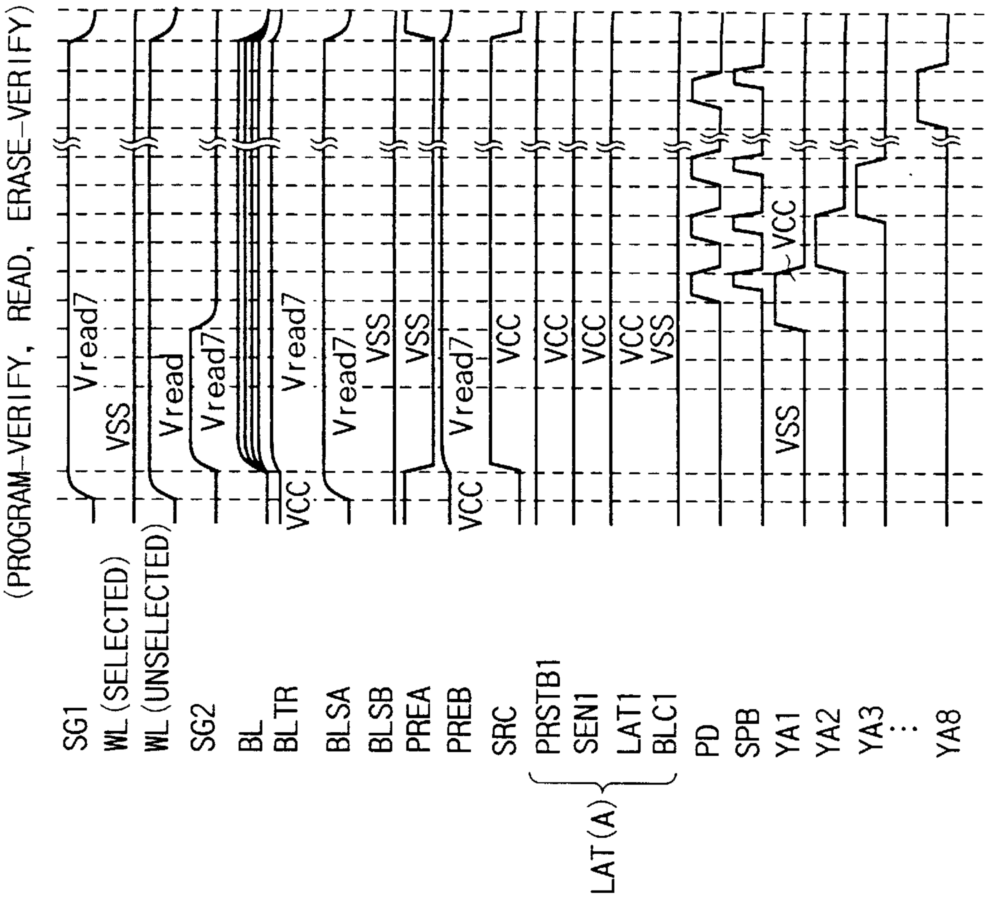
FIG. 30 is a timing chart for a program verify operation and a read operation.

FIG. 30 shows a program-verify and read operation. The illustrated voltages are specified respectively for the related component sections for the program-verify and read operation.

Firstly, the unselected word lines and select line SG1 of the selected block are set to potential Vread7 (=Vread+Vth) and source line SRC is set to potential Vread, whereas the selected word lines are set to grounding potential VSS. Thereafter, select line SG2 of the source side of the cell is set to potential Vread 7. A potential is output to the bit line depending on the threshold voltage of the cell. The potential of the bit line is then supplied to the differential amplifier section 231 and the logic circuit 232 through the Y-selector group 233 on a time division basis.

Only the differential amplifier DFA1 is used out of the seven differential amplifiers shown in FIG. 25 for the operation of verifying the first page. Therefore, signal EN1 is brought up to a high a high level and the output signals of the NOR circuits 251*b*, 251*d*, 251*f* are invariably set to a low level.

Figures 31, 32:
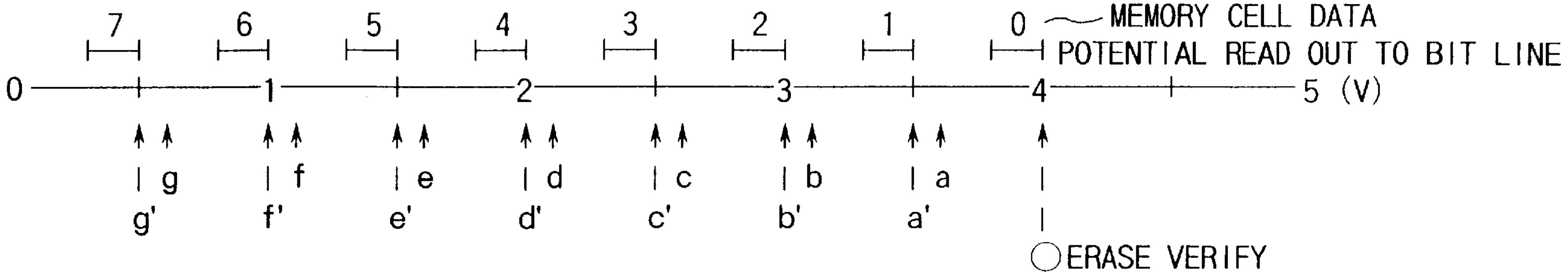
FIG. 31 is a chart of reference potentials to be supplied to the differential amplifier.
FIG. 32 is a graph showing the relationship between the data of a memory cell and the reference potential.

Then, as shown in FIGS. 26, 31, and 32, potential "d'" that is slightly lower than potential "d" to be used for a corresponding read operation is applied as reference potential to the non-inverse input terminal of the differential amplifier DFA1. In the following description, the denomination of a potential accompanied by "'" refers to a potential to be used for a verify operation, which is slightly lower than the potential to be used for a corresponding read operation. Then, the output signal of a data storage circuit is supplied to the differential amplifier section 231 and the logic circuit 232 through the Y-selector group 233.

Additionally, since the verify operation is going on, signal Verify B supplied to the NOR circuit 252*a* of the logic circuit 232 is brought to a low level and the data stored in the latch circuit LAT (C) of the data storage circuit is supplied to the logic circuit 232. When data "1" is latched by the latch circuit LAT (C) of the data storage circuit (and hence no data is written), data "0" inverted by the clocked inverter circuit 241*p* is supplied to the NOR circuit 252*a* shown in FIG. 25. Thus, the high level is latched to the output terminal ND of the latch circuit LAT (D) regardless of the output signal of the differential amplifier DFA1.

On the other hand, FIG. 33A shows the operation to be carried out when data "0" is latched by the latch circuit LAT (C) of the data storage circuit (and hence a data is written).

Thus, if the potential read out to the bit line is lower than the reference potential "d'" (and hence the data is written sufficiently), the output signal of the differential amplifier DFA1 is brought up to a high level. Then, the high level is latched to the output terminal ND of the latch circuit LAT (D).

If the potential read out to the bit line is higher than the reference potential "d'" (and hence the data is written insufficiently), the output signal of the differential amplifier DFA1 is brought down to a low level. Thus, the low level is latched to the output terminal of the latch circuit LAT (D).

The input signal is latched by the latch circuit LAT (D) when signal PD as shown in FIGS. 25, 30 is brought down to a low level. The data latched by the latch circuit LAT (D) is then supplied to the data storage circuit through the inverter circuit 252*e* and the clocked inverter circuit 252*f*. Then, signal SPB supplied to the gate of transistor 241*o* shown in FIG. 24 is brought up to a high level as shown in FIG. 30. Then, the data from the logic circuit 232 is supplied to the latch circuit LAT (D) of the data storage circuit through the transistor 241*o*. Thus, the data of the latch circuit LAT (C) is replaced by the data stored in the latch circuit LAT (D) of the logic circuit 232. In other words, if data "1" is latched by the latch circuit LAT (C) of the data storage circuit (and hence no data is written), the data "1" of the latch circuit LAT (C) remains there on the other hand, if data "0" is latched by the latch circuit LAT (C) of the data storage circuit (and hence a data is written), the data "0" of the latch circuit LAT (C) remains there. However, the data is replaced by data "1" if the data is written insufficiently into the cell.

Then, the Y-selector group 233 is switched and the above sequence is repeated on the output signal of another data storage circuit. At this time, the data of the cell is already read out to the bit line. Therefore, the above operation can be conducted simply by switching the Y-selector group 233 and driving the differential amplifier section 231 and the logic circuit 232.

The program operation and the verify operation as described above are repeated until the data of all the data storage circuits are brought up to a high level.

(2nd Page Program)

As in the case of the first page program, the data to be written next that is externally input is stored in the latch circuits LAT (C) of all the data storage circuits. Then, the data is written in all the memory cells of the selected page depending on the data stored in the latch circuit LAT (C).

As shown in FIG. 28, if the data of a memory cells is equal to "0" (and hence no data writing operation is conducted on the first page), the data of the cell becomes equal to "2", when a data is written into the cell. If the data of the memory cell is equal to "4" (and hence a data writing operation is conducted on the first page), the data of the cell becomes equal to "6" when a data is written to the cell but it remains equal to "4" when no data is written to the cell.

(Verify 2nd Page)

As in the case of the operation of verifying the first page, a potential is output to the bit line depending on the threshold voltage of the cell. The differential amplifiers DFA1 through DFA3 are used out of the seven differential amplifiers shown in FIG. 25 for the operation of verifying the second page. Therefore, signal EN2 is brought up to a high level and the output signals of the NOR circuits 251*d*, 251*f* are invariably set to a low level. Then, as shown in FIGS. 26, 31, and 32, potentials "f'", "d" and "b'" are supplied as reference potential to the non-inverse input terminals of the differential amplifiers DFA1 through DFA3. Thereafter, the single data storage circuit selected by the Y-selector group is connected to the differential amplifiers DFA1 through DFA3 and the logic circuit 232. Additionally, since the verify operation is going on, signal Verify B is brought down to a low level and the data stored in the latch circuit LAT (C) of the data storage circuit is supplied to the logic circuit 232. When data "1" is latched by the latch circuit LAT (C) of the data storage circuit (and hence no data is written), a high level is latched to the output terminal ND of the latch circuit LAT (D) regardless of the outputs of the differential amplifiers DFA1 through DFA3.

On the other hand, FIG. 33B shows the operation to be carried out when data "0" is latched by the latch circuit LAT (C) of the data storage circuit (and hence a data is written).

Thus, if the potential read out to the bit line is lower than the reference potential "f'" (and hence the data is written thoroughly), the output signal of the differential amplifier DFA1 is brought up to a high level. Then, the high level is latched to the output terminal ND of the latch circuit LAT (D).

If the potential read out to the bit line is lower than the reference potential "d" and higher than the reference potential "f'" (and hence the data is written insufficiently), the output signal of the differential amplifier DFA3 is brought up to a high level. However, since the output of the differential amplifier DFA2 is also at the high level, a low level is latched to the output terminal of the latch circuit LAT (D).

If the potential read out to the bit line is lower than the reference potential "b'" and higher than the reference potential "d" (and hence the data is written sufficiently), the output signal of the differential amplifier DFA3 is brought up to a high level. Therefore, a high level is latched to the output terminal of the latch circuit LAT (D).

If the potential read out to the bit line is higher than the reference potential "b'" (and hence the data is written insufficiently), all the output signals of the differential amplifiers DFA1 through DFA3 are at a low level. Therefore, a low level is latched to the output terminal of the latch circuit LAT (D).

The operation that is conducted after the data is latched by the latch circuit LAT (D) of the logic circuit 232 is same as the operation of verifying the first page. More specifically, if data "1" is latched by the latch circuit LAT (C) of the data storage circuit (and hence no data is written), the data "1" of the latch circuit LAT (C) remains there. On the other hand, if data "0" is latched by the latch circuit LAT (C) of the data storage circuit (and hence a data is written), the data "0" of the latch circuit LAT (C) remains there if the data is written insufficiently. However, the data is replaced by data "1" if the data is written sufficiently into the cell. Then, the Y-selector group 233 is switched and the above sequence is repeated on the output signal of another data storage circuit.

The program operation and the verify operation as described above are repeated until the data of all the data storage circuits are brought up to a high level.

(3rd Page Program)

As in the case of the first page program and the second page program, the data to be written next that is externally input is stored in the latch circuits LAT (C) of all the data storage circuits. Then, the data is written in all the memory cells of the selected page depending on the data stored in the latch circuit LAT (C).

As shown in FIG. 28, if the data of a memory cells is equal to "0", the data of the memory cell becomes equal to "1" when a data is written into the memory cell but it remains equal to "0" when no data is written to the memory cell. If the data of the memory cell is equal to "2", the data of the memory cell becomes equal to "3", when a data is written to the memory cell but it remains equal to "2" when no data is written to the memory cell. If the data of a memory cells is equal to "4", the data of the memory cell becomes equal to "5" when a data is written into the memory cell but it remains equal to "4" when no data is written to the memory cell. If the data of the memory cell is equal to "6", the data of the memory cell becomes equal to "7" when a data is written to the memory cell but it remains equal to "6" when no data is written to the memory cell.

(Verify 3rd Page)

As in the case of the operation of verifying the first page, a potential is output to the bit line depending on the threshold voltage of the cell. All the differential amplifiers DFA1 through DFA7 shown in FIG. 25 are used for the operation of verifying the third page. Therefore, as shown in FIGS. 26, 31, and 32, potentials "g'", "f'", "e'", "d", "c'", "b" and "a'" are supplied as reference potentials to the non-inverse input terminals of the differential amplifiers DFA1 through DFA7. Thereafter, the single data storage circuit selected by the Y-selector group is connected to the differential amplifiers DFA1 through DFA3 and the logic circuit 232. Additionally, since the verify operation is going on, signal Verify B is brought down to a low level and the data stored in the latch circuit LAT (C) of the data storage circuit is supplied to the logic circuit 232. As described earlier, when data “1” is latched by the latch circuit LAT (C) of the data storage circuit (and hence no data is written), a high level is latched to the output terminal ND of the latch circuit LAT (D) regardless of the outputs of the differential amplifiers DFA1 through DFA7.

On the other hand, FIG. 33C shows the operation to be carried out when data “0” is latched by the latch circuit LAT (C) of the data storage circuit (and hence a data is written).

Thus, if the potential read out to the bit line is lower than the reference potential “g'” (and hence the data is written sufficiently), the output signal of the differential amplifier DFA1 is brought up to a high level. Then, a high level is latched to the output terminal ND of the latch circuit LAT (D).

If the potential read out to the bit line is lower than the reference potential “f” and higher than the reference potential “g'” (and hence the data is written insufficiently), the output signal of the differential amplifier DFA3 is brought up to a high level. However, since the output of the differential amplifier DFA2 is also at a high level, a low level is latched to the output terminal of the latch circuit LAT (D).

If the potential read out to the bit line is lower than the reference potential “e'” and higher than the reference potential “f” (and hence the data is written sufficiently), the output signal of the differential amplifier DFA3 is brought up to a high level but the output signal of the differential amplifier DFA2 is brought down to a low level. Therefore, a high level is latched to the output terminal of the latch circuit LAT (D).

If the potential read out to the bit line is lower than the reference potential “d” and higher than the reference potential “e'” (and hence the data is written insufficiently), the output signal of the differential amplifier DFA5 is brought up to a high level. However, since the output of the differential amplifier DFA4 is also at a high level, a low level is latched to the output terminal of the latch circuit LAT (D).

If the potential read out to the bit line is lower than the reference potential “c'” and higher than the reference potential “d” (and hence the data is written sufficiently), the output signal of the differential amplifier DFA5 is brought up to a high level. Therefore, a high level is latched to the output terminal of the latch circuit LAT (D).

If the potential read out to the bit line is lower than the reference potential “b” and higher than the reference potential “c'” (and hence the data is written insufficiently), the output signal of the differential amplifier DFA7 is brought up to a high level. However, since the output of the differential amplifier DFA6 is also at a high level, a low level is latched to the output terminal of the latch circuit LAT (D).

If the potential read out to the bit line is lower than the reference potential “a'” and higher than the reference potential “b” (and hence the data is written sufficiently), the output signal of the differential amplifier DFA7 is brought up to a high level. Therefore, a high level is latched to the output terminal of the latch circuit LAT (D).

If the potential read out to the bit line is higher than the reference potential “a'” (and hence the data is written insufficiently), all the output signals of the differential amplifiers DFA1 through DFA7 are at a low level. Therefore, a low level is latched to the output terminal of the latch circuit LAT (D).

The operation that is conducted after the data is latched by the latch circuit LAT (D) of the logic circuit is same as the operation of verifying the first page and that of verifying the second page. More specifically, if data “1” is latched by the latch circuit LAT (C) of the data storage circuit (and hence no data is written), the data “1” of the latch circuit LAT (C) remains there. On the other hand, if data “0” is latched by the latch circuit LAT (C) of the data storage circuit (and hence a data is written), the data “0” of the latch circuit LAT (C) remains there if the data is written insufficiently. However, the data is replaced by data “1” if the data is written sufficiently into the cell. Then, the Y-selector group 233 is switched and the above sequence is repeated on the output signal of another data storage circuit.

The program operation and the verify operation as described above are repeated until the data of all the data storage circuits are brought up to a high level.

Read Operation (Read 1st Page)

As in the case of a program verify operation, a potential is output to the bit line depending on the threshold voltage of the cell for a read operation. Like an operation of verifying the first page, only the differential amplifier DFA1 is used out of the seven differential amplifiers shown in FIG. 25 for the operation of reading the first page. Therefore, signal EN1 is brought up to a high level and the output signals of the NOR circuits 251*b*, 251*d*, 251*f* are invariably set to a low level. Then, as shown in FIGS. 26, 31, and 32, potential “d” is applied as reference potential to the non-inverse input terminal of the differential amplifier DFA1. Then, the single data storage circuit selected by the Y-selector 233 is connected to the differential amplifier section 231 and the logic circuit 232. Additionally, since the read operation is going on, signal Verify B is brought to a high level and the data (indefinite) stored in the latch circuit LAT (C) of the data storage circuit is not supplied to the logic circuit 232.

FIG. 34A illustrates the operation of reading the first page. Thus, if the potential read out to the bit line is lower than the reference potential “d” (and hence the data of the memory cell is “4”, “5”, “6”or “7”), the output signal of the differential amplifier DFA1 is brought up to a high level. Then, the high level is latched to the output terminal of the latch circuit LAT (D).

If the potential read out to the bit line is higher than the reference potential “d'” (and hence the data of the memory cell is “0”, “1”, “2” or “3”), the output signal of the differential amplifier DFA1 is brought down to a low level. Thus, the low level is latched to the output terminal of the latch circuit LAT (D).

The data latched by the latch circuit LAT (D) is then supplied to the data storage circuit through the data storage circuit. Then, signal SPB is brought to a high level, and the signal SPB is supplied from the latch circuit LAT (D) to the latch circuit LAT (C) through the transistor 241*o* shown in FIG. 24. Then, the Y-selector group 233 is switched and the above sequence is repeated on the output signal of another data storage circuit. At this time, the data of the cell is already read out to the bit line. Therefore, the above operation can be conducted simply by switching data storage circuit by means of the Y-selector group 233 and driving the differential amplifier section 231 and the logic circuit 232. In this way, the data of the first page can be stored in all the data storage circuits by switching the Y-selector group 233 and repeating the above sequence.

The data of a memory cell and the threshold voltages thereof are defined in a manner as illustrated in FIG. 28. A low level is stored in the latch circuit LAT (C) when the data of the memory cells is equal to “0”, “1”, “2” or “3”, whereas a high level is stored in the latch circuit LAT (C) when the data of the memory cells is “4”, “5”, “6”, or “7”. However, the data stored in the latch circuit LAT (C) is output to the data input/output buffer 4 through the clocked inverter circuit 241*p*. Therefore, data “1” is supplied to the data input/output buffer 4 when the data of the memory cells is equal to “0”, “1”, “2” or “3”, whereas data “0” is supplied to the data input/output buffer when the data of the memory cells is equal to “4”, “5”, “6” or “7”.

(Read 2nd Page)

As in the case of reading the first page, a potential is output to the bit line depending on the threshold voltage of the cell for an operation of reading the second page. For verifying the second page, the differential amplifiers DFA1 through DAF3 are used out of the seven differential amplifiers. Therefore, signal EN2 is brought up to a high level and the output signals of the NOR circuits 251*b*, 251*d*, 251*f* are invariably set to a low level. Then, as shown in FIGS. 26, 31, and 32, potential “f”, “b”, “d” is applied as reference potential to the non-inverse input terminal of the differential amplifier. Then, the single data storage circuit selected by the Y-selector 233 is connected to the differential amplifier section 231 and the logic circuit 232. Additionally, since the read operation is going on, signal verify B is brought to a high level and the data stored in the latch circuit LAT (C) is not supplied to the logic circuit 232.

FIG. 34B illustrates the operation of reading the second page. Thus, if the potential read out to the bit line is lower than the reference potential “f” (and hence the data of the memory cell is “6” or “7”), the output signal of the differential amplifier DFA1 is brought up to a high level. Then, the high level is latched to the output terminal of the latch circuit LAT (D) of the logic circuit 232.

If the potential read out to the bit line is lower than the reference potential “d” and higher than “f” (and hence the data of the memory cell is “4” or “5”), the output signal of the differential amplifier DFA3 is brought up to a high level and the output signal of the differential amplifier DAF2 is also brought up to a high level. Thus, a low level is latched to the latch circuit LAT (D).

If the potential read out to the bit line is lower than the reference potential “b” and higher than “d” (and hence the data of the memory cell is “2” or “3”), the output signal of the differential amplifier DFA3 is brought up to a high level. Then, the high level is latched to the latch circuit LAT (D).

If the potential read out to the bit line is higher than the reference potential “b” (and hence the data of the memory cell is “0” or “1”), all the output signals of the differential amplifiers DAF1 through DAF7 are at a low level. Therefore, the low level is latched to the output terminal of the latch circuit LAT (D).

The operation after the step where the data is latched by the latch circuit LAT (D) of the logic circuit 232 is same as that of reading the first page. Thus, a low level is stored in the latch circuit LAT (C) when the data of the memory cells is equal to “0”, “1”, “4” or “5”, whereas a high level is stored in the latch circuit LAT (C) when the data of the memory cells is “2”, “3”, “6” or “7”. However, the data stored in the latch circuit LAT (C) is output to the data input/output buffer 4 through the clocked inverter circuit 241*p*. Therefore, data “1” is supplied to the data input/output buffer 4 when the data of the memory cells is equal to “0”, “1”, “4” or “5”, whereas data “0” is supplied to the data input/output buffer when the data of the memory cells is equal to “2”, “3”, “6” or “7”.

(Read 3rd Page)

As in the case of reading the first page or the second page, a potential is output to the bit line depending on the threshold voltage of the cell for an operation of reading the third page. For verifying the third page, all the seven differential amplifiers DFA1 through DAF7 are used. Therefore, potentials “g”, “f”, “e”, “c”, “d”, “b” and “a” are supplied respectively as reference potentials to the non-inverse input terminals of the differential amplifiers DFA1 through DFA7. Then, the single data storage circuit selected by the Y-selector 233 is connected to the differential amplifier section 231 and the logic circuit 232. Additionally, since the read operation is going on, signal Verify B is brought to a high level and the data (indefinite) stored in the latch circuit LAT (C) of the data storage circuit is not supplied to the logic circuit 232.

FIG. 34C illustrates the operation of reading the third page. Thus, if the potential read out to the bit line is lower than the reference potential “g” (and hence the data of the memory cell is “7”), the output signal of the differential amplifier DFA1 is brought up to a high level. Then, a high level is latched to the output terminal of the latch circuit LAT (D) of the logic circuit 232.

If the potential read out to the bit line is lower than the reference potential “f” and higher than “g” (and hence the data of the memory cell is “6”), the output signal of the differential amplifier DFA3 is brought up to a high level. However, since the output signal of the differential amplifier DAF2 is also brought up to a high level. Thus, a low level is latched to the output terminal of the latch circuit LAT (D).

If the potential read out to the bit line is lower than the reference potential “e” and higher than “f” (and hence the data of the memory cell is “5”), the output signal of the differential amplifier DFA3 is brought up to a high level. Then, a high level is latched to the output terminal of the latch circuit LAT (D) of the logic circuit 232.

If the potential read out to the bit line is lower than the reference potential “d” and higher than “e” (and hence the data of the memory cell is “4”), the output signal of the differential amplifier DFA5 is brought up to a high level. However, since the output signal of the differential amplifier DAF4 is also brought up to a high level. Thus, a high level is latched to the output terminal of the latch circuit LAT (D).

If the potential read out to the bit line is lower than the reference potential “c” and higher than “d” (and hence the data of the memory cell is 3”), the output signal of the differential amplifier DFA5 is brought up to a high level. Then, a high level is latched to the output terminal of the latch circuit LAT (D) of the logic circuit 232.

If the potential read out to the bit line is lower than the reference potential “b” and higher than “c” (and hence the data of the memory cell is “2”), the output signal of the differential amplifier DFA7 is brought up to a high level. However, since the output signal of the differential amplifier DAF6 is also brought up to a high level. Thus, a low level is latched to the output terminal of the latch circuit LAT (D).

If the potential read out to the bit line is lower than the reference potential “a” and higher than “b” (and hence the data of the memory cell is “1”), the output signal of the differential amplifier DFA7 is brought up to a high level. Then, a high level is latched to the output terminal of the latch circuit LAT (D) of the logic circuit 232.

If the potential read out to the bit line is higher than “a” (and hence the data of the memory cell is “0”), all the output signals of the differential amplifiers DAF1 through DAF7 are at a low level. Therefore, a low level is latched to the output terminal of the latch circuit LAT (D).

The operation after the step where the data is latched by the latch circuit LAT (D) of the logic circuit 232 is same as that of reading the first page. Thus, a low level is stored in the latch circuit LAT (C) when the data of the memory cells is equal to "0", "2", "4" or "6", whereas a high level is stored in the latch circuit LAT (C) when the data of the memory cells is "1", "3", "5" or "7". However, the data stored in the latch circuit LAT (C) is output to the data input/output buffer 4 through the clocked inverter circuit 241*p*. Therefore, data "1" is supplied to the data input/output buffer 4 when the data of the memory cells is equal to "0", "2", "4" or "6", whereas data "0" is supplied to the data input/output buffer when the data of the memory cells is equal to "1", "3", "5" or "7".

Erase and Erase Verify Operation (Erase)

The erase operation of the second embodiment is similar to that of the first embodiment. In an erase operation, firstly a block as indicated by broken lines in FIG. 22 will be selected.

Figure 35:
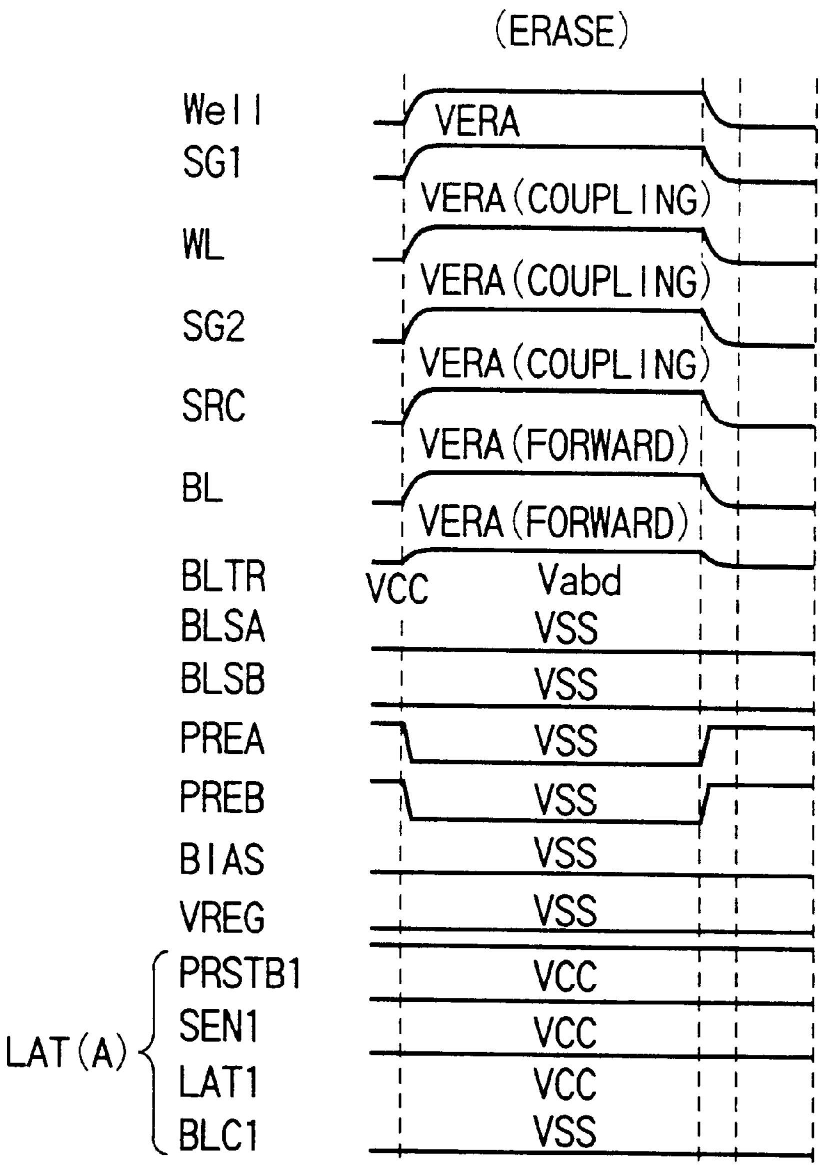
FIG. 35 is a timing chart of an erase operation.

As the erase operation is conducted by selecting voltages for different component sections as shown in FIG. 35, the data of the memory cells of the block is made equal to "0'" and data "1" will be output regardless if the first, second or third page is read.

(Erase-verify)

An erase-verify operation is conducted on each of a pair of bit lines (BLi, BLi+1) connected to a data storage circuit. For instance, an erase-verify operation is conducted firstly on bit line (BLi). The outcome of the operation is then stored in the latch circuit LAT (C). The erase-verify operation is almost same as a read operation. However, all the word lines of the selected block are brought to the level of the ground potential VSS in order to verify all the cells of the block.

Then, as shown in FIG. 30 and like a program-varify operation or a read operation, a potential is output to the bit line depending on the threshold voltage of the selected memory cell. Only the differential amplifier DFA1 is used out of the seven differential amplifiers of FIG. 25 for an erase-verify operation as in the case of the operation of verifying or reading the first page. Thus, the output signals of the NOR circuits 251*b*, 251*d* and 251*f* are invariably set to a low level by brining up signal EN1 to a high level.

Then, as shown in FIGS. 31 and 32, erase-verify potential (4.0V) is supplied as reference potential to the non-inverse input terminal of the differential amplifier DFA1. Then, the single data storage circuit selected by the Y-selector group 233 is connected to the differential amplifier section 231 and the logic circuit 232. Verify B is brought up to the high level in the first erase-verify operation. Thus, the data (indefinite) stored in the latch circuit LAT (C) of the data storage circuit is not supplied to the logic circuit 232.

If the potential read out to the bit line is lower than the reference potential (and hence the erase operation is conducted insufficiently), the output signal of the differential amplifier DFA1 is brought up to a high level. Therefore, the high level is latched to the output terminal of the latch circuit LAT (D).

If, on the other hand, the potential read out to the bit line is higher than the reference potential (and hence the erase operation is conducted sufficiently), the output signal of the differential amplifier DFA1 is brought down to a low level. Therefore, the low level is latched to the output terminal of the latch circuit LAT (D).

The data latched by the latch circuit LAT (D) of the logic circuit 232 is stored in the latch circuit LAT (C) of the data storage circuit by way of the transistor 241*o* of FIG. 24. Then, the above sequence of operation is followed by switching the Y-selector group 233 depending on select signals YA0 through YA7. At this time, the data of the cell is already read out to the bit line. Therefore, the above operation can be conducted simply by switching data storage circuit by means of the Y-selector group 233 and driving the differential amplifier section 231 and the logic circuit 232. In this way, the data of the first page can be stored in all the data storage circuits by switching the Y-selector group 233 and repeating the above sequence.

The data of a memory cell and the threshold voltages thereof are defined in a manner as illustrated in FIG. 28. Thus, a low level is stored in the latch circuit LAT (C) when the erase operation is conducted sufficiently, whereas a high level is stored in the latch circuit LAT (C) when the erase operation is conducted only insufficiently.

Then, an entire identical operation is conducted on the other bit line, or bit line (BLi+1). At this time, Verify B of the logic circuit 232 is brought down to a low level. Then, if the verify operation is defective in the first erase-verify operation, the high level is latched by the latch circuit LAT (C) regardless of the outcome of the second erase-verify operation because the node NA of the latch circuit LAT (C) is at the high level. In other words, the high level is latched by the latch circuit LAT (C) only when either of the bit lines (BLi, BLi+1) is found defective as a result of the erase-verify operation. Thus, the erase operation and the erase-verify operation are repeated until the data of all the latch circuits LAT (C) are brought down to the low level.

Like the first embodiment, the above described second embodiment is also adapted to prevent any increase in the number of latch circuits if the number of data to be stored is increased. Additionally, a plurality of data storage circuits are provided only with a differential amplifier section 231 and a logic circuit 232 and the data storage circuits are connected by means of a Y-selector group on a time division basis. Thus, the number of differential amplifier sections 231 and logic circuits 232 that normally take a large space can be reduced to minimize the chip size.

While the operation of bringing the word lines to a high level, reading the data of a memory cell and latching the outcome of the reading has to be repeated $2^n$ times for a program-verify and read operation in the first embodiment. The threshold voltages of the memory cells are collectively judged by means of differential amplifiers in the second embodiment. Thus, the possible increase in the time required for the program-verify and read operation can be suppressed simply by increasing the number of differential amplifiers if the value of n is raised.

3rd Embodiment

In the case of the above described first embodiment, the read operation has to be repeated by shifting the level of the word lines by a total of $(2^{n-1})$ times for reading the n-th page. In the case of the above described second embodiment, on the other hand, the number of times of repeating the read operation is reduced in the third embodiment. More specifically, in the third embodiment, when writing into the n-th page after writing into the (n−1)-th page, the externally input data is not directly written into the n-th page but the value obtained by carrying out an logical operation on the externally input data and the data already written into the inside is written. Once such a data is written, it is no longer necessary to shift the level of word lines by $(2^{n-1})$ times for the operation of reading the n-th page and it is now possible to reduce the number of times of shifting the level to $(2^n/2)$ times. For example, when reading 8-valued data, while seven read operations are required for reading the third page in the first embodiment, the third page can be read by four read operations in the third embodiment.

Now, the third embodiment will be described in detail below. The circuit configuration of the third embodiment is identical with that of the first embodiment.

The data of a memory cell and the threshold voltages thereof are defined in a manner as illustrated in FIGS. 7 and 36. Data "0" through "7", of the memory cell are defined in the ascending order output the threshold voltages of the memory cell. Since the memory cells of the embodiment are multi-valued cells, each cell can store a 3-bit data. The stored 3-bit data can be switched by means of an address for each page of the first page, the second page or the third page. Assume here a read operation of reading data from memory cells, where the first page is addressed. Data "1" will be read out when the data of memory cells are "0" through "3", whereas data "0" will be read out when the data of memory cells are "4" through "7". Assume that the second page is addressed. Then, data "1" will be read out when the data of memory cells is "0", "1", "6" or "7", whereas data "0" will be read out when the data of memory cells is any of "2" through "5". Thus, only two operations are required for the second page, one for determining if the data of memory cells is equal to or smaller than "1" or equal to or greater than "2" and one for determining if the data of memory cells is equal to or smaller than "5" or equal to or greater than "6". Finally, assume that the third page is addressed. Then, data "1" will be read out when the data of memory cells is "0", "3", "4" or "7", whereas data "0", will be read out when the data of memory cells is "1", "2", "5" or "6". Thus, four operations are required for the third page, one for determining if the data of memory cells is equal to or smaller than "0" or equal to or greater than "1", one for determining if the data of memory cells is equal to or smaller than "2" or equal to or greater than "3", one for determining if the data of memory cells is equal to or smaller than "4" or equal to or greater than "5" and one for determining if the data of memory cells is equal to or smaller than "6" or equal to or greater than "7".

The data of a memory cell is reduced to "0" as a result of an erase operation and data "1" will be read out by addressing any of the first through third pages.

(Cell Selection Method)

In a read operation, a program verify operation or a program operation, one of the pair of bit lines (BLi, BLi+1) connected to one of the data storage circuits 310 through 312111 as shown in FIG. 3 is selected by an externally specified address. Then, a word line is selected by an externally specified address to select a sector, or three pages, as shown in FIG. 3. The three pages can be switched by means of an address.

An erase operation is conducted on a block by block basis as shown in FIG. 3 for a pair of bit lines (BLi, BLi+1) connected to one of the data storage circuits 310 through 312111 simultaneously.

In an erase verify operation, the bit line (BLi) of the pair of bit lines (BLi, BLi+1) connected to one of the data storage circuits 310 through 312111 is subjected to verify read in a single operation and the outcome of the operation is stored in the first latch circuit LAT (A) as shown in FIG. 6. Then, a verify operation is conducted for bit line (BLi+1) and the logical sum of the outcome of this operation and that of the previous verify-read operation is stored in the first latch circuit LAT (A).

Program and Program Verify (1st Page Program)

In a program operation, firstly an address is specified to select three pages as shown in FIG. 3. The program operation of the three pages can proceeds only in the sequence of the first page, the second page and the third page. Thus, the first page is firstly addressed.

Then, the data to be written (and read out) is stored in the first latch circuits LAT (A) in all the data storage circuits 310 through 312111. The program operation of the first page is exactly same as that of the first embodiment. Thus, if the data of the latch circuits LAT (A) is equal to "1", no data is written and the data of the memory cells remain to be equal to "0". If, on the other hand, the data of the latch circuits LAT (A) is equal to "0", a data is written and the data of the memory cells is shifted to be equal to "4".

(2nd Page Program)

As in the case of the first page program, the data to be written next (and read out) that is externally input is stored in the latch circuits LAT (A) of all the data storage circuits. Then, if the data of memory cells is equal to "0" as a result of the first page program and the externally input data is equal to "1", no data writing operation will be conducted. If the externally input data is equal to "0", a write operation is conducted for the cell and the data of the memory cells is made equal to "2". If the data of the memory cell is equal to "4" as a result of the first page program and the externally input data is equal to "1"', a write operation is conducted for the cell and the data of the memory cell is made equal to "6". If the externally input data is equal to "0", no write operation is conducted and the data of the memory cell has to remain to be equal to "4". However, a write operation is conducted there if the data of the latch circuit LAT (A) is equal to "0". Therefore, if the data of the memory cell is equal to "14", the data stored in the latch circuit LAT (A) has to be reversed from "1" to "0" or vice versa.

(Internal Input Data Conversion)

For this operation, it is necessary to check in advance if the data of the memory cell is made equal to "0" or "4" as a result of the first page program. To do this, potential "d" as shown in FIG. 7 is supplied to the selected word line to read the data of the memory cell, which is then stored in the latch circuit LAT (B) of the data storage circuit. If the data of the memory cell is equal to "0", a low level is stored in the latch circuit LAT (B). If the data of the memory cell is equal to "4", a high level is stored in the latch circuit LAT (B).

The bit line is at the level same as the data of the latch circuit LAT (B). As signal VREG shown in FIG. 6 is made equal to ground potential VSS and signal VRFY1 is brought up to a high level, the bit line is brought down to a low level if the latch circuit LAT (A) stores the high level. Then, as signal BLSA is made equal to ground potential VSS and the data storage circuit is separated from the bit line. As signal VREG is made equal to ground potential VSS and signal VRFY2 and signal BLC1 are brought up to a high level, the data of the latch circuit LAT (A) is forced to become a low level if the latch circuit LAT (B) is at the high level. Then, signal BLSA is brought up to a high level once again to connect the bit line to the data storage circuit and signal VREG is brought up to the high level while signal VRFY1 is also brought up to the high level. Then, the bit line is brought up to the high level if the latch circuit LAT (A) is at the high level. At this time, the data of the bit line is taken into the latch circuit LAT (A). As a result, the latch circuit LAT (A) is brought up to the high level if the data of the memory cell is equal to "0" and data "1" is externally input as shown in FIG. 37 but the latch circuit LAT (A) is brought down to the low level if data "0" is externally input. On the other hand, the latch circuit LAT (A) is brought down to the low level if the data of the memory cell is equal to "4" and data "1" is externally input. Thus, the latch circuit LAT (A) is brought up to the high level if data "0" is externally input. If a write operation is conducted under this condition, data "2" and "6" are written into memory cells respectively. All the program operation and the verify operation that follow thereafter are identical with those of the first embodiment.

3rd Page Program

Exactly as in the case of the first page program and the second page program, the data to be written (and read out) next that is externally input is stored in the latch circuits LAT (A) of all the data storage circuits 310 through 312111. No write operation is conducted when the data of memory cells is equal to "0" as a result of the first page program and the second page program and the externally input data is equal to "1". A write operation is conducted and the data of the memory cell is made equal to "1" when the externally input data is equal to "0". A write operation is conducted and the data of the memory cell is made equal to "3" when the data of the memory cell is equal to "2" as a result of the first page program and the second page program and the externally input data is equal to "1". No write operation is conducted and the data of the memory cell has to remain to be equal to "2" when the externally input data is equal to "0".

No write operation is conducted when the data of memory cells is equal to "4" as a result of the first page program and the second page program and the externally input data is equal to "1". A write operation is conducted and the data of the memory cell is made equal to "5" when the externally input data is equal to "0". A write operation is conducted and the data of the memory cell is made equal to "7" when the data of the memory cell is equal to "6" as a result of the first page program and the second page program and the externally input data is equal to "1". No write operation is conducted and the data of the memory cell has to remain to be equal to "6" when the externally input data is equal to "0". However, a write operation is conducted there if the data of the latch circuit LAT (A) is equal to "0". Therefore, if the data of the memory cell is equal to "2" or "6", the data stored in the latch circuit LAT (A) has to be reversed from "1" to "0" or vice versa.

(Internal Input Data Conversion)

For this operation, it is necessary to check in advance the state of the data of the memory cell that arises as a result of the first page program and the second page program. To do this, potential "f" as shown in FIG. 7 is supplied to the selected word line to read the data of the memory cell, which is then stored in the latch circuit LAT (B) of the data storage circuit. If the data of the memory cell is equal to "1", "2", or "4", a low level is stored in the latch circuit LAT (B). If the data of the memory cell is equal to "6", a high level is stored in the latch circuit LAT (B). Then, potential "d" of read operation is supplied to the word line to carry out a read operation and read out the data of the bit line. The bit line is forcibly brought down to the low level and the outcome is stored in the latch circuit LAT (B). Then, the low level is stored in the latch circuit LAT (B) when the data of the memory cell is equal to "0", "2" or "6", whereas the high level is stored in the latch circuit LAT (B) when the data of the memory cell is equal to "4". Then, potential "b" of read operation is supplied to the word line to carry out a read operation and read out the data of the bit line. The bit line is forcibly brought down to the low level and the outcome is stored in the latch circuit LAT (B). Then, the low level is stored in the latch circuit LAT (B) when the data of the memory cell is equal to "0" or "4", whereas the high level is stored in the latch circuit LAT (B) when the data of the memory cell is equal to "2" or "6".

The bit line is at the level same as the data of the latch circuit LAT (B). As signal VREG shown in FIG. 6 is made equal to ground potential VSS and signal VRFY1 is brought up to a high level, the bit line is brought down to a low level if the latch circuit LAT (A) stores the high level. Then, as signal BLSA is made equal to ground potential VSS and the data storage circuit that is one of the data storage circuits 310 through 312111 is separated from the bit line. As signal VREG is made equal to ground potential VSS and signal VRFY2 and signal BLC1 are brought up to the high level, the data of the latch circuit LAT (A) is forced to become the low level if the latch circuit LAT (B) is at the high level. Then, signal BLSA is brought up to the high level once again to connect the bit line to the data storage circuit and signal VREG is brought up to the high level while signal VRFY1 is also brought up to the high level. Then, the bit line is brought up to the high level if the latch circuit LAT (A) is at the high level. At this time, the data of the bit line is taken into the latch circuit LAT (A).

As a result, the latch circuit LAT (A) is brought up to the high level if the data of the memory cell is equal to "0" and data "1" is externally input as shown in FIG. 38 but the latch circuit LAT (A) is brought down to the low level if data "0" is externally input. On the other hand, the latch circuit LAT (A) is brought down to the low level if the data of the memory cell is equal to "2" and data "1" is externally input. Then, the latch circuit LAT (A) is brought up to the high level if data "0" is externally input. Furthermore, the latch circuit LAT (A) is brought up to the high level if the data of the memory cell is equal to "4" and data "1" is externally supplied. Then, the latch circuit LAT (A) is brought down to the low level if data "0" is externally supplied. Similarly, the latch circuit LAT (A) is brought down to the low level if the data of the memory cell is equal to "6" and data "1" is externally input. Then, the latch circuit LAT (A) is brought up to the high level if data "0" is externally input. If a write operation is conducted under this condition, data "1", "3", "5" and "7" are written into memory cells respectively. All the program operation and the verify operation that follow after the data of the latch circuit LAT (A) is established are identical with those of the first embodiment.

Read operation (Read 1st Page)

FIG. 39A shows the sequence of operation of reading the first page. As shown in FIG. 36, if the data output as a result of reading the first page is "0", the data of the memory cell is found between "4" and "7". If the output data is "1", the data of the memory cell is found between "0" and "3". Therefore, potential "d" of read operation as shown in FIG. 7 is applied to the selected word line for the operation of reading the first page.

Then, potential Vread (4.5V) is supplied to unselected word lines and select line SG1 in the selected block to bring up signal BIAS of the data storage circuit shown in FIG. 6 to a high level and precharge the bit line. Thereafter, select line SG2 at the source side is brought up to the high level. Since the cells showing a threshold voltage higher then potential "d" shown in FIG. 7 are turned off, the bit line remains at the high level. Additionally, since the cells showing a threshold voltage lower than potential "d" are turned on, the bit line is brought to the ground potential VSS.

Since the data and the threshold voltages of the memory cells are defined as shown in FIG. 39A, the potential of the bit line is at the low level when the data of the memory cells is "0", "1", "2" or "3", whereas the potential of the bit line is at the high level when the data of the memory cells is "4", "5", "6" or "7".

Then, as the potential of the bit line is read by the first latch circuit LAT (A), the first latch circuit LAT (A) is brought down to the low level if the data of the memory cells is "0", "1", "2" or "3". On the other hand, the first latch circuit LAT (A) is brought up to the high level if the data of the memory cells is "4", "5", "6" or "7". However, when outputting the data stored in the first latch circuit LAT (A), signal Osac of clocked inverter circuit 61$p$ shown in FIG. 6 is enabled and therefore the data output from the data storage circuits is made equal to "1" if the data of the memory cells is "0", "1", "2" or "3" but made equal to "0" if the data of the memory cells is "4", "5", "6" or "7". The above read operations are same as those conducted for 2-valued data in the first embodiment.

(Read 2nd Page)

FIG. 39B shows the sequence of operation of reading the second page. As shown in FIG. 36, if the data output is equal to "0" as a result of reading the second page, the data of the memory cell is found to be one of "2", "3", "4" and "5". If the output data is "1", the data of the memory cell is found to be one Therefore, it is checked if the data of the memory cell is found between "0" and "5", or either of "6" and "7". To do this, potential "f" of read operation as shown in FIG. 7 is applied to the selected word line and the outcome is stored in the latch circuit LAT (A). Since the high level is latched by the latch circuit LAT (A) only when the data of the memory cell is "6" or "7", the data of the memory cell is equal to "0", "1", "2", "3", "4" or "5" when the low level is latched by the latch circuit LAT (A).Then, it is checked if the data of the memory cell is found between "0" and "3" or between "4" and "7". To do this, potential "c" of read operation as shown in FIG. 7 is applied to the selected word line and the bit line is forcibly brought down to the low level. Then, the outcome is stored in the latch circuit LAT (A). The high level is latched by the latch circuit LAT (A) when the data of the memory cell is between "2" and "5", whereas the low level is latched by the latch circuit LAT (A) when the data of the memory cell is "0", "1", "6" or "7". However, when outputting the data stored in the first latch circuit LAT (A), signal Osac, Osacb of clocked inverter circuit 61$p$ shown in FIG. 6 is enabled and therefore the data output from the data storage circuits is made equal to "1" if the data of the memory cells is "0", "1", "6" or "7" but made equal to "0" if the data of the memory cells is found between "2" and "5".

The read operation is repeated three times when reading the second page in the above described first embodiment. However, it is repeated only twice for reading the second page in the third embodiment to realize a high speed read operation for reading the second page in the third embodiment.

(Read 3rd Page)

FIG. 40 shows the sequence of operation of reading the third page. AS shown in FIG. 36, if the data output is equal to "0" as a result of reading the third page, the data of the memory cell is found to be one of "1", "2", "5" and "6". If the output data is "1", the data of the memory cell is found to be one of "0", "3", Therefore, it is checked firstly if the data of the memory cell is found between "0" and "6" or equal to "7". To do this, potential "g" of read operation as shown in FIG. 7 is applied to the selected word line and the outcome is stored in the latch circuit LAT (A). Since the high level is latched by the latch circuit LAT (A) only when the data of the memory cell is equal to "7", the data of the memory cell is equal to "0", "1", "2", "3", "4", "5" or "6" when the low level is latched by the latch circuit LAT (A).

Then, it is checked if the data of the memory cell is found between "0" and "4" or between "5" and "7". To do this, potential "e" of read operation as shown in FIG. 7 is applied to the selected word line. If the high level is latched by the latch circuit LAT (A), the bit line is forcibly brought down to the low level and then the outcome is stored in the latch circuit LAT (A). The high level is latched by the latch circuit LAT (A) when the data of the memory cell is "5" or "6", whereas the low level is latched by the latch circuit LAT (A) when the data of the memory cell is between "0" and "4" or equal to "7".

Then, it is checked if the data of the memory cell is found between "0" and "2" or between "3" and "7". To do this, potential "c" of read operation as shown in FIG. 7 is applied to the selected word line. If the high level is latched by the latch circuit LAT (A), the bit line is forcibly brought down to the low level and then the outcome is stored in the latch circuit LAT (A). The high level is latched by the latch circuit LAT (A) when the data of the memory cell is "3", "4", or "7", whereas the low level is latched by the latch circuit LAT (A) when the data of the memory cell is between "0" and "2" or equal to "5" or 11611.

Then, it is checked if the data of the memory cell is found to be equal to "0" or between "1" and "7". To do this, potential "a" of read operation as shown in FIG. 7 is applied to the selected word line. If the high level is latched by the latch circuit LAT (A), the bit line is forcibly brought down to the low level and then the outcome is stored in the latch circuit LAT (A). The high level is latched by the latch circuit LAT (A) when the data of the memory cell is "1", 2", "5" or "6", whereas the low level is latched by the latch circuit LAT (A) when the data of the memory cell is "0", However, when outputting the data stored in the first latch circuit LAT (A), signal Osac, Osacb of clocked inverter circuit 61$p$ shown in FIG. 6 is enabled and therefore the data output from the data storage circuits is made equal to "1" if the data of the memory cells is "0", "3", "4" or "7" but made equal to "0" if the data of the memory cells is "1", "2", "5" or "6".

The read operation is repeated seven times when reading the third page in the above described first embodiment. However, it is repeated only four times for reading the third page in the third embodiment to realize a high speed read operation for reading the third page in the third embodiment.

(Erase and Erase-verify)

The erase operation and the erase-verify operation of the third embodiment are identical with those of the first embodiment. As a result of an erase operation, the data of all the memory cells is made equal to "0" and data "1" is read out regardless if the first, second or third page is addressed.

Thus, in the above described third embodiment, when writing into the n-th page after writing into the (n−1)-th page, the externally input data is not directly written into the n-th page but the value obtained by carrying out an logical operation on the externally input data and the data already written into the inside is written. Once such a data is written, it is no longer necessary to shift the level of word lines by ($2^n$−1) times for the operation of reading the n-th page and it is now possible to reduce the number of times of shifting the level to ($2^n$/2) times. Therefore, high-speed read operation is realized.

The definitions illustrated in FIG. 36 are used for externally input data and data to be read out for the above described third embodiment. Thus, only a single read operation is conducted for the first page, whereas the operation is repeated twice for the second page and four times for the third page to make the total number of operations equal to seven. However, the third embodiment is by no means limited thereto.

For instance, when the definitions illustrated in FIG. 41 is used for externally input data and data to be read out, a read operation is repeated three times for the first page, twice for the second page and three times for the third page to make the total number of repeated operations equal to eight, which is greater than the seven repetitions of FIG. 36. However, it should be noted that the operation of reading the third page requires the longest access time and hence the overall reading time can be reduced when the definitions of FIG. 41 is used because the time consuming operation of reading the third page has to be repeated four times when using the definitions of FIG. 36.

While an 8-valued data, or 3 bits data, is stored in a cell in each of the above described first through third embodiments, it is also possible to store a 16-valued data, or 4 bits data in a cell. If such is the case, a new threshold voltage has to be defined between two adjacently arranged threshold voltages defined for the third page for the program operation and the program/verify operation. However, the present invention provides the advantage that the data storage circuits and the operations for controlling the circuits can remain almost intact if the number of bits to be stored in a cell is increased.

The threshold voltage of memory cells is shifted by writing a data into the memory cells in any of the above described first through third embodiments. However, the present invention is by no means limited thereto. For instance, the threshold voltage of memory cells may be selected by erasing the data of the memory cells. The threshold voltage of a block of memory cells can be set to a predetermined level by collectively writing a same data into them. Then, the threshold voltage of each memory cell can be set to a desired level by erasing the threshold voltage of the memory cell according to the data to be written there. The above described embodiments are designed for optimal modes of carrying out the present invention to maximally exploit the advantages of the invention.

If the third embodiment of memory device according to the invention is used as read-only memory storing multi-valued data, the data storage circuits may comprise only a latch circuit LAT (A) because it is not necessary to use a latch circuit LAT (B).

While NAND type cells are used for the first and second embodiments, the present invention is by no means limited thereto and they may be replaced by NOR type or DINOR type cells.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of storing data to a memory cell having n states (n being a natural number), the method comprising:

storing externally input data in a data storage circuit;

executing one of shifting and holding a logic level of data which is stored in the data storage circuit in accordance with data read from the memory cell more than one time by varying a voltage supply to a gate electrode of the memory cell; and executing one of shifting and holding the states of the memory cell in accordance with the data which is stored in the data storage circuit.

2. The method according to claim 1, wherein the externally input data includes a first data, a second data, and a third data, and the first data is for setting the state of the memory cell to state “0” or state “n/2”;

the second data is for setting the state of the memory cell to state “n/4 or “3n/4”; and the third data is for setting the state of the memory cell to state “n/8”, “3n/8”, “5n/8” or “7n/8”.

3. A method of storing data to a memory cell having n states (n being a natural number), the method comprising:

storing externally input data having one of a first logic level and second logic level in a data storage circuit;

shifting a logic level of the data stored in the data storage circuit to the second logic level when data read from the memory cell is at the first logic level and the data stored in the data storage circuit is at the first logic level;

shifting the logic level of the data stored in the data storage circuit to the first logic level when the data read from the memory cell is at the first logic level and the data stored in the data storage circuit is at the second logic level;

holding the logic level of the data stored in the data storage circuit when the data read from the memory cell is at the second logic level;

shifting a state of the memory cell when the logic level of the data stored in the data storage circuit is at the first logic level; and holding the state of the memory cell when the logic level of the data stored in the data storage circuit is at the second logic level.

4. The method according to claim 3, wherein the externally input data include a first data, a second data, and a third data, and the first data is for setting the state of the memory cell to state “0” or state “n/2”;

the second data is for setting the state of the memory cell to state “n/4” or “3n/4”; and the third data is for setting the state of the memory cell to state “n/8”, “3n/8”, “5n/8” or “7n/8”.

* * * * *